US012191897B2

(12) United States Patent
Ravi et al.

(10) Patent No.: US 12,191,897 B2
(45) Date of Patent: Jan. 7, 2025

(54) LOCAL OSCILLATOR (LO) GENERATION FOR CARRIER AGGREGATION IN PHASED ARRAY FRONT ENDS

(71) Applicant: Intel Corporation, Santa Clara, CA (US)

(72) Inventors: Ashoke Ravi, Portland, OR (US); Benjamin Jann, Hillsboro, OR (US); Satwik Patnaik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/401,893

(22) Filed: Jan. 2, 2024

(65) Prior Publication Data
US 2024/0137051 A1  Apr. 25, 2024

Related U.S. Application Data

(63) Continuation of application No. 17/393,564, filed on Aug. 4, 2021, now Pat. No. 11,967,980, which is a continuation of application No. 16/550,574, filed on Aug. 26, 2019, now Pat. No. 11,121,731.

(51) Int. Cl.
| | |
|---|---|
| *H03L 7/24* | (2006.01) |
| *G01R 27/06* | (2006.01) |
| *H01Q 3/40* | (2006.01) |
| *H03L 7/081* | (2006.01) |
| *H04B 1/04* | (2006.01) |

(52) U.S. Cl.
CPC ........... *H04B 1/0458* (2013.01); *G01R 27/06* (2013.01); *H01Q 3/40* (2013.01); *H03L 7/0816* (2013.01); *H03L 7/24* (2013.01)

(58) Field of Classification Search
CPC .... H03L 7/0816; H04B 1/0475; H04B 1/0458
See application file for complete search history.

(56) References Cited

U.S. PATENT DOCUMENTS

| | | | | |
|---|---|---|---|---|
| 7,272,373 | B2 * | 9/2007 | Tuttle | H04B 1/30 455/260 |
| 11,121,731 | B2 | 9/2021 | Ravi et al. | |
| 2008/0055008 | A1 * | 3/2008 | Staszewski | H03B 21/00 331/37 |
| 2008/0192876 | A1 * | 8/2008 | Dulger | H03L 7/1806 375/376 |

(Continued)

OTHER PUBLICATIONS

Sep. 11, 2020 (PCT) International Search Report and Written Opinion—App. PCT/US2020/035549.

*Primary Examiner* — Patrick C Chen
(74) *Attorney, Agent, or Firm* — Banner & Witcoff Ltd.

(57) ABSTRACT

Techniques are described related to digital radio control and operation. The various techniques described herein enable high-frequency local oscillator (LO) signal generation using injection locked cock multipliers (ILCMs). The techniques also include the use of LO signals for carrier aggregation applications for phased array front ends. Furthermore, the disclosed techniques include the use of array element-level control using per-chain DC-DC converters. Still further, the disclosed techniques include the use of adaptive spatial filtering and optimal combining of analog-to-digital converters (ADCs) to maximize dynamic range in digital beamforming systems.

12 Claims, 35 Drawing Sheets

(56) References Cited

U.S. PATENT DOCUMENTS

| | | | |
|---|---|---|---|
| 2010/0109714 A1* | 5/2010 | Lindfors | G06F 1/022 |
| | | | 327/105 |
| 2013/0027129 A1 | 1/2013 | Langer | |
| 2014/0002287 A1* | 1/2014 | Klepser | H04L 27/2003 |
| | | | 341/144 |
| 2014/0023048 A1 | 1/2014 | Vu et al. | |
| 2014/0072077 A1 | 3/2014 | Cheng et al. | |
| 2014/0084880 A1 | 3/2014 | Gulko et al. | |
| 2014/0378065 A1 | 12/2014 | Ali et al. | |
| 2015/0333781 A1 | 11/2015 | Alon et al. | |
| 2017/0353255 A1 | 12/2017 | Islam et al. | |
| 2018/0152144 A1 | 5/2018 | Choo et al. | |
| 2018/0159483 A1 | 6/2018 | Masood et al. | |
| 2018/0368065 A1 | 12/2018 | Sarkas et al. | |
| 2019/0097588 A1 | 3/2019 | Nobbe et al. | |
| 2021/0067182 A1 | 3/2021 | Ravi et al. | |
| 2021/0367629 A1 | 11/2021 | Ravi et al. | |

* cited by examiner $$700 \left\{ \begin{array}{ccccc} \frac{2\pi}{M_x} + \frac{2\pi}{M_y} & \frac{2\pi}{M_x} + \frac{4\pi}{M_y} & \cdots & \frac{2\pi}{M_x} + \frac{2\pi(M_y-1)}{M_y} & \frac{2\pi}{M_x} \\ \frac{4\pi}{M_x} + \frac{2\pi}{M_y} & \frac{4\pi}{M_x} + \frac{4\pi}{M_y} & \cdots & \frac{4\pi}{M_x} + \frac{2\pi(M_y-1)}{M_y} & \frac{4\pi}{M_x} \\ \vdots & \vdots & \ddots & \vdots & \vdots \\ \frac{2\pi(M_x-1)}{M_x} + \frac{2\pi}{M_y} & \frac{2\pi(M_x-1)}{M_x} + \frac{4\pi}{M_y} & \cdots & \frac{2\pi(M_x-1)}{M_x} + \frac{2\pi(M_y-1)}{M_y} & \frac{2\pi(M_x-1)}{M_x} \\ \frac{2\pi}{M_y} & \frac{4\pi}{M_y} & \cdots & \frac{2\pi(M_y-1)}{M_y} & 0 \end{array} \right\}$$

FIG. 7

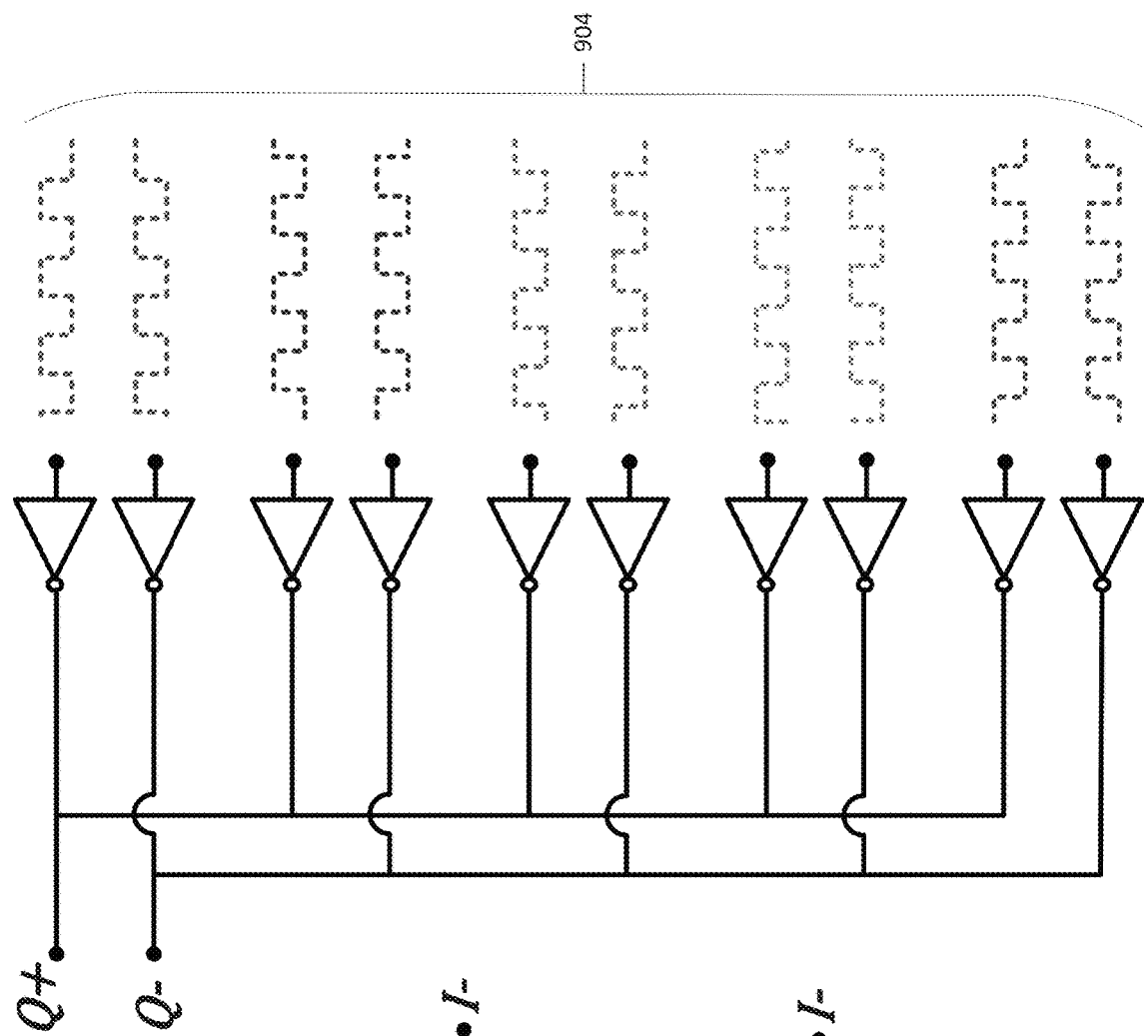
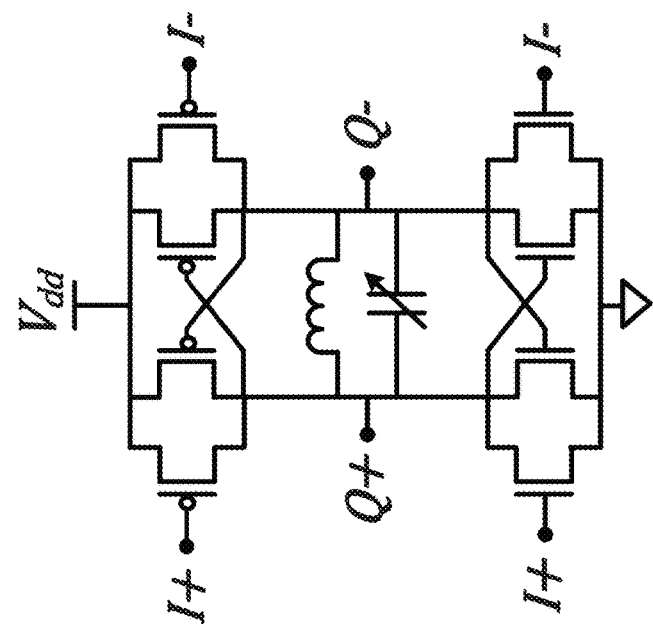
FIG. 9B

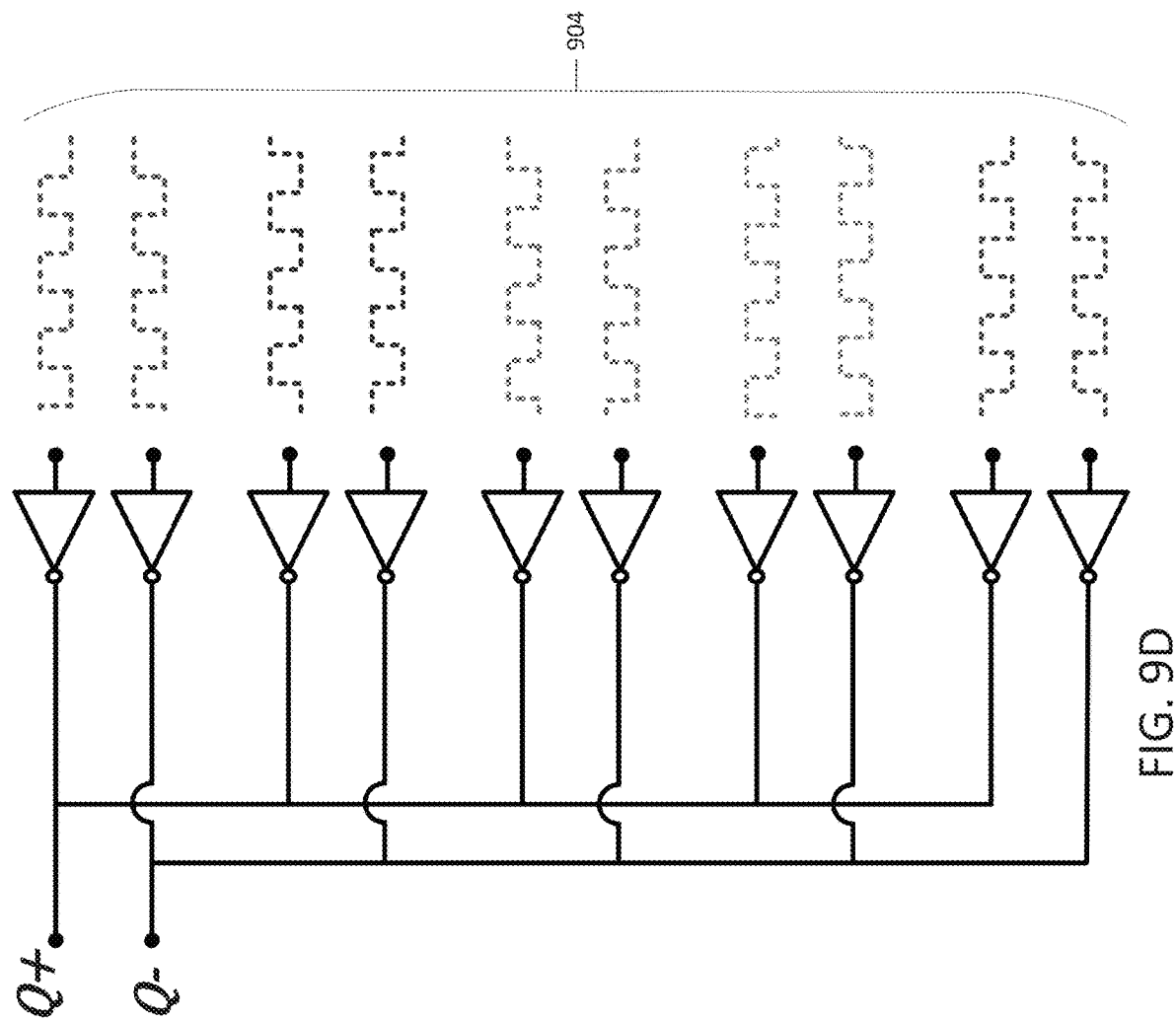
FIG. 9D
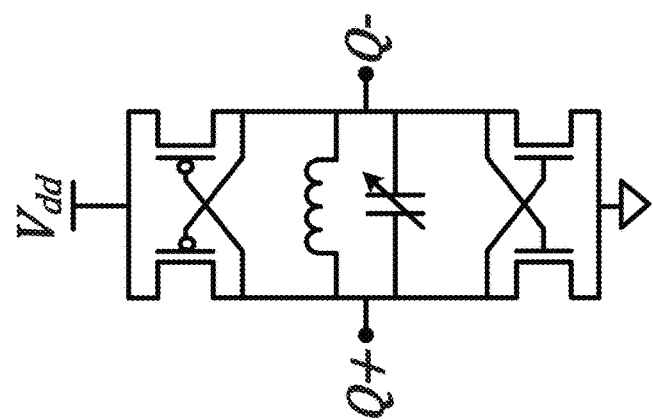

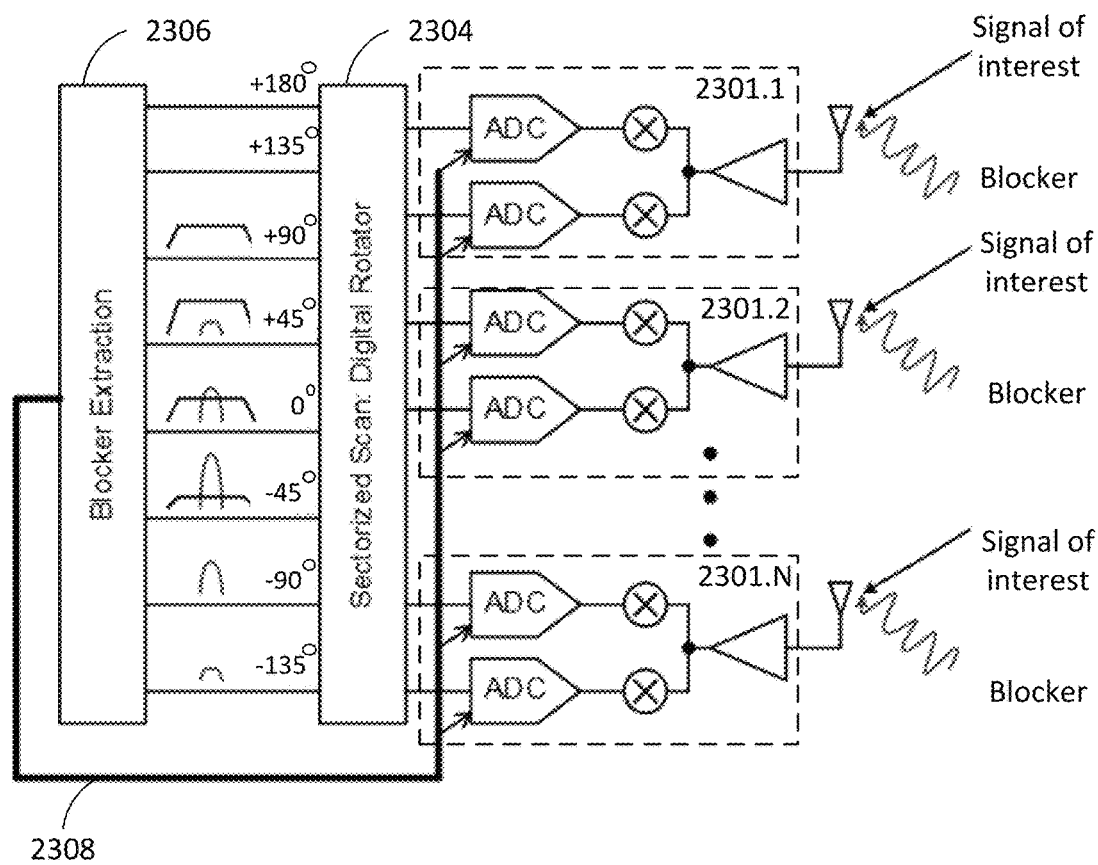
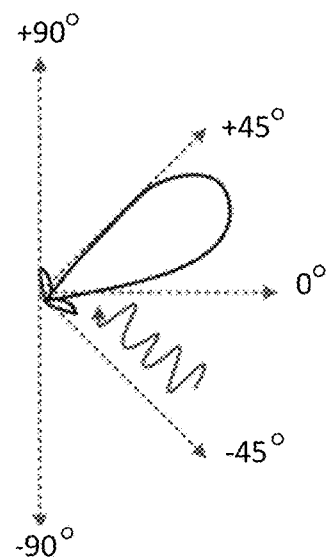
FIG. 23A

2300

LOCAL OSCILLATOR (LO) GENERATION FOR CARRIER AGGREGATION IN PHASED ARRAY FRONT ENDS

CROSS REFERENCE TO RELATED APPLICATIONS

The present application is a continuation of U.S. patent application Ser. No. 17/393,564, filed on Aug. 4, 2021, which is a continuation of U.S. patent application Ser. No. 16/550,574, filed on Aug. 26, 2019, which issued as U.S. Pat. No. 11,121,731 on Sep. 14, 2021, the contents of each of which are incorporated herein by reference in their entireties.

TECHNICAL FIELD

Aspects described herein generally relate to digital radios and, more particularly, to digital radio designs implementing frequency-multiplication, digital control, and novel radio architectures.

BACKGROUND

Modern RF radios generally utilize local oscillators (LOs), which need to be distributed to one or more radio chains (e.g., receivers, transmitters, or transceivers). Furthermore, modern RF radios may implement beamforming and/or require high-frequency signal distribution. The generation, distribution, and processing of such signals introduces design complexities that need to be addressed. For instance, modern RF radios suffer from signal loss, the use of excessive power (and in turn heat generation), and the use of expensive and lossy cabling and connectors as interconnects between RF radio boards. Current attempts to solve these and other issues have been inadequate.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

FIG. 7 illustrates an example $M_x$-by-$M_y$ matrix indicating the phase created for the two-dimensional delay-line 600 as shown in FIG. 6, in accordance with an aspect of the disclosure.

FIGS. 9A-9D illustrate example oscillator circuits that may be used as an oscillator portion of an injection-locked clock multiplier (ILCM), in accordance with aspects of the disclosure.

FIG. 23A illustrates a block diagram of an exemplary receiver design implementing spatial blocker detection with a coarse sector scan, in accordance with an aspect of the disclosure.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
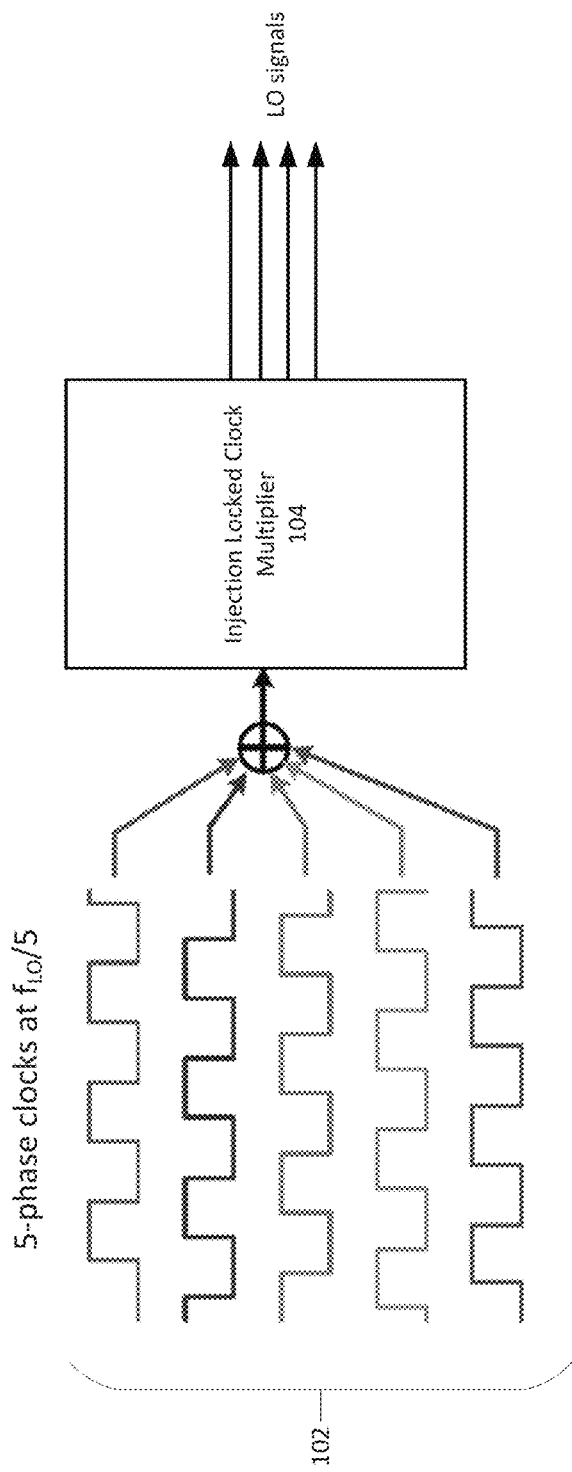
FIG. 1 illustrates an example of multi-phase signal injection to generate one or more LO signals via frequency multiplication, in accordance with an aspect of the disclosure.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Section I—Injection-Locked Clock-Multiplication for Mixer Local Oscillator (LO) Generation Aspects described within this Section generally relate to transceivers and, more particularly, to transceiver designs implementing a combination of a lower frequency delay-locked-loop (DLL) and an injection-locked clock multiplier (ILCM) to generate local oscillator (LO) signals at higher frequencies.

RF transceivers require local oscillators (LOs) at or close to channel frequencies for mixing. For example, one or more LO signals need to be generated at each carrier frequency or channel of interest. For higher frequency applications, such as millimeter-wave (mm-Wave) bands, the requisite LO signal is typically a large signal in terms of signal magnitude. As a result, generating and distributing these mm-Wave LO signals in an on-chip implementation is non-trivial and requires significant power. Moreover, mm-Wave transceiver designs generally utilize quadrature LO and, further complicating this issue, LO beamforming-based transceivers also require multi-phase LOs. Therefore, generating the required LO signals for such transceivers is a complex, expensive, and time-consuming task.

Again, many transceiver designs, such as mm-Wave transceivers, for example, implement quadrature multi-phase LOs. Typical solutions to generate these LO signals include direct multi-phase quadrature LO generation techniques that aim to directly generate mm-Wave LO signals from a mm-Wave phase locked loop using, for example, frequency division, 90° hybrid couplers, and poly-phase filters. The LO signals are then distributed to all the transceiver chains in the mm-Wave system. In a 2×LO case, a local frequency divider is also used to generate quadrature LO clocks. The phase-shifting of the quadrature LO clocks is typically performed in various ways, such as phase-shifting the 2×LO clock before division using individual phase-shifters on the quadrature LO clocks, or using Cartesian combining of quadrature LO clocks to generate phase-shifted quadrature LO.

Such conventional techniques, however, necessitate the use of mm-Wave PLLs, which also require mm-Wave voltage-controlled oscillators (VCOs). These are also non-trivial to design, especially given the stringent phase-noise requirements for modulation in accordance with mm-Wave standards (e.g., "5G" wireless protocols). Consequently, mm-Wave PLLs consume a significant amount of power. Additional power is also consumed in distributing the mm-Wave LO (or 2×LO). Therefore, the power consumption of conventional direct multi-phase quadrature LO generation solutions is extremely high, making such solutions untenable for handheld and mobile applications.

Other solutions for mm-Wave quadrature multi-phase LO generation include the use of frequency-multiplication-based LO signals. Such designs use a central PLL to generate a clock signal at a sub-harmonic of the LO frequency, which is distributed to each transceiver chain. This clock signal is then multiplied up to the LO frequency, typically using an injection-locked oscillator or a self-mixing multiplier, local to each transceiver. Phase-shifted and quadrature LO can thus be generated by implementing direct phase-shifters and/or using quadrature injection-locked oscillators. Another option, which is unique to this frequency multiplication solution, includes the use of phase-shifting at a sub-harmonic of the LO frequency (i.e., before multiplication). In other words, the order of frequency multiplication and phase-shifting may be interchanged in accordance with these conventional approaches.

Such sub-harmonic injection-locking amplifies the intended harmonic while suppressing other harmonics of the sub-harmonic clock. But, with single-phase sub-harmonic injection used in accordance with such techniques, the unintended harmonics are only suppressed by the tank of the oscillator, which may not be sufficient and may lead to the creation of spurious frequencies. This also applies for self-mixing frequency multiplication topologies.

At higher frequencies (e.g., mm-Wave frequencies), the generation of square-wave clocks (e.g., having a 25% duty-cycle in accordance with typical usage) is highly inefficient or not possible in some cases, depending on fabrication of the technology node. Therefore, to address the need to generate quadrature multi-phase LOs, particularly for mm-Wave transceivers including those implementing beamforming, the aspects herein implement a combination of a lower-frequency delay-locked-loop (DLL) and an injection-locked clock multiplier (ILCM) to generate quadrature phase-shifted mm-Wave mixer LO signals. Advantageously, typical mm-Wave transceivers utilize active mixers versus passive mixers for downconversion, and the output of the DLL and ILCM combination aspects described herein is sinusoidal, which is suitable for active mixer operation.

As discussed in further detail below, aspects include a common RF-PLL being implemented at an odd sub-harmonic of a desired LO, which is distributed to different transceiver chains. Local to each transceiver chain, a DLL is used to generate signals at multiple phases of the LO sub-harmonic. The ILCM, local to each chain, is selectively supplied with a subset of these generated signals at multiple phases of the LO sub-harmonic as injected inputs. The ILCM generates, as a result of the injected signals, quadrature phase-shifted large-swing LO signals at mm-Wave frequencies, which have an appropriate LO phase per transceiver chain, while suppressing the fundamental (i.e., the LO sub-harmonic) and its undesired harmonics.

Advantages resulting from the aspects as described herein include the PLL and LO distribution being performed at RF frequencies (not mm-Wave frequencies), saving significant power. Furthermore, the VCO/digitally-controlled oscillator (DCO) in the PLL may be designed for optimum phase-noise (without the extra penalty in Q degradation for mm-Wave operation). Still further, the dividers in the PLL feedback may be CMOS-based instead of current mode logic (CML) or injection-locked. Both of these designs save power in the PLL. The RF LO distribution network that is realized as a result of the aspects described herein also save power compared to mm-Wave LO distribution. The local DLL thus provides a simple way to generate multiple phases (including quadrature) at LO sub-harmonic frequencies, which may be used as an alternative to a frequency-multiplying digital-to-analog converter (FM-DAC) that may otherwise be implemented for this purpose.

Additional advantages include the suppression of undesired harmonics as a result of the injection mechanism to the ILCM, which creates a cleaner frequency spectrum compared to previous techniques. Moreover, a direct connection of ILCM output to an active mixer LO input removes any need for additional buffering. The mixer's LO input load impedance can also be absorbed into the design of the ILCM block.

As referenced further in this and the other Sections, the term "mm-Wave frequency," which the aspects described in this Section as well as others may operate, may include, for example, frequencies and frequency bands above 20 GHz, 24 GHz, 28 GHz, etc., up to an upper frequency. For instance, mm-Wave frequency bands may include frequencies ranging from 20 GHz to 300 GHz, from 24 GHz to 300 GHz, etc. This may include, for instance, the various bands known to be associated with or otherwise referred to as mm-Wave frequency bands such as 24 GHz, 28 GHz, 37 GHz, 39 GHz, 40 GHz, 47 GHz, 60 GHz, etc.

FIG. 1 illustrates an example of multi-phase signal injection to generate one or more LO signals via frequency multiplication, in accordance with an aspect of the disclosure. As shown in FIG. 1, a local oscillator generation (LOG) 100 is shown having injection locked clock multiplier (ILCM) 104, which is injected with multiple phase-shifted signals 102 of a lower-frequency signal. This lower-frequency may be a sub-harmonic of a desired, higher frequency LO signal that is the result of clock multiplication. In general, as shown in FIG. 1, frequency multiplication may be achieved via the injection of a specific set of sub-harmonic signals having a particular phase shift with respect to one another based upon the frequency multiplication that is desired.

To provide an illustrative example, to achieve a frequency multiplication by a factor of 5, the multiple phase-shifted signals 102 each have a frequency that is one-fifth of the LO frequency to be output from the ILCM 104. In an aspect, the multiple phase-shifted signals 102 also have a phase-shift with respect to one another that represents the same fraction of the sub-harmonic LO signal. For example, FIG. 1 shows each of the multiple phase-shifted signals 102 being equally spaced apart from one another in terms of their phase relationships by one-fifth of a full clock cycle, or $2\pi/5$ (i.e., 72 degrees).

As a result, a coherent addition of desired harmonics and a destructive combination at undesired harmonics is achieved via the ILCM 104. This technique works particularly well when the desired harmonic is odd. Again, in the example shown in FIG. 1 and further described herein, the desired sub-harmonic is selected as the fifth sub-harmonic of the desired higher-frequency LO signal, which may correspond to an LO signal in the mm-Wave band of frequencies, for example. The use of a fifth sub-harmonic is by way of example and not limitation. The aspects described herein are not limited to a particular sub-harmonic, and may be implemented in accordance with any suitable sub-harmonic of the LO signal.

Figure 2:
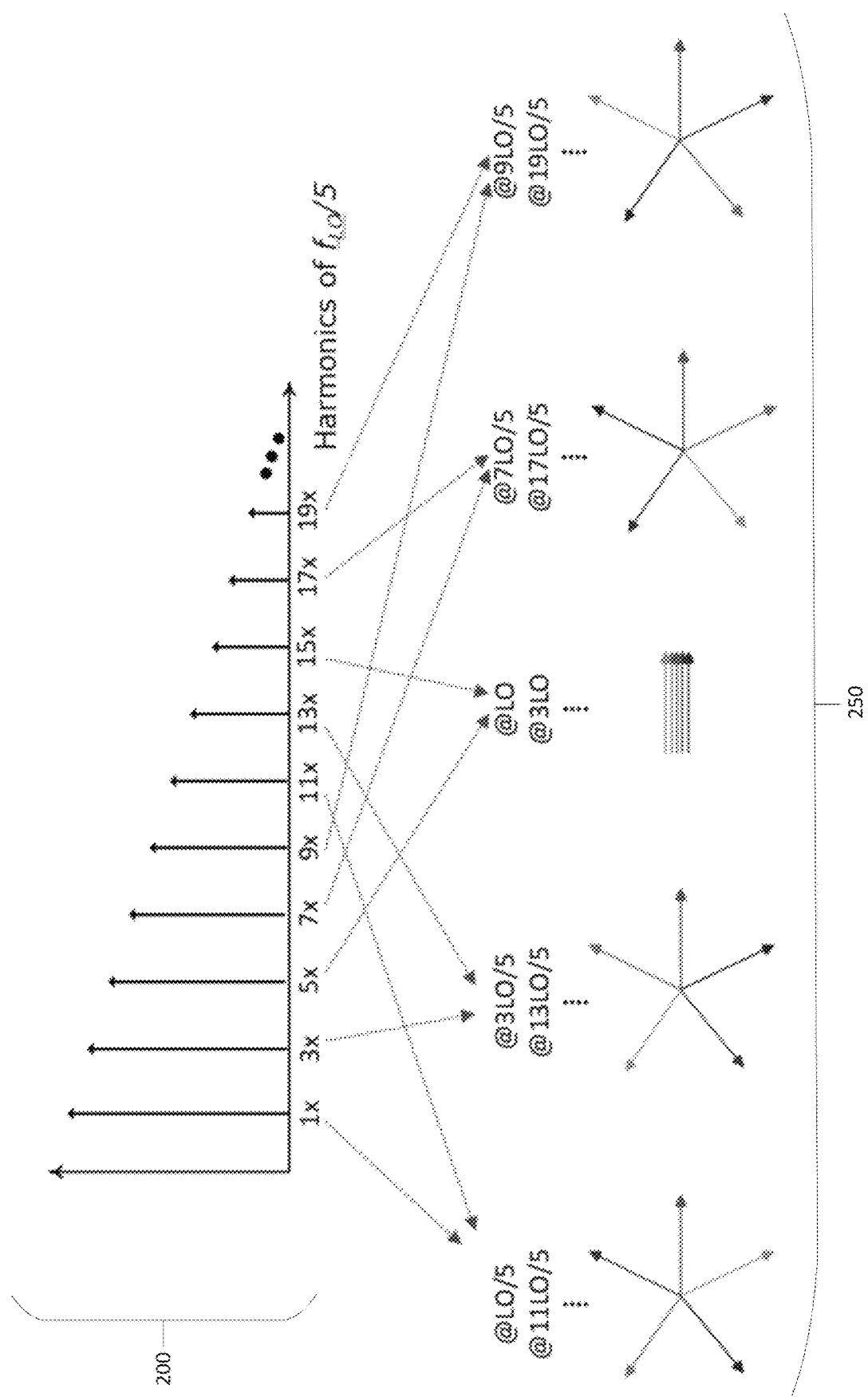
FIG. 2 illustrates the amplification of desired harmonics and the suppression of undesired harmonics as part of LO signal generation, in accordance with an aspect of the disclosure.

For example, as shown in FIG. 2, aspects include summing the multiple phase-shifted signals 102 via the ILCM 104 to create a cancellation of the sub-harmonic LO/5 with its odd harmonics (3LO/5, 7LO/5, etc.) (e.g., via destructive interference). This signal cancellation may include, for instance, a resulting (summed) signal having an amplitude that is significantly attenuated (e.g., 100% attenuation, 95% attenuation, 90% attenuation, etc.) as compared to either of the individually combined phase-shifted signals. Furthermore, aspects include the combination of the multiple phase-shifted signals 102 via the ILCM 104 yielding an amplification (e.g., via constructive interference) of the sub-harmonics of the LO signal that are equivalent to odd harmonics of the higher-frequency LO signal (e.g., 5LO/5=LO, 15LO/5=3LO, etc.). This signal amplification resulting from constructive interference may include, for instance, an amplification of the summed signals such that the resulting (summed) signal has an amplitude that is substantially equivalent to (e.g., within 1%, 5%, 10%, etc.) of the amplitudes of the individually combined phase-shifted signals when added together. This concept is further illustrated in the spectral power distribution diagram 200 and the phase diagram 250, as shown in FIG. 2.

This concept can be generalized mathematically such that if a number (2N+1) of multiple phase-shifted signals are combined, each being equally spaced by $2\pi/(2N+1)$ at a frequency of LO/(2N+1), the sub-harmonic (lower frequency) LO signals will coherently add at the (higher) LO frequency (and harmonics of the LO signal frequency), and will cancel out at all other odd harmonics of LO/(2N+1) as a result of destructive interference. In this case, N represents any integer. In conventional frequency-multiplication techniques, which implement injection-locking or self-mixing, these sub-harmonics are not cancelled fundamentally, and thus lead to the creation of spurs that may occur within one or more critical frequency bands of interest. Therefore, the use of this multi-phase signal injection and phase-additive technique to generate a higher-frequency LO signal using lower frequency signals is advantageous.

Although not shown in FIG. 1 but further discussed below for ease of explanation, the multiple phase-shifted signals 102 may be a subset that are selected from a superset of additional phase-shifted signals, which are then injected into the ILCM 104. In an aspect, the multiple phase-shifted signals 102 may include both in-phase and quadrature-phase signal components, as further discussed below. For example, the multiple phase-shifted signals 102 shown in FIG. 1 may represent the in-phase signal components having relative phases with respect to one another of 0°, 72°, 144°, 216°, and 288°. Although not shown in FIG. 1 for purposes of brevity, the multiple phase-shifted signals 102 injected into the ILCM 104 may additionally include the quadrature-phase signal components. Continuing the previous example, the multiple phase-shifted signals 102 shown in FIG. 1 may further include such quadrature-phase signal components having relative phases with respect to one another of 90°, 162°, 234°, 309°, and 16°.

Figure 3:
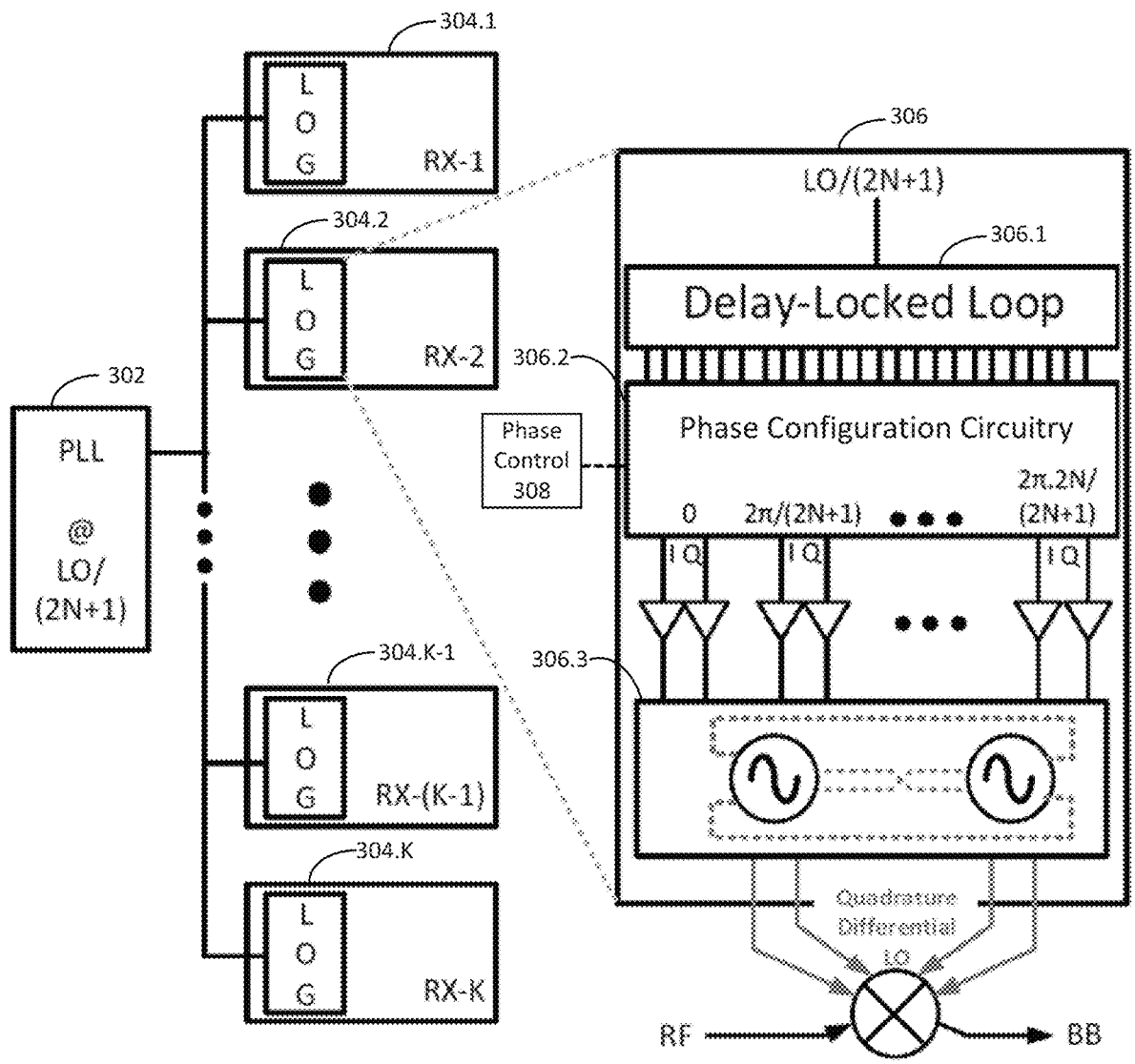
FIG. 3 illustrates a block diagram of an example transceiver design implementing local oscillator distribution and generation, in accordance with an aspect of the disclosure.

FIG. 3 illustrates a block diagram of an example transceiver design implementing local oscillator distribution and generation, in accordance with an aspect of the disclosure. As shown in FIG. 3 and further discussed herein, the transceiver design 300 includes any suitable number K of separate local oscillator generation (LOG) units 304.1-304.K. Each of the LOG units 304.1-304.K may, in turn, include respective LOG circuitry 306, with each respective LOG circuitry including a delay-locked loop (DLL) 306.1, phase configuration circuitry 306.2, and an ILCM 306.3.

Figure 10:
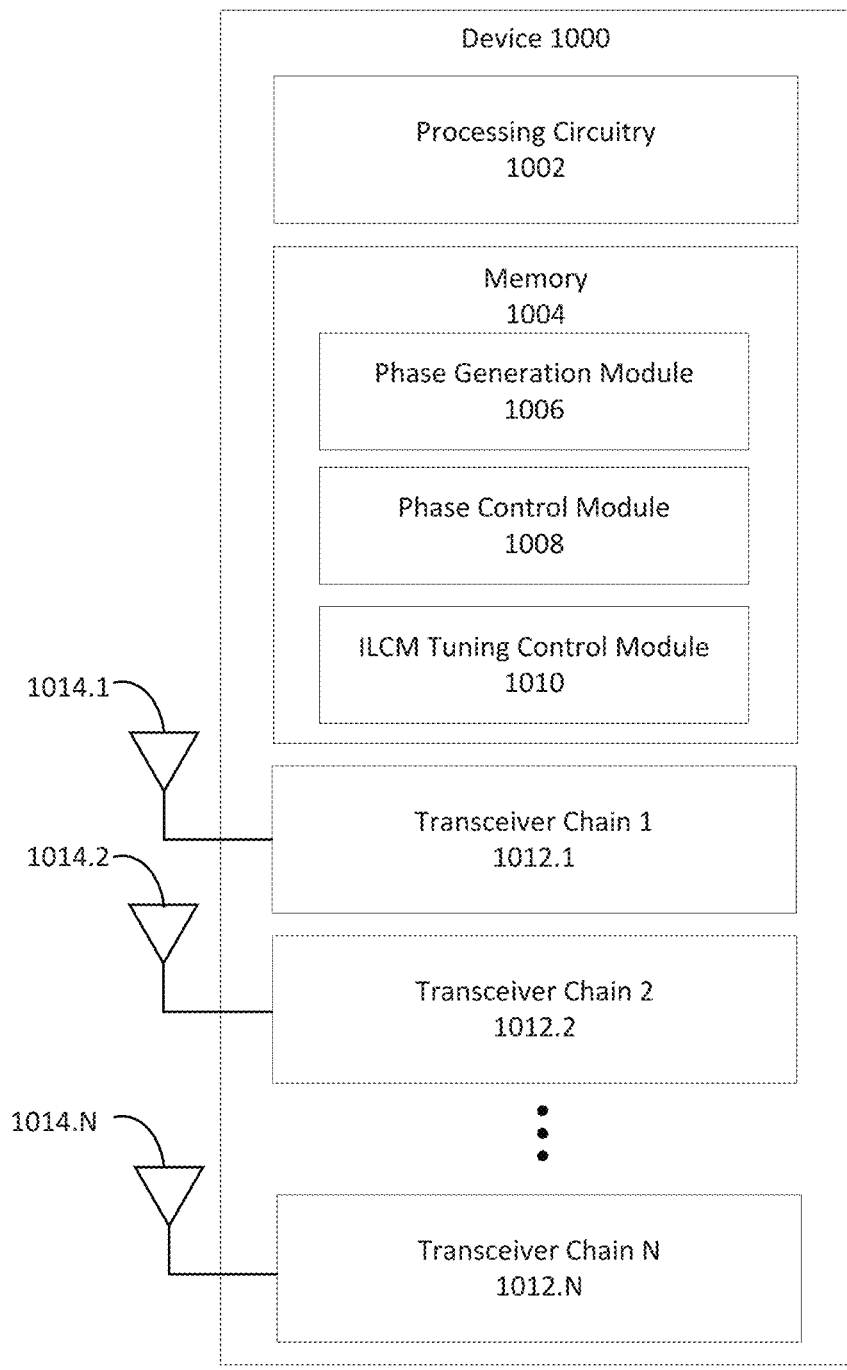
FIG. 10 illustrates a block diagram of a device, in accordance with an aspect of the disclosure.

As further discussed herein with reference to FIG. 10, aspects include the transceiver design 300 being implemented as a portion of an overall transceiver design that has several components omitted for brevity and ease of explanation. For example, the transceiver design 300 allows a set of separate LO signals to be generated for each respective receiver chain RX-1-RX-K within the transceiver design (i.e., each receiver chain residing within each transceiver chain or, alternatively, as part of a dedicated receiver system), which may then be utilized by each respective transceiver chain for downconversion of received signals and subsequent signal processing. As shown in FIG. 3 by way of example and not limitation, the set of LO signals generated via each LOG unit 304 may be quadrature differential LO signals. And, because each transceiver chain is provided with its own set of LO signals, phase variations among the different transceiver chains may be facilitated in this manner. Thus, the aspects described herein may be particularly useful for transceivers that implement beamforming via multiple antennas, as each transceiver chain may utilize its own dedicated set of quadrature LO signals with a phase tuned for that particular transceiver chain and antenna combination.

Thus, aspects include each transceiver chain using a respective set of LO signals for downconversion, demodulation, and signal processing. To do so, various aspects include each one of the individual receiver chains RX-1-RX-K including additional components, circuitry, processors, antennas, etc., to ensure that received signals are received and the data contained therein processed accordingly. For example, these additional components may include mixers, demodulators, filters, amplifiers, processors, etc., with processing of received data being implemented, for example, via one or more processors (e.g., baseband processors) in combination with any other suitable components. For example, once the LO signals are generated, these may be used in accordance with any suitable techniques (e.g., known techniques) to process data contained within wirelessly received signals.

In an aspect, the transceiver design 300 includes common phase-locked loop (PLL) circuitry 302 that generates a reference clock signal, which may be used as an input signal by each of the LOG units 304.1-304.K. This input signal may be generated at a sub-harmonic frequency of a desired higher-frequency LO signal, as discussed with reference to FIG. 1. In aspects, the higher-frequency LO signal may have a frequency associated with the mm-Wave spectrum, such as the proposed 24 GHz-86 GHz spectrum, for example. However, aspects are not limited to this particular band, and the aspects described herein may be implemented in accordance with any frequency or range of frequencies suitable to a particular wireless communication application.

The common PLL circuitry 302 may be implemented using any suitable and/or known circuit components to generate the reference clock signal. As shown in FIG. 3, the common PLL circuitry 302 generates the reference clock signal at a sub-harmonic frequency of the higher-frequency LO signal represented by LO/(2N+1), with LO being the higher target LO signal frequency and N being any positive integer value based upon the desired frequency multiplication scaling used for a particular application. The input signal, which is generated at a sub-harmonic frequency of the higher-frequency LO signal, is then distributed to any suitable number K of the individual RX chains RX-1-RX-K via their respective LOG units 304.1-304.K.

Again, the reference signal (or "input signal" as used with respect to the input to the LOG units 304.1-304.K) may be generated at a lower frequency than the target LO signal by exploiting frequency multiplication (e.g., at RF frequencies versus mm-Wave frequencies). As a result, the input signal may be distributed to each receiver chain RX-1-RX-K using power distribution systems that advantageously save power and require less design effort as compared to implementations used for higher frequency signals. This may be particularly advantageous, for example, when the transceiver design 300 implements "massively" distributed transceiver chains, with the number K being 10, 20, 100, etc. In an aspect, each receiver chain RX-1-RX-K implements respective LOG circuitry 304 to perform frequency multiplication and phase-shifting using the input signal, as shown in further detail for receiver chain 304.2 and further discussed below.

For example, a LOG unit 306 is shown in FIG. 3, which is associated with the receiver chain RX-2 and the LOG unit 304.2. Again, aspects include each of the receiver chains RX-1-RX-K implementing a separate LOG unit such as LOG unit 306, but only the details of operation of the LOG unit 306 are discussed herein for purposes of brevity. In an aspect, the LOG unit 306 includes a delay-locked loop (DLL) 306.1, phase configuration circuitry 306.2, and ILCM 306.3. In an aspect, the LOG unit 306 may receive the reference clock signal generated by the common PLL circuitry 302 and provide a set of quadrature LO signals as outputs. As shown in FIG. 3, these quadrature LO signals may be, for example, differential quadrature LO clock signals. Although the aspects are mainly described herein referencing the LO clock signals as being quadrature and differential in nature, the aspects are not so limited, and may include the generation of any suitable number or type of LO signals having any relationship with respect to one another suitable for signal processing of received wireless signals.

In any event, aspects include the generated set of LO signals having a higher, target frequency (e.g., a mm-Wave frequency), with the set of LO signals being represented as an in-phase LO signal component at 0 degrees (I), an in-phase LO signal component at 180 degrees ($\bar{I}$), a quadrature LO signal component at 90 degrees (Q), and a quadrature LO signal component at 270 degrees ($\bar{Q}$). Of course, although the quadrature LO signals may maintain a 90-degree phase shift with respect to one another, the quadrature LO signals may include any suitable phase shift, with the "0 degree" in-phase component representing a reference phase value that may deviate from 0 degrees for each respective one of the receiver chains RX-1-RX-K.

In other words, although generated quadrature LO signals may include the LO signal components with phases at 0, 90, 180, and 270 degrees with respect to one another, each of LOG units 204.1-204.K may generate its own set of quadrature LO signals that may be phase-shifted with respect to another set of quadrature LO signals. For example, LOG unit 304.1 may generate quadrature LO signals that are each 90 degrees apart from one another, but phase-shifted 5, 10, 15, degrees, etc., from the quadrature LO signals generated by the LOG unit 304.2. The details regarding how the quadrature LO signals are generated via each LOG unit 304.1-304.K are further discussed below.

Figure 4:
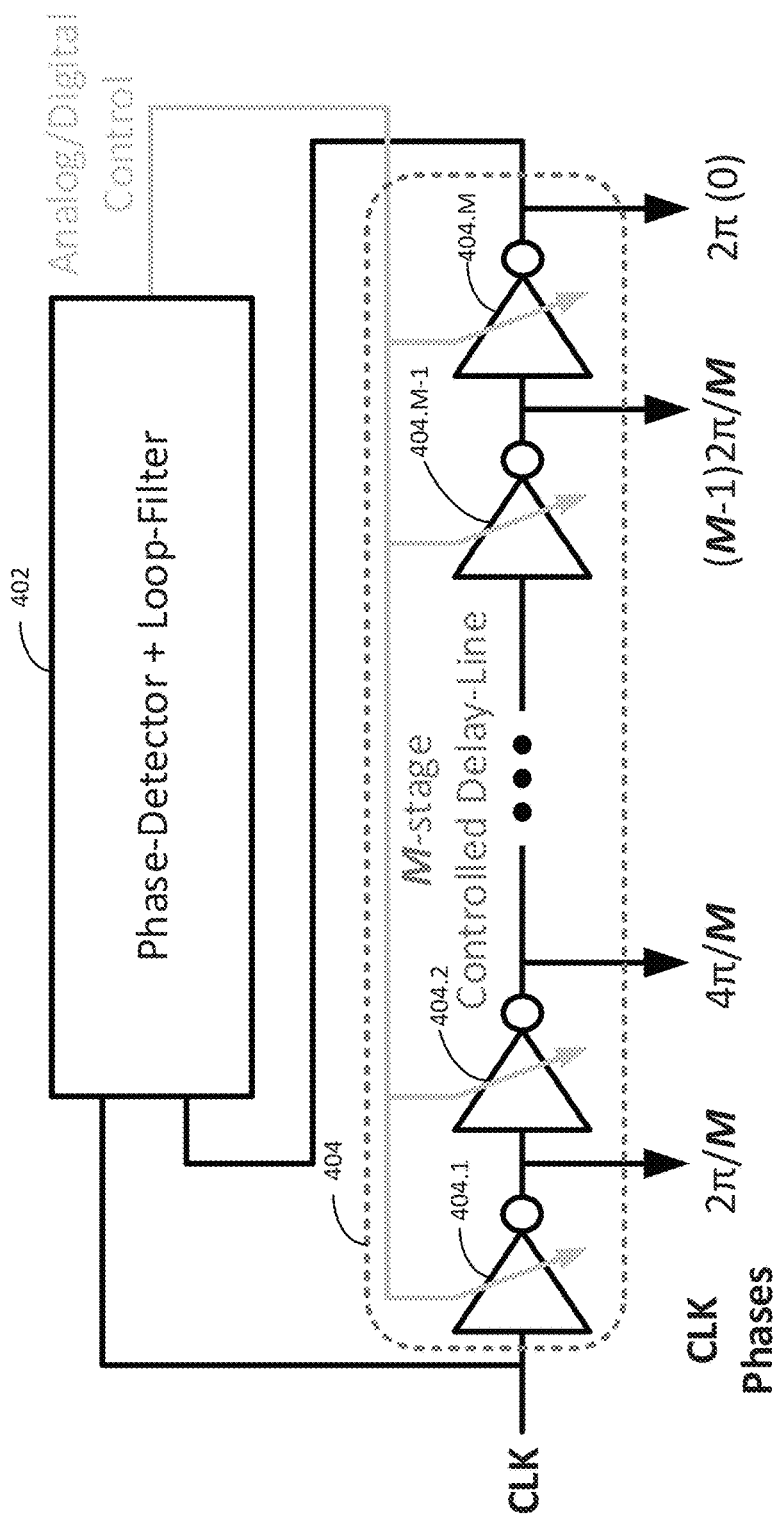
FIG. 4 illustrates a block diagram of an example delay-locked loop (DLL) implementing a controlled delay-line, in accordance with an aspect of the disclosure.

In various aspects, the DLL 306.1 may be implemented using different architectures, each providing tradeoffs of increased design complexity in exchange for finer control over the phases used to generate the quadrature LO signals. In an aspect, the DLL 306.1 may be implemented as a multi-stage controlled delay-line, an example of which is illustrated in FIG. 4 as DLL 400. In an aspect, the DLL 400 may generate multiple sub-harmonic phase signals that are input to the phase configuration circuitry 306.2. Further in accordance with such aspects, the DLL 400 may include a phase-detector and loop filter 402, which may be implemented, for example, as one or more processors configured to execute computer-readable instructions to control a state of one or more of M number of delay elements 404.1-404.M included in the M-stage controlled delay-line 404. Although the M-stage controlled delay-line 404 is illustrated in FIG. 4 as implementing inverters as delay elements 404.1-404.M, aspects include the M-stage controlled delay-line 404 being implemented with any suitable type and/or combination of delay elements 404.1-404.M, such as buffers, for example.

In an aspect, phase-detector and loop filter 402 may facilitate analog and/or digital control over the M-stage controlled delay-line 404, which may be tuned to ensure that the delay-line input and output are separated by one clock period. The clock signal may include, for instance, the distributed input signal generated by the common PLL circuitry 302, as discussed with reference to FIG. 3. Furthermore, the phase-detector and loop filter 402 may control the state of the delay elements implemented by the M-stage controlled delay-line 404 using any suitable techniques, such as via load control, current starving control, power supply control, etc.

In any event, aspects include the DLL 400 providing a set of phase-shifted signals to the phase configuration circuitry 306.2. These phase-shifted signals, as shown in FIG. 4, are separated by a phase that is a function of the number M of delay elements 404.1-404.M. Thus, the unit-phase granularity associated with an amount of phase-shift between the set of phase-shifted signals provided by the DLL 400 (i.e., the "CLK Phases") is increased with the number M of delay elements 404.1-404.M. However, the DLL 400 is limited in that the unit phase-shift ($2\pi/M$) equivalent time-delay, in some instances, may decrease beyond a unit inverter delay of an individual delay element. Therefore, to allow for a finer granularity of unit-phase shift, aspects include implementing alternate types of delay lines, as further discussed below with respect to FIGS. 5 and 6.

Figure 5:
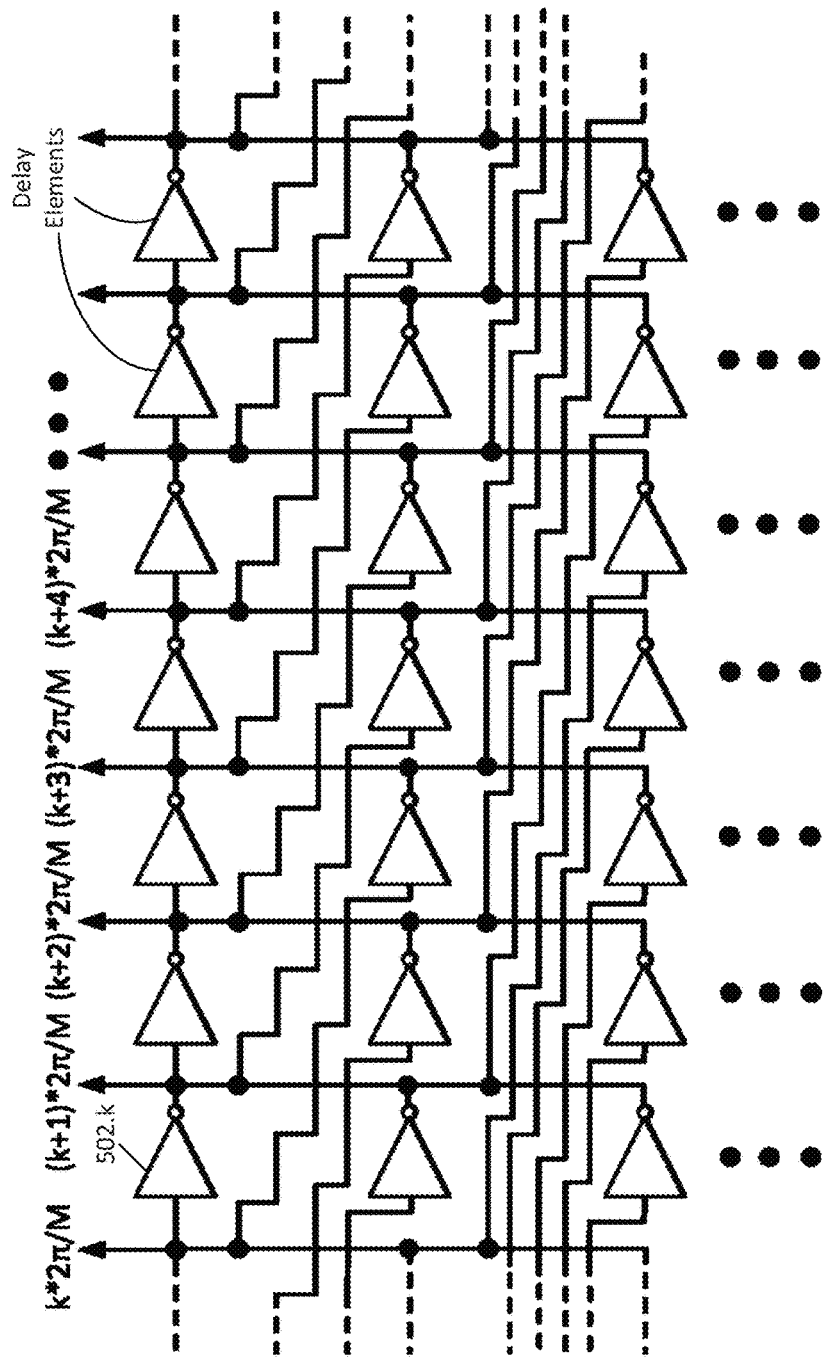
FIG. 5 illustrates a block diagram of an example interpolating delay-line, in accordance with an aspect of the disclosure.

FIG. 5 illustrates a block diagram of an example interpolating delay-line, in accordance with an aspect of the disclosure. In an aspect, the DLL 306.1 as shown in FIG. 3 may be implemented utilizing the interpolating delay-line 500 as illustrated in FIG. 5 by modifying the implementation of the DLL 400 as shown in FIG. 4. For instance, the M-stage controlled delay-line 404 may be substituted with other delay element configurations, such as the interpolating delay-line 500 as shown in FIG. 5. Thus, in accordance with such aspects, the DLL 306.1 may be implemented as a combination of the phase-detector and loop filter 402, as shown in FIG. 4 and the interpolating delay-line 500, as shown in FIG. 5.

Although the interpolating delay-line 500 includes delay elements represented as inverters in FIG. 5, aspects include the interpolating delay-line 500 implementing any suitable type of delay element. As shown in FIG. 5, a number M of delay elements may be associated with one clock cycle, with a number k representing an arbitrary element number between 1 and M. For example, the phase at the node labeled $(k+1)*(2\pi/M)$ may be associated with a delay element 502.$k$. By staggering the inputs between each of the rows as shown in FIG. 5, the set of phase-shifted signals provided by the DLL 500 may provide a unit phase-shift of $(k*2\pi/M)$, $(k+1)*(2\pi/M)$, $(k+2)*(2\pi/M)$, etc., which represents a greater level of phase granularity as compared to the DLL 400. In other words, the DLL 500 leverages interpolation between sets of delay elements to overcome the limitations imposed by the DLL 400, achieving a unit-phase shift that is less than that associated with the delay of an individual delay element.

For DLLs 400 and 500 as shown in FIGS. 4 and 5, respectively, each DLL represents a single DLL implemented as a specific configuration (e.g., non-interpolating DLL 400 versus interpolating DLL 500). In other aspects, as further discussed below, more than one DLL may be implemented to achieve even finer control over the unit-phase shift.

Figure 6:
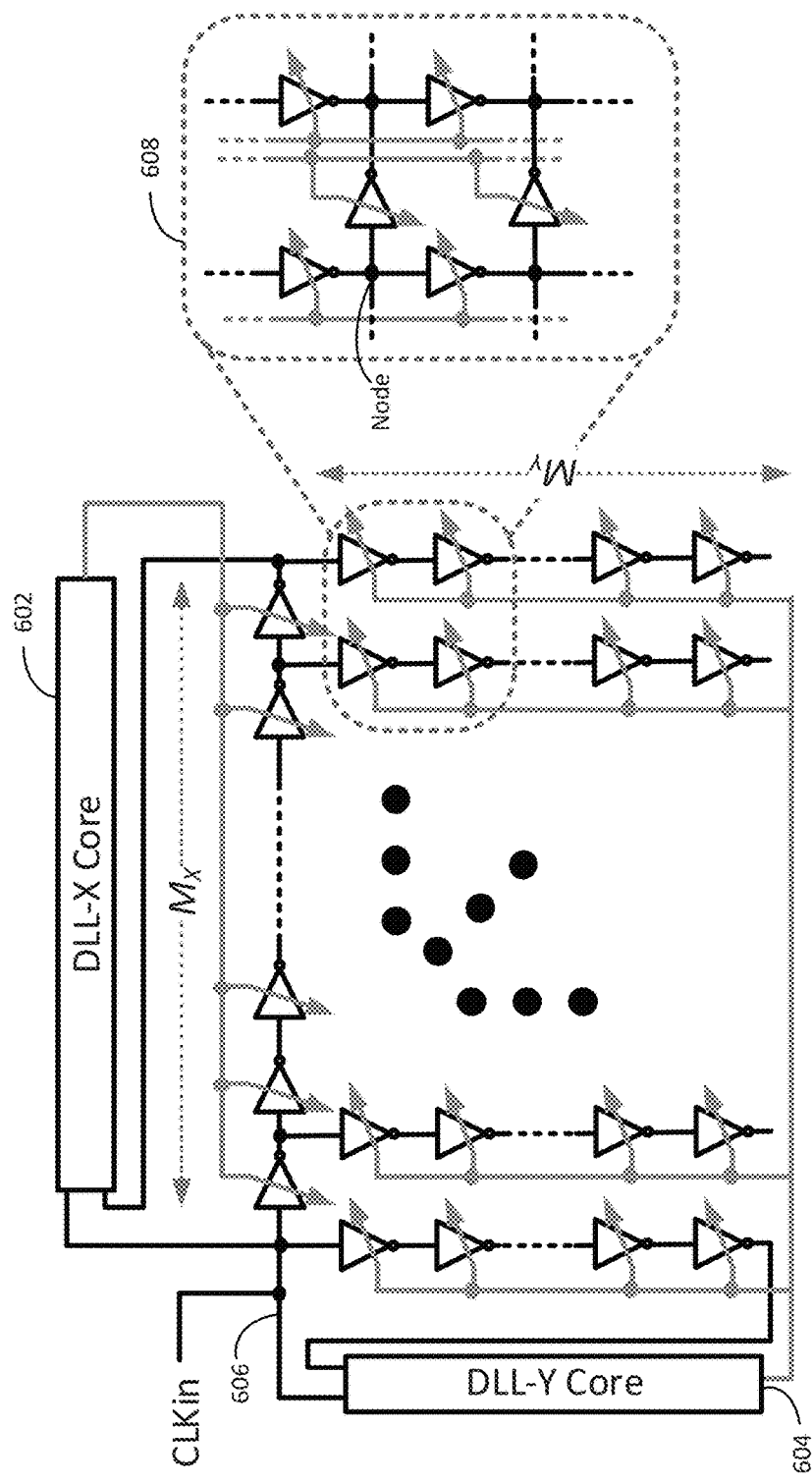
FIG. 6 illustrates a block diagram of an example DLL implementing a two-dimensional delay-line, in accordance with an aspect of the disclosure.

FIG. 6 illustrates a block diagram of an example DLL implementing a two-dimensional delay-line, in accordance with an aspect of the disclosure. In an aspect, the DLL 306.1 may be implemented as the two-dimensional delay-line 600 as illustrated in FIG. 6. The two-dimensional DLL 600 may implement two separate delay-line control systems DLL-X core 602 and DLL-Y core 604, each controlling a respective set of delay elements in a similar manner as DLLs 400 and 500. Also similar to the DLLs 400 and 500, the two-dimensional delay-line 600 may implement any suitable type of control over the delay elements (load control, current starving control, power supply control, etc.), which may be implemented as any suitable type of delay elements. Thus, like DLLs 400 and 500, the two-dimensional DLL 600 may receive, at input 606, the reference clock signal generated by the common PLL circuitry 302, and output any suitable number of phase-shifted versions of the reference clock signal. These phase-shifted reference clock signals may then be utilized by the phase configuration circuitry 306.2 to inject a specific subset of the phase-shifted signals, as further discussed below, to the ILCM 306.3. In this way, the ILCM 306.3 facilitates frequency multiplication of the subset of the phase-shifted input signals and generates a set of LO signals at a desired frequency and phase.

However, unlike DLLs 400 and 500, aspects include the two-dimensional DLL 600 including two orthogonal sets of M number of delay elements forming a two-dimensional matrix of delay elements having dimensions $M_x$-by-$M_y$. Aspects include the matrix having any suitable dimensions, and need not be symmetric. In this way, the delay element matrix may be configured, as shown in FIG. 6, with the DLL-X core 602 controlling the $M_x$ delay elements and the DLL-Y core controlling the $M_y$ delay elements. Moreover, the two-dimensional matrix of delay elements may be interleaved with one another, as illustrated in the detail portion 608, such that each node in the two-dimensional matrix is fed by two delay elements.

In an aspect, each of the delay elements are typically controlled by the DLL (-X or -Y) core output. However, the delay element chain at the "top" (i.e., the last inverter output is going back to the DLL-X core as an input), and the delay element on the "left" (i.e., the last inverter output is going back to DLL-Y core as an input) are "fully" controlled, i.e., their delay is controlled and bound by each respective DLL. Other than those chains, the other delay elements are partially controlled by the DLLs. Thus, aspects include exploiting the configuration of the two-dimensional DLL 600 to reduce delay variations in stages not fully controlled by DLLs. As an added advantage, the two-dimensional DLL 600 also allows for a more orderly "floor-planning," of the design, which may advantageously allow for an easier implementation than DLLs 400 or 500, in some aspects. An example $M_x$-by-$M_y$ matrix indicating the phases generated by the two-dimensional delay-line 600 is shown in FIG. 7.

In various aspects, the appropriate phases may be generated by any suitable delay-line implementation, such as any of DLLs 400, 500, or 600, for example. In other words, a respective LOG unit 304 may output the appropriate phases via its respective DLL 306.1, which are then selected by the phase configuration circuitry 306.2 portion of the LOG unit 304, as further discussed below, and injected into the ILCM 306.3 to provide the desired LO signals for each receiver chain.

In other words, with reference to FIG. 3, aspects include the DLL 306.1 generating a superset of phases needed to ensure frequency-multiplication by the ILCM 306.3. Aspects include the DLL 306.1 generating the phase-shifted input signals having a phase difference between them in accordance with the implemented DLL architecture for all desired beam angle scenarios. The phase configuration circuitry may be controlled via the phase control block 308, which may generate one or more control signals via one or more processors executing stored instructions. In some aspects, the phase control block 308 may represent a pure hardware solution. In any event, the phase configuration circuitry may be implemented with any suitable number and/or type of switching elements to selectively couple and inject signals generated by the DLL 306.1 to the ILCM 306.3.

By selectively injecting specific combinations of the phase-shifted input signals from among the superset generated by the DLL 306.1 (i.e., a subset of the superset), the phase configuration circuitry 306.2 ensures that the appropriate phase-shifted (in-phase and quadrature-phase) input signals are injected into the ILCM 306.3. Thus, by discriminately selecting certain generated phase-shifted input signals, variations in the frequency (i.e., proper frequency scaling) and phases of the output quadrature LO signals may be realized.

In an aspect, and as further discussed below, the ILCM 306.3 may implement any suitable type of architecture to ensure frequency multiplication and to generate the LO signals at the appropriate frequency and phase shift. As further discussed below with reference to FIGS. 8A-8B, the ILCM 306.3 may be implemented using any suitable type of hardware circuitry configured to perform injection locking, and may implement any suitable type of oscillator topology.

In an aspect, the ILCM 306.3 may implement a serial or a parallel injection architecture, as discussed separately below with reference to FIGS. 8A-8B. Each of the architectures presents trade-offs in terms of current consumption, start-up gain requirements, and lock-range capabilities. Regardless of the particular ILCM architecture used, aspects include injecting each of the phase-shifted input signals, as selected by the phase configuration circuitry 306.2, into the ILCM 306.3, which implements one or more oscillators tuned to a frequency that is equal to or substantially the same as (e.g., with 1%, 5%, 10%, etc.) the intended LO frequency. In other words, the oscillator(s) implemented within the ILCM 306.3 may be tuned to have a natural oscillating frequency that is a specific harmonic of the sub-harmonic frequency associated with the phase-shifted input signals provided by the phase configuration circuitry 306.2. To provide an illustrative example using the 5 clock signals as shown in FIGS. 1 and 2, the oscillator(s) implemented as part of the ILCM 306.3 may be tuned to have a natural resonance at the LO frequency, which is the fifth harmonic frequency of the sub-harmonic $f_{LO}/5$, and thus resonates at the frequency $f_{LO}$.

Conventional ILCM circuits typically inject one signal, and are designed to lock to the nearest harmonic frequency of this injected signal to produce frequency multiplication. However, because the harmonic content of the signal may be somewhat weak, the resulting phase lock range is typically quite narrow and the resulting phase noise may be difficult to track. Furthermore, in some cases the harmonics may be significant and, because they are not intrinsically suppressed (as is the case with the aspects described herein), conventional ILCM circuits risk locking to the wrong harmonic, and thus resonate at an undesired frequency.

As discussed herein with reference to FIG. 2, the aspects described herein address these issues by using a multi-phase signal injection approach using a phase-spacing that may be selectively adjusted based upon the desired frequency multiplication that is desired. In doing so, the undesired harmonics of the sub-harmonic signal are rejected or suppressed, which helps prevent false locks occurring at these unwanted harmonic frequencies. Furthermore, by injecting a specific subset of phase-shifted input signals at a sub-harmonic frequency (i.e., signals having a specific phase relationship with one another) of the LO frequency, constructive interference of these phase-shifted input signals yields a signal having a higher signal strength to better ensure injection locking at the desired, higher LO frequency to better facilitate frequency multiplication.

For instance, as shown in FIG. 3, the subset of the phase-shifted input signals provided by the phase configuration circuitry 306.2 are coupled to sets of in-phase (I) and quadrature-phase (Q) buffers. The current supplied by these buffers is then injected into the ILCM 306.3. The ILCM 306.3 includes an oscillator configured in either a serial or parallel architecture, which receives the input current from the I and Q buffers associated with the coupled phase-shifted signals. As a result, the oscillator(s) sum the coupled phase-shifted signals, resulting in constructive interference at the desired LO frequency, as discussed herein, assuming that the injected signals have the appropriate phase relationship between one another for the desired level of frequency multiplication. This summation may occur within either the current domain or the voltage domain, depending upon the particular oscillator implementation that is used, in various aspects.

Figure 8A:
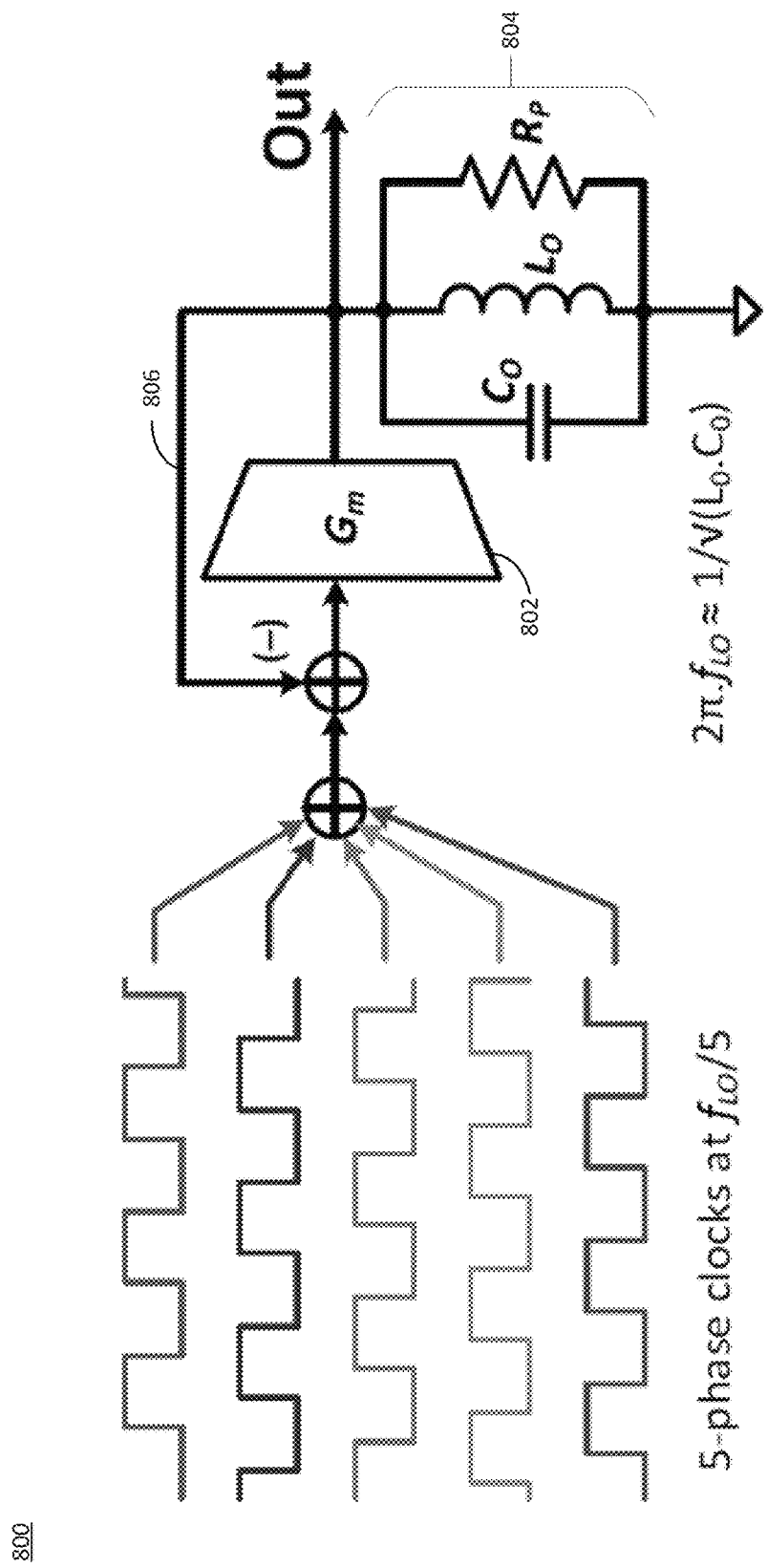
FIG. 8A illustrates an injection-locked clock multiplier (ILCM) using series injection, in accordance with an aspect of the disclosure.

FIG. 8A illustrates an injection-locked clock multiplier (ILCM) using series injection, in accordance with an aspect of the disclosure. As shown in FIG. 8A, the series injection ILCM 800 is represented via a feedback path 806 coupled between a tank circuit 804 and an oscillator circuit 802, which provides a transconductance gain Gm that represents a gain used in the oscillator circuit 802 to drive the tank circuit and compensate for natural losses. Although the details of the oscillator circuit 802 are not shown for purposes of brevity, aspects include the ILCM 800 implementing any suitable type of oscillator topology. For example, aspects include the oscillator circuit 802 being implementing using any known configuration of transistors to provide a suitable transconductance gain. This may include, for example, a common source amplifier, cross-coupled transistors, etc. As shown in FIG. 8A, the ILCM 800 uses series injection locking, which couples the multiple coupled phase-shifted signals into the oscillator circuit 802, which is in turn coupled to the tank circuit 804.

Figure 8B:
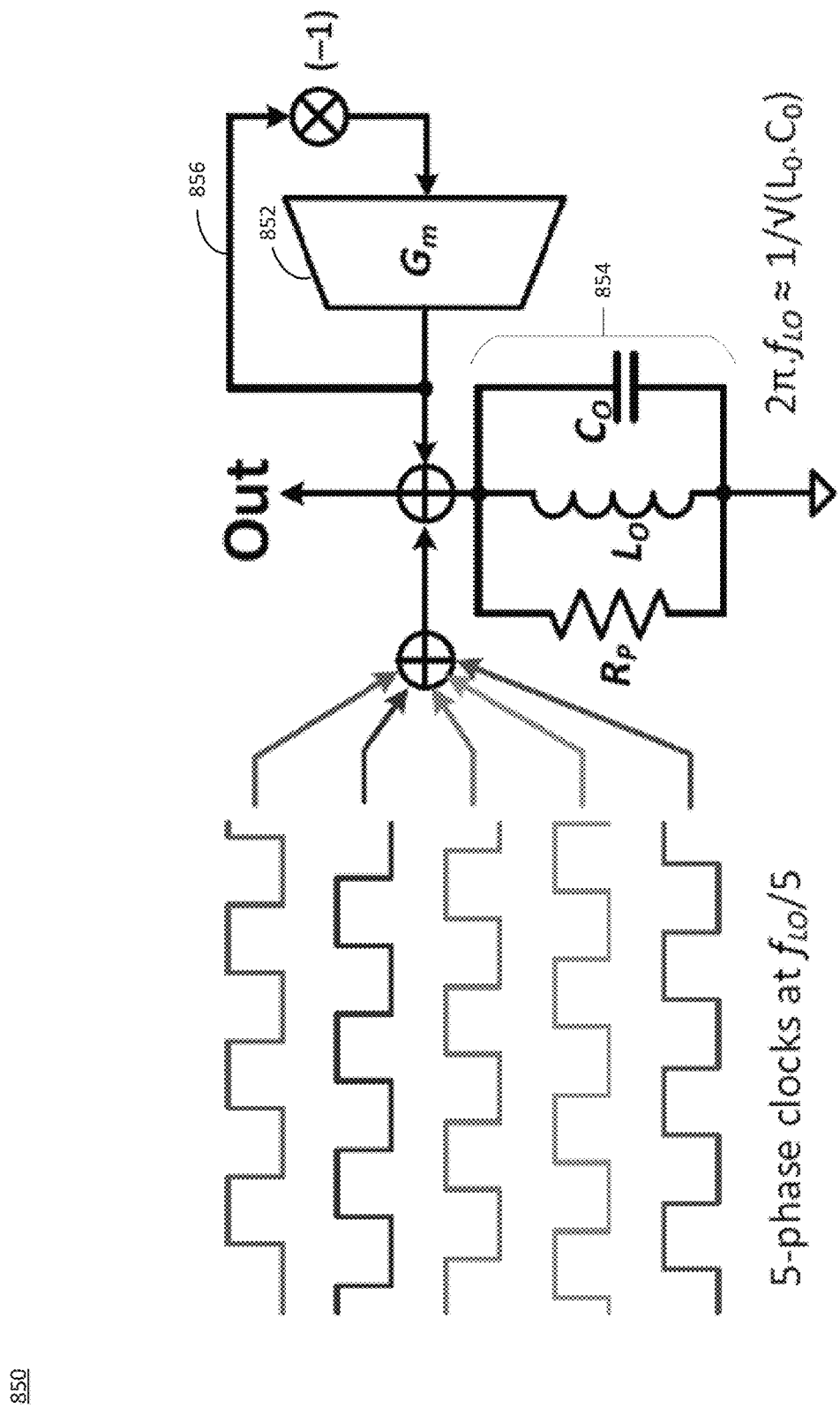
FIG. 8B illustrates an injection-locked clock multiplier (ILCM) using parallel injection, in accordance with an aspect of the disclosure.

FIG. 8B illustrates an injection-locked clock multiplier (ILCM) using parallel injection, in accordance with an aspect of the disclosure. The ILCM 850 as shown in FIG. 8B operates in a similar manner as the ILCM 800 as shown in FIG. 8B. Similar to the ILCM 800 as shown in FIG. 8A, the ILCM 850 as shown in FIG. 8B is represented via a feedback path 856 coupled between a tank circuit 854 and an oscillator circuit 852, which provides a transconductance gain Gm that represents a gain used in the oscillator circuit 852 to drive the tank circuit 854 and compensate for natural losses. Like the ILCM 800, although the details of the oscillator circuit 852 for ILCM 850 are not shown for purposes of brevity, aspects include the ILCM 850 also implementing any type of oscillator topology or known configuration of transistors to provide a suitable transconductance gain. As shown in FIG. 8B, the parallel injection locking configuration of the ILCM 850 injects the multiple phase-shifted input signals directly into the tank circuit 854.

Regardless of the whether the ILCM configuration is a series or parallel implementation, aspects include the multiple phase-shifted signals, which are the 5-phase clock signals at $f_{LO}/5$ in this example, having an accompanying phase noise. In the case of 5 multi-phase signals as shown in FIGS. 8A-8B, the phase noise of the injected signals is up-converted by a factor of $20 \log_{10}(5)=14$ dB at the output ("out") of each ILCM 800, 850. To provide a more generic expression, aspects include the phase noise being unconverted by a factor of $20 \log_{10}(2N+1)=14$ dB, in which N is any integer used in accordance with the generation of a particular sub-harmonic LO signal frequency (N=2 for the 5 in the examples shown in FIGS. 8A-8B).

Although the ILCM 800, 850 as shown in FIGS. 8A and 8B respectively, illustrate a single oscillator circuit, the ILCM 306.3 may be implemented with any suitable number of oscillator circuits to output any suitable number of LO signals. For example, the phase-shifted input signals output by the phase configuration circuitry 306.2 may be coupled to any suitable number of oscillator circuits implemented via the ILCM 306.3. For example, the ILCM 306.3 may implement two different oscillator circuits, one for the in-phase (I) phase-shifted signals and another for the quadrature-phase (Q) phase-shifted components output by the phase configuration circuitry 306.2. To provide another example, the ILCM 306.3 may implement a quadrature oscillator system to receive the I and Q phase-shifted signals output by the phase configuration circuitry 306.2 and to generate the higher frequency quadrature phase-shifted LO signals, as shown in FIG. 3. In an aspect, this may be implemented by phase-shifting the LO signals generated via each respective I and Q dedicated oscillator circuit by 180 degrees (e.g., via an inverter or other suitable circuit component).

In an aspect, the LO signals output by the ILCM 306.3 may be fed directly to a higher frequency (e.g., mm-Wave) mixer, as shown in FIG. 3. Advantageously, because the load of the active mixer typically capacitive in nature, this is absorbed by the oscillator circuits implemented as part of the ILCM 306.3 as a fixed capacitance during design, eliminating the need for additional buffers.

Figure 9A:
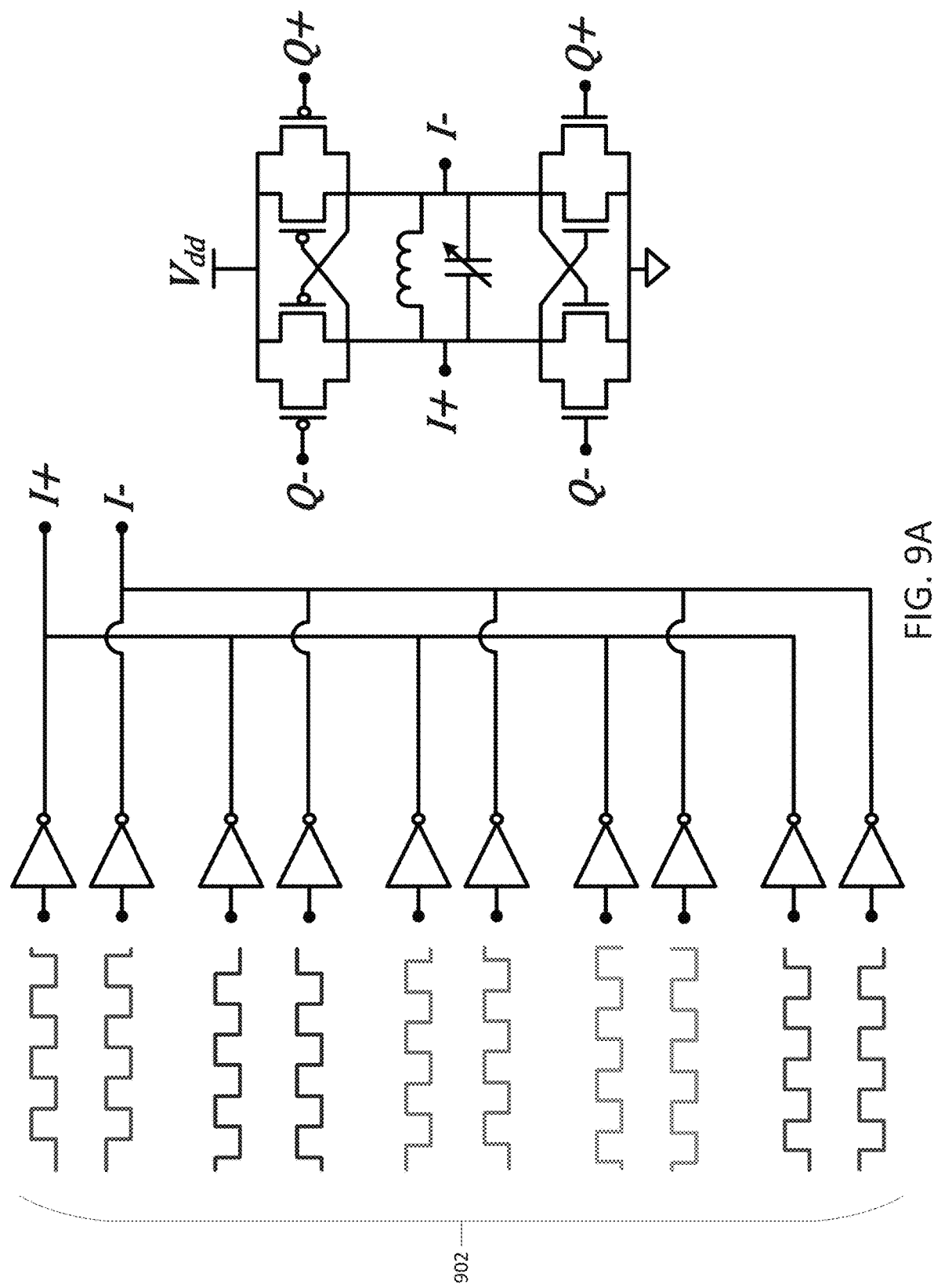
Figure 9C:
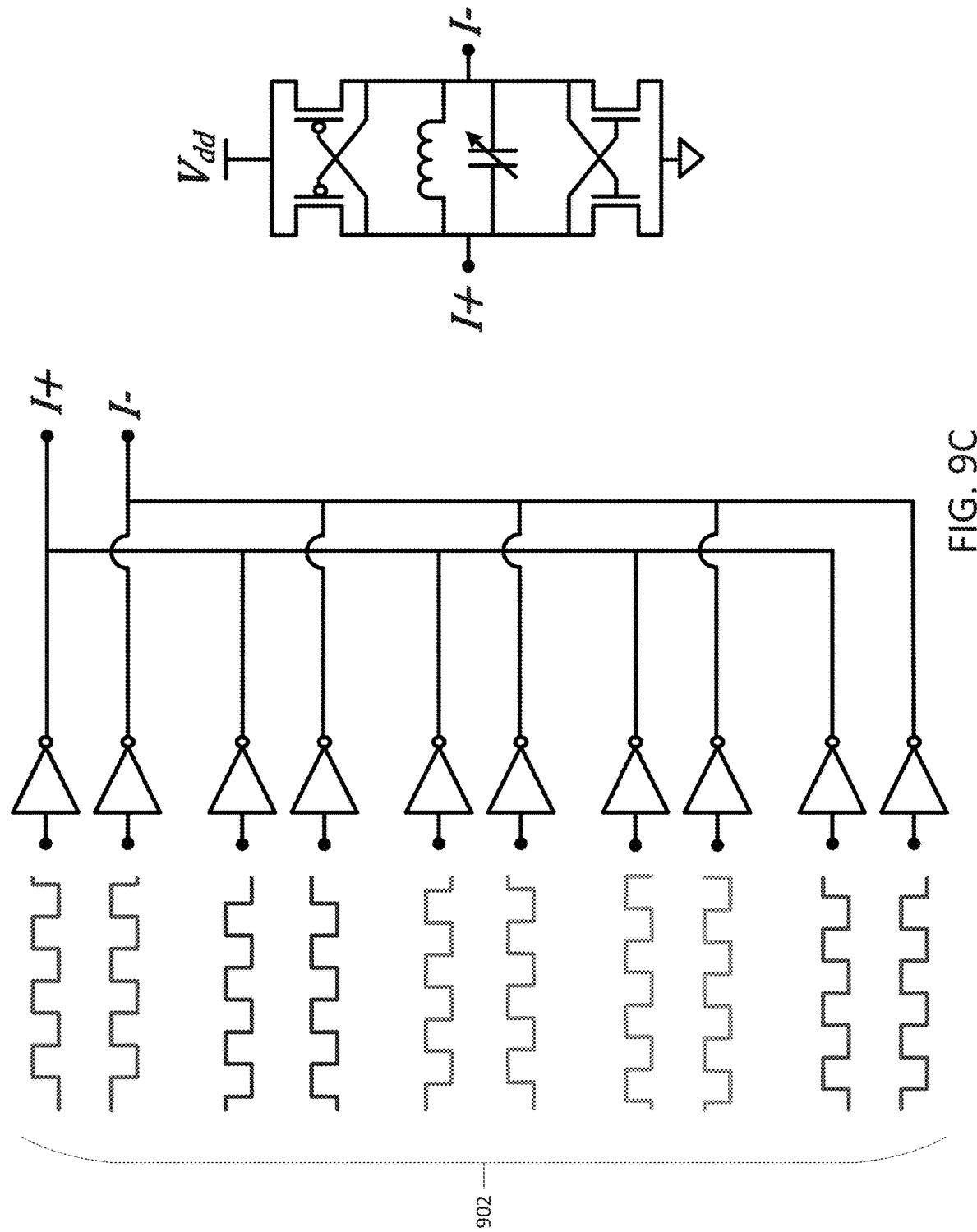

FIGS. 9A-9D illustrate example oscillator circuits that may be used as an oscillator portion of an injection-locked clock multiplier (ILCM), in accordance with aspects of the disclosure. In particular, the oscillator circuits shown in FIGS. 9A-9D include two different oscillator configurations by way of example and not limitation. For instance, and as further discussed below, FIGS. 9A-9B illustrate two portions of an overall quadrature voltage-controlled oscillator (QVCO) implementation, whereas FIGS. 9C-9D illustrate mutually exclusive dual VCO implementations. Again, the example oscillator configurations shown in FIGS. 9A-9D are for ease of explanation, and the aspects described herein may implement any suitable number and/or type of oscillator configurations as part of the ILCM circuitry. For instance, aspects include the oscillators being implemented as a Colpitts oscillator or a transformer feedback oscillator. In any event, as discussed herein, aspects include the oscillators being tuned to a frequency that is equal to or substantially the same as (e.g., with 1%, 5%, 10%, etc.) the intended LO frequency.

In an aspect, the oscillator circuits shown in FIGS. 9A-9B and 9C-9D, respectively, may be implemented as part of the ILCM 306.3, as shown in FIG. 3, and thus may be identified with the oscillator circuits 802, 852, as shown in FIGS. 8A-8B. The oscillator circuits shown in FIGS. 9A-9D may be implemented in accordance with any suitable known oscillator design techniques. For instance, as shown in FIGS. 9A-9D, the QVCO and the dual VCO oscillator circuitry may include transistors, tunable capacitors and/or inductors forming a tank circuit, and a voltage supply Vdd. The tunable components included in the oscillator configurations may be controlled, for instance, via the ILCM tuning control module 1010, as further discussed below with respect to FIG. 10.

Furthermore, each of FIGS. 9A-9D illustrates a quadrature sub-harmonic injection mechanism for coupling the subset of phase-shifted signals generated via the phase configuration circuitry 306.2 (as shown in FIG. 3) via respective I and Q buffered lines to the ILCM 306.3. For instance, FIGS. 9A-9D each illustrate the sub-harmonic signals 902 (for the in-phase components) and the sub-harmonic signals 904 (for the quadrature-phase components) being combined via a parallel inverter arrangement. In the example shown in FIGS. 9A-9D, the sub-harmonic signals 902, 904 may be identified with quadrature 5-phase clock signals having a sub-harmonic frequency of $f_{LO}/5$, as discussed herein (e.g., the multiple-phase shifted signals 102 as shown in FIG. 1, the 5-phase clocks at $f_{LO}/5$ as shown in FIGS. 8A-8B, etc.). In each of FIGS. 9A-9D, the injection mechanism is by way of example and not limitation, and aspects include the injection mechanism being implemented with any suitable configuration to combine these signals for ILCM injection.

Referring now to FIGS. 9A-9B, the example QVCO implementation illustrates a quadrature sub-harmonic injection mechanism for the subset of phase-shifted signals corresponding to the in-phase signal components (in FIG. 9A) and the quadrature-phase signal components (in FIG. 9B) provided by the phase configuration circuitry 306.2, as shown in FIG. 3. As shown in FIG. 9A, the quadrature sub-harmonic injection mechanism combines the phase-shifted signals 902 associated with each of the in-phase components (denoted as I herein or I+ in FIGS. 9A-9D, as well as the 180-degree phase shifted version thereof (denoted as I herein or I− in FIGS. 9A-9D), which are then coupled to the tank circuit input as shown to the right in FIG. 9A. The QVCO implementation shown in FIG. 9A thus uses the injected and combined subset of the phase-shifted signals corresponding to the in-phase signal components to generate the quadrature-phase LO signal components (denoted as Q, Q herein or Q+, Q−, respectively).

Likewise, in FIG. 9B, the quadrature sub-harmonic injection mechanism combines the phase-shifted signals 904 associated with each of the quadrature-phase components Q+ as well as the 180-degree phase shifted version thereof (Q−), which are then coupled to the tank circuit input as shown to the left in FIG. 9B. The QVCO implementation shown in FIG. 9B thus uses the injected and combined subset of the phase-shifted signals corresponding to the quadrature-phase signal components Q+, Q− to generate the in-phase LO signal components I+, I−. In this way, the QVCO implementation as shown in FIGS. 9A-9B may use the combined sub-harmonic phase-shifted signals of each signal component I+, I− Q+, Q−, which are frequency multiplied while suppressing unintended harmonics as discussed herein. This generates quadrature differential LO signals (in this example) as shown in FIG. 3 having a higher frequency multiple of the sub-harmonic frequency $f_{LO}/5$, or $f_{LO}$ in this example, as discussed herein.

Referring now to FIGS. 9C-9D, the example dual VCO implementation illustrates a quadrature sub-harmonic injection mechanism for the subset of phase-shifted signals 902, 904 corresponding to the in-phase signal components I+, I− (in FIG. 9C), and the quadrature-phase components Q, Q+ (in FIG. 9D) provided by the phase configuration circuitry 306.2, as shown in FIG. 3. The quadrature sub-harmonic injection mechanism as shown in FIGS. 9C and 9D may work identically to or in a substantially similar manner as the quadrature sub-harmonic injection mechanism as shown in FIGS. 9A-9B, although this is again by way of example and not limitation. As shown in FIG. 9C, the quadrature sub-harmonic injection mechanism combines the phase-shifted signals 902 associated with the in-phase components I+, I−, which are then coupled to the tank circuit input as shown to the right in FIG. 9C. Likewise, in FIG. 9D, the quadrature sub-harmonic injection mechanism combines the phase-shifted signals 904 associated with the quadrature-phase components Q, Q+, which are then coupled to the tank circuit input as shown to the left in FIG. 9D. In this way, each separate VCO configuration shown in FIGS. 9C and 9D, respectively, may generate half of the overall quadrature differential LO signals (in this example) as shown in FIG. 3.

FIG. 10 illustrates a block diagram of a device in accordance with an aspect of the disclosure. In various aspects, device 1000 may be implemented as any suitable type of device configured to transmit and/or receive wireless signals in accordance with any suitable number and/or type of communication protocols. For instance, the device 1000 may be implemented as a user equipment (UE) such as a mobile phone, tablet, laptop computer, etc. To provide additional examples, the device 1000 may be implemented as an access point or base station. The device 1000 may implement one or more aspects as described herein to facilitate receiving wireless signals in accordance with frequency or band of frequencies, such as mm-Wave frequencies, for example, as further described below.

In an aspect, the device 1000 may include processing circuitry 1002, a memory 1004, and any suitable number N of transceiver chains 1012.1-1012.N, each being coupled to one or more respective antennas 1014.1-1014.N. The components shown in FIG. 10 are provided for ease of explanation, and aspects include device 1000 including additional, less, or alternative components as those shown in FIG. 10. For example, device 1000 may include one or more power sources, display interfaces, peripheral devices, ports, etc. To provide additional examples, the device 1000 may alternatively include one or more transmitter or receiver chains in lieu of one or more of the transceiver chains 1012.1-1012.N, which are capable of transmitting and receiving wireless signals, respectively, via antennas 1014.1-1014.N.

In an aspect, the various components of device 1000 may be identified with functionality further described herein with reference to the generation of LO signals using a common reference or input signal at a sub-harmonic of the LO frequency. For example, the wireless device 1000 may be configured to receive wireless signals via one or more of the antennas 1014.1-1014.N at mm-Wave or other suitable frequencies, and to demodulate and process data contained in the wirelessly received signals via the transceiver chains 1012.1-1012.N. One or more of the transceiver chains 1012.1-1012.N shown in FIG. 10 may be identified with a respective transceiver chain that includes each of the receiver chains as shown, for example, in FIG. 3 (RX-1-RX-K), and each may include a respective LOG unit as shown in FIG. 3 (304.1-304.K). Thus, the transceiver chains 1012.1-1012.N may include additional components (mixers, demodulators, filters, amplifiers, etc.) to generate LO signals from a common PLL operating at a sub-harmonic LO frequency, as discussed herein.

To do so, processor circuitry 1002 may be configured as any suitable number and/or type of computer processors, which may facilitate control of the device 1000 as discussed herein. In some aspects, processor circuitry 1002 may be identified with a baseband processor (or suitable portions thereof) implemented by the device 1000. In other aspects, the processor circuitry 1002 may be identified with one or more processors implemented by the device 1000 that are separate from the baseband processor. In any event, aspects include the processor circuitry 1002 being configured to carry out instructions to perform arithmetical, logical, and/or input/output (I/O) operations, and/or to control the operation of one or more components of the device 1000. For example, the processor circuitry 1002 can include one or more microprocessors, memory registers, buffers, clocks, etc. Moreover, aspects include processor circuitry 1002 communicating with and/or controlling functions associated with the memory 1004 and/or the transceiver chains 1012.1-1012.N. This may include, for example, controlling and/or arbitrating transmit and/or receive functions of the device 1000, performing one or more baseband processing functions (e.g., media access control (MAC), encoding/decoding, modulation/demodulation, data symbol mapping, error correction, etc.).

In an aspect, the memory 1004 stores data and/or instructions such that, when the instructions are executed by the processor circuitry 1002, the processor circuitry 1002 performs the various functions described herein. The memory 1004 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1004 can be non-removable, removable, or a combination of both.

For example, the memory 1004 may be implemented as a non-transitory computer readable medium storing one or more executable instructions such as, for example, logic, algorithms, executable code, etc. As further discussed below, the instructions, logic, code, etc., stored in the memory 1004 are represented by the various modules as shown in FIG. 10, which may enable the aspects disclosed herein to be functionally realized. The modules shown in FIG. 10 are provided for ease of explanation regarding the functional association between hardware and software components. Thus, aspects include the processor circuitry 1002 executing the instructions stored in these respective modules in conjunction with one or more hardware components to perform the various functions associated with the various aspects as further discussed herein.

In an aspect, the executable instructions stored in phase generation module 1006 may facilitate, in conjunction with the processor circuitry 1002, the generation of phases via any suitable type of DLL (e.g., DLLs 400, 500, 600, etc.). For example, the executable instructions stored in phase generation module 1006 may provide the functionality associated with the phase-detector and loop filter 402, as shown in FIG. 4, to manage control of the M-stage controlled delay line 404 for the DLL 400 or DLL 500, depending upon the particular implementation used by the device 1000. To provide another example, the executable instructions stored in phase generation module 1006 may provide the functionality associated with each of the DLL-X core 602 and the DLL Y-core 604, as shown in FIG. 6, to control the phases generated by the two-dimensional DLL 600.

In an aspect, the executable instructions stored in phase control module 1008 may facilitate, in conjunction with the processor circuitry 1002, the selection of phases generated by the DLL implemented by the device 1000. For example, the executable instructions stored in phase control module 1008 may provide the functionality associated with the phase control block 308, as shown in FIG. 3. Thus, phase control module 1008 enables the selection of a subset of phase-shifted input signals generated by the implemented DLL to ensure that the appropriate subset of phase-shifted signals are injected into the ILCM 306.2 to ensure that frequency multiplication occurs, that undesired harmonics are suppressed, and that the LO signals are generated at the appropriate phases for each of transceiver chains 1012.1-1012.N. For example, the phase control module 1008 may facilitate the processing circuitry 1002 to interface with and communicate with the phase configuration circuitry 306.2 and to generate control signals that cause the phase configuration circuitry 306.2 to couple a subset of the superset of the phase-shifted signals generated by the DLL 306.1 to the I and Q buffer lines as shown in FIG. 3.

When implemented, the phase control module 1008 may include instructions regarding how certain frequencies and phases are generated from sub-harmonic frequency phase combinations. For example, executable instructions stored in phase control module 1008 may include a lookup table and/or instructions regarding calculations to be performed to determine a specific set of phases that will produce a desired set of LO signals at a target (multiplied) frequency and with an optional phase shift. For quadrature LO aspects, these instructions allow each respective transceiver chain 1012.1-1012.N to select subsets of DLL-generated phases to produce the desired LO signal components I, $\overline{I}$, Q, and $\overline{Q}$, as shown in FIG. 3, for signal downconversion, for example.

In an aspect, the executable instructions stored in the ILCM tuning control module 1010 may likewise facilitate, in conjunction with the processor circuitry 1002, the processing circuitry 1002 to interface with, communicate, and/or control one or more components of the ILCM 306.3, as shown in FIG. 3. For example, although not shown in the Figures for purposes of brevity, one or more components of the ILCM 306.3 may be electronically tunable. This may include, for instance, one or more components of the tank circuits 804, 854, as shown in FIGS. 8A-8B, or any other suitable components of the ILCM 306.3. Continuing this example, the executable instructions stored in the ILCM tuning control module 1010 may facilitate the generation of tuning control signals that may vary the inductance, capacitance, resistance, etc., of components implemented by the ILCM 306.3.

When implemented, the ILCM tuning control module 1010 may include instructions regarding how to tune the ILCM 306.3 for certain frequencies of operation of the device 1000, for injected multi-phase signals having a specific frequency of range of frequencies, etc. For example, executable instructions stored in the ILCM tuning control module 1010 may include a lookup table and/or instructions regarding calculations to be performed to determine a specific combination of tuning values (e.g., inductance, capacitance, resistance, etc.) that will dynamically adapt to a change in the injected multi-phase signal frequency.

Section II—Local Oscillator (LO) Generation for Carrier Aggregation in Phased Array Front Ends Aspects described in this Section generally relate to transceivers and, more particularly, to transceiver designs implementing a single phase-locked loop (PLL) LO generation for phased array front ends.

RF transceivers require local oscillators (LOs) at or close to channel frequencies for mixing. For example, one or more LO signals need to be generated at each carrier frequency or channel of interest, and each transceiver chain may utilize a separate set of LO signals for phased array applications. Moreover, inter-band carrier aggregation (CA), which requires two LO frequencies simultaneously, increases the number of LO signals that are implemented by phased array transceiver designs, further complicating the challenges associated with LO signal generation and distribution. For instance, for digital phased arrays, the number of LO signals can exceed 16 or more, which leads to the LO distribution consuming a large percentage of system power. As a result, generating and distributing high frequency LO signals (e.g., at mm-Wave frequencies) in an on-chip implementation is non-trivial and requires significant power. Therefore, generating the required LO signals for such transceivers is a complex, expensive, and time-consuming task.

Many RF transceiver designs implement quadrature multi-phase LOs for use in phased array applications. For mm-Wave phased array applications, phase noise can be a dominant contributor to error vector magnitude (EVM) degradation, and thus transceiver designs need to generate multiple spectrally pure (quadrature) LO's at mm-Wave frequencies while maintaining a low power consumption. As noted above, however, conventional mm-Wave transceivers utilize a LO distribution scheme that consumes a great deal of power.

As referenced further in this and the other Sections, the term "mm-Wave frequency," which the aspects described in this Section as well as others may operate, may include, for example, frequencies and frequency bands above 20 GHz, 24 GHz, 28 GHz, etc., up to an upper frequency. For instance, mm-Wave frequency bands may include frequencies ranging from 20 GHz to 300 GHz, from 24 GHz to 300 GHz, etc. This may include, for instance, the various bands known to be associated with or otherwise referred to as mm-Wave frequency bands such as 24 GHz, 28 GHz, 37 GHz, 39 GHz, 40 GHz, 47 GHz, 60 GHz, etc.

Typical solutions to generate these signals include the use of multiple high performance, fractional phased-locked loops (PLLs). However, for digital phased arrays in particular, a large number of mm-wave LO frequency distribution networks are required. Therefore, these conventional solutions consume a large amount of power with a large area overhead.

Therefore, to address these issues, the aspects described herein combine fractional dividers, digital to time converters (DTC), and frequency multipliers to generate several mm-Wave LO signals at different respective frequencies. As further discussed below, this may be performed using one or several dies, or "chips." Advantageously, these aspects only require a single low to medium frequency (RF) reference signal generator (i.e., a common frequency synthesizer), which is easier to distribute than higher mm-Wave signals. Furthermore, the spectral purity of the LO signal may be controlled by the reference signal generator, and therefore the high frequency LO generation aspects described herein introduce only a small amount of additive noise in operation.

The aspects described herein also facilitate LO signal distribution at a lower (e.g., RF) frequency, which consumes much less power compared to the distribution of higher, mm-Wave LO signals and requires much less design effort. Furthermore, the aspects described herein are scalable to a large number of transceiver chains, which is particularly useful for digital beamforming array operation, and may optionally be distributed off chip using less expensive, lower frequency cabling or board traces. By distributing the LO signals at lower frequencies in this way, the aspects described herein obviate the design of a full PLL for generating multiple frequency signals. Therefore, the aspects described herein require less die area and consume less power compared to typical phased array designs that use PLLs for higher frequency LO signal generation and distribution.

As discussed in further detail below, aspects include distributing a low to medium frequency reference clock generated from a single frequency synthesizer and implementing frequency multiplication directly at each mixer. The aspects further described herein may include additional variations. One of the primary applications that utilize the aspects described herein includes the use of a large array of mixers in a digital beamformer. Another primary application includes a two-die solution with intermediate (IF) LO generation and mm-Wave LO generation separated by a distance within the overall system. Furthermore, the aspects described herein may be particularly useful for carrier aggregation (CA), as CA requires the simultaneous generation of two or more LO frequencies that are not integer related (i.e., not proportional via an integer scaling). Thus, to support these various configurations, aspects include the arrangement and/or addition of various blocks that may include fractional dividers, digital to time converters (DTCs), and edge combination frequency multipliers.

Figure 11A:
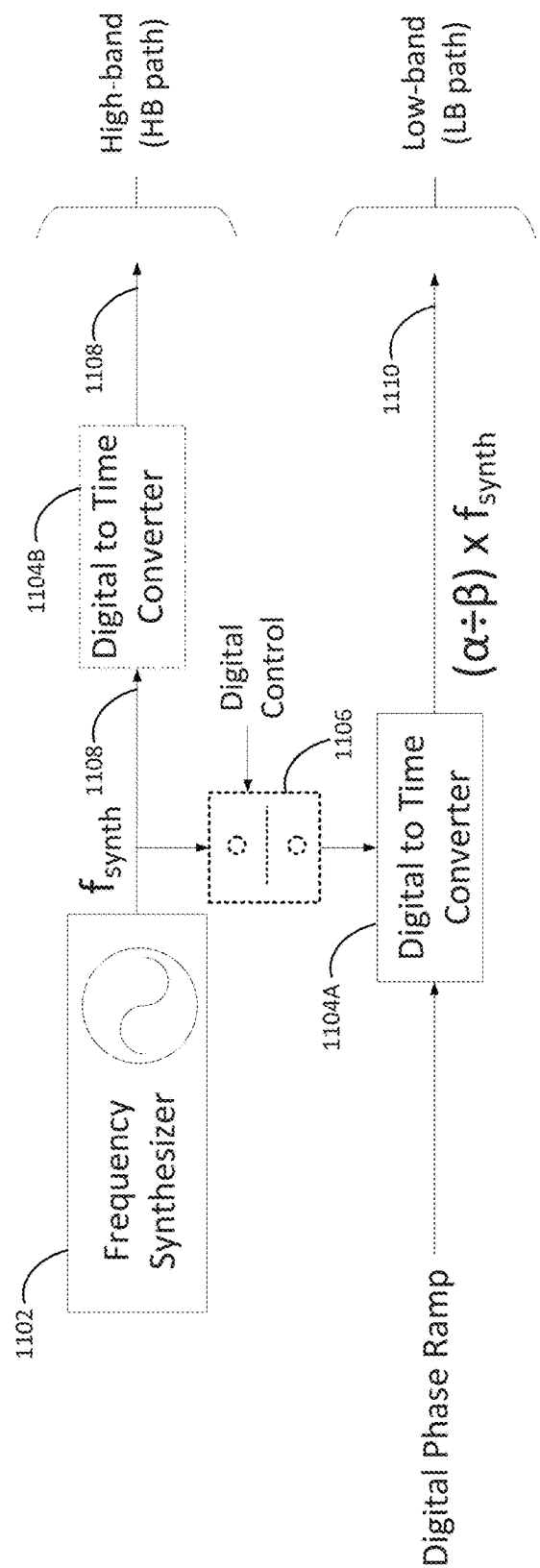
FIGS. 11A-11C illustrate an example of a transceiver architecture implementing a single die digital beamformer using multiple frequency bands of operation, in accordance with an aspect of the disclosure.
Figure 11B:
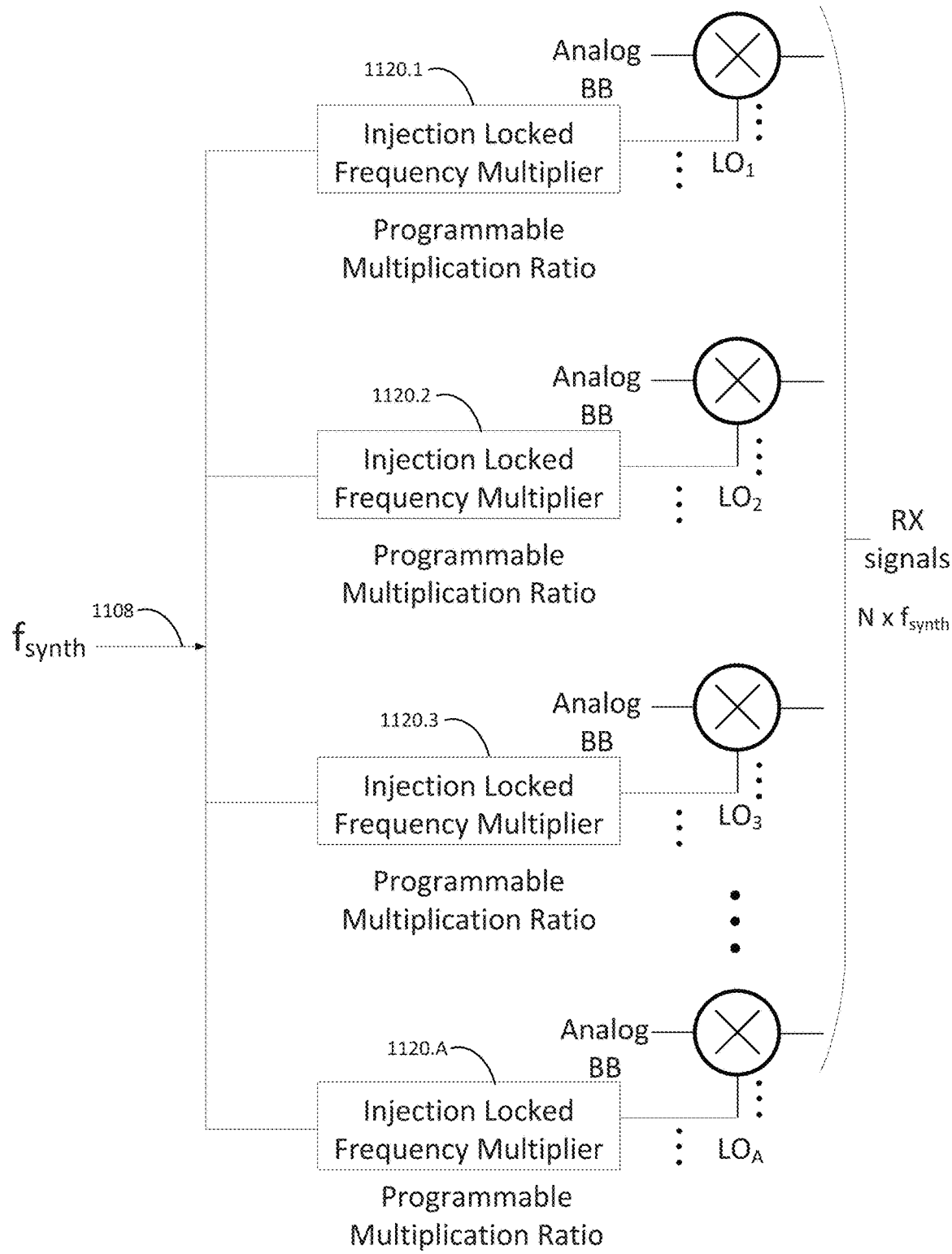
Figure 11C:
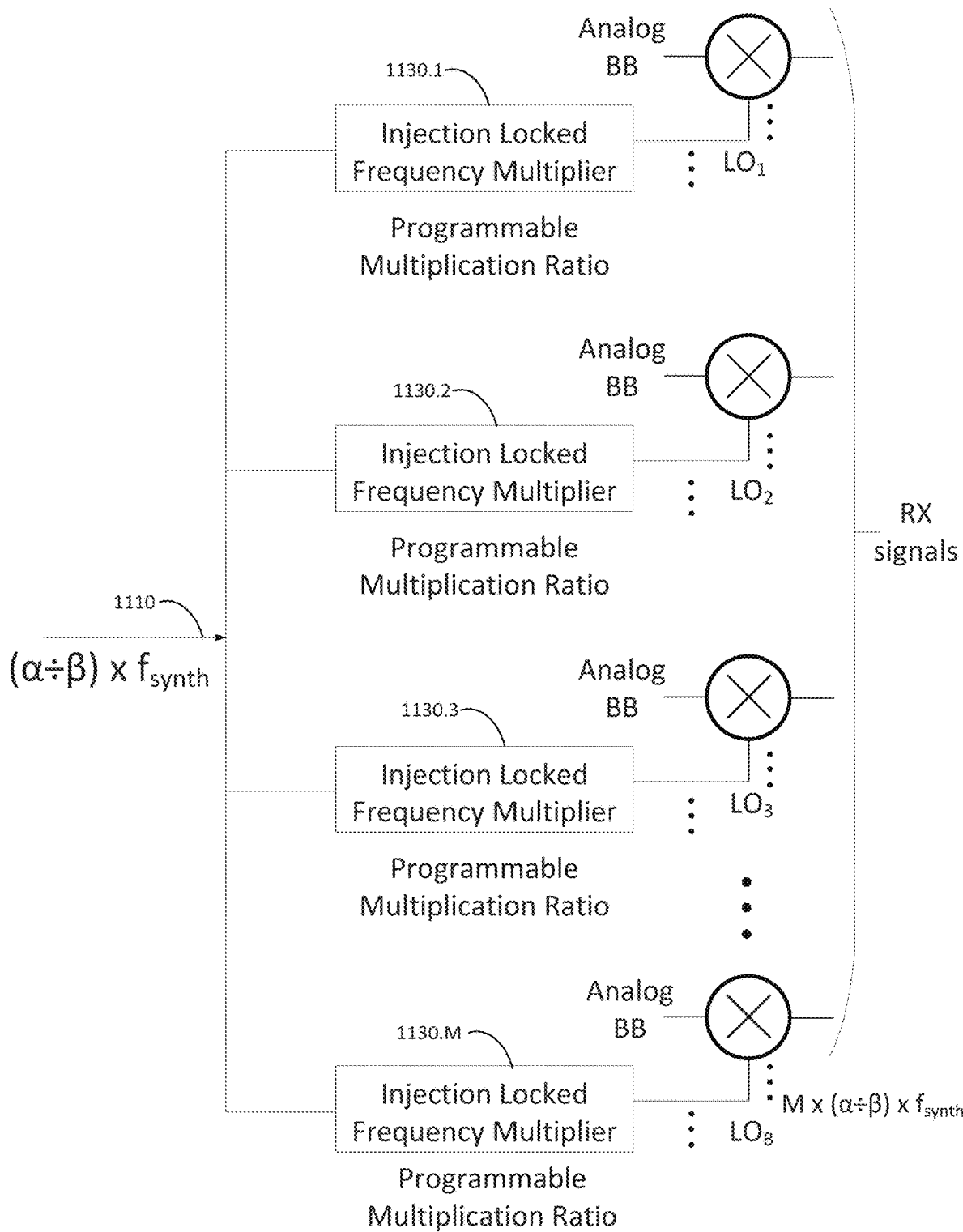

FIGS. 11A-11C illustrate an example of a transceiver architecture implementing a single die digital beamformer using multiple frequency bands of operation, in accordance with an aspect of the disclosure. As shown in FIG. 11A, the transceiver architecture 1100 includes a frequency synthesizer 1102 configured to generate a reference signal 1108 having a frequency represented as $f_{synth}$. In an aspect, the frequency synthesizer 1102 may be implemented using any suitable and/or known circuit components to generate the reference signal 1108, which may include a PLL (e.g., a digital PLL) configured to generate low level of phase noise. Moreover, aspects include the transceiver architecture 1100 having any suitable number of transceiver chains, with each transceiver chain being coupled to a respective set (e.g., one or more) of antenna elements associated with a phased array front end. Aspects include the frequency synthesizer 1102 being a common reference frequency generator that is utilized by each of the transceiver chains.

In the various aspects described herein, a common frequency synthesizer (e.g., frequency synthesizers, 1102, 1202, 1302, etc.) may be implemented within various transceiver architectures that utilize different types of conversion techniques. For instance, the transceiver architecture 1100 as shown in FIGS. 11A-11C uses direct conversion (i.e., homodyne). By using a direct conversion technique, the examples transceiver architecture 1100 as shown in FIGS. 11A-11C may advantageously be implemented as part of a single die or chip. In other words, the transceiver circuitry and the phased array front end circuitry may be aggregated onto a single die. However, the transceiver architectures 1200, 1300 as shown in FIGS. 12A-12B and 13A-13C and further discussed herein, use super-heterodyne conversion. For the transceiver architectures 1200, 1300, as further discussed herein, the transceiver circuitry and the phased array front end circuitry may advantageously leverage the use of intermediate frequencies (IF) to carry converted IF signals across a cable or trace to a separate die that is associated with the phased array front end.

In any event, the aspects described herein utilize a single frequency synthesizer that generates a reference signal at a lower frequency $f_{synth}$ compared to that of the transmitted or received signals. For instance, the reference frequency signal may have a frequency $f_{synth}$ on the order of a few GHz, whereas a transmitted, up-converted signal may be several times this frequency, such as frequencies associated with mm-Wave bands, for example. In doing so, the transceiver architecture aspects described herein simplify the design of the PLL circuitry implemented via the frequency synthesizer and allow for lower power consumption.

With continued reference to FIG. 11A, to utilize the lower frequency reference signal, the transceiver architecture 1100 may implement different component configurations based upon the level of frequency control and/or the amount of granularity desired with regards to the frequency scaling of the reference signal 1108. In various aspects, these optional components may, when implemented, be implemented alone or in combination with one another. For instance, aspects include the reference signal 1108 being fed into a digital to time converter (DTC) 1104A either directly or via the optional frequency divider circuitry 1106. The optional frequency divider circuitry 1106 may be implemented when additional control or granularity is desired to provide a frequency-divided reference signal having a frequency that a fraction of $f_{synth}$. Thus, aspects include the optional frequency divider circuitry divider circuitry 1106 being implemented via any suitable and/or known circuit components configured to perform frequency division of the reference signal 1108. For ease of explanation, this frequency division factor may be referred to herein as γ, such that the frequency of the signal fed to the DTC 1104A, when the optional frequency divider circuitry divider circuitry 1106 is implemented, is $$\left(\frac{fsynth}{\gamma}\right).$$

In various aspects, the DTC 1104A is configured to output a fractionally-multiplied reference signal 1110 having a frequency that is scaled in a non-integer manner to the frequency $f_{synth}$ of the reference signal 1108. As further discussed herein, the use of a fractional multiplicative frequency relationship between the reference signal 1108 and the fractionally-multiplied reference signal 1110 may be particularly useful for transceiver applications in which separate carrier frequencies are used, which may have a non-integer scaled relationship with respect to one another (e.g., for carrier aggregation applications used in accordance with mm-Wave frequency bands).

Aspects include the DTC 1104A having any suitable configuration, which may be implemented using any suitable and/or known circuit components configured to translate a received digital phase ramp to a fractional frequency shift. For example, in the case when the optional frequency divider circuitry divider circuitry 1106 is not used, aspects include the DTC 1104A generating the fractionally-multiplied reference signal 1110 having a ratio represented as $$fsynth\left(\frac{\alpha}{\beta}\right).$$

Aspects include the DTC 1104A preforming fractional frequency multiplication of the reference signal 1108 up to a scaling factor of 1.0, which would result in the reference signal 1108 and the fractionally-multiplied reference signal 1110 having the same frequency. As another example, in the case when the optional frequency divider circuitry 1106 is used, aspects include the DTC 1104A generating the fractionally-multiplied reference signal 1110 having a ratio represented as $$\frac{fsynth}{\gamma}\left(\frac{\alpha}{\beta}\right).$$

Moreover, although illustrated in FIG. 11A as separate components, aspects include the optional frequency divider circuitry 1106 and the DTC 1104A being combined as a single circuit component. For instance, the optional frequency divider circuitry 1106 may output signals in a quadrature phase relationship with one another, and these outputs from the optional frequency divider circuitry 1106 may be utilized to reduce the number of stages in the delay line implemented via the DTC 1104A.

The transceiver architecture 1100 may optionally include another DTC 1104B configured in a similar or identical manner as the DTC 1104A, although the DTCs 1104A, 1104B may be configured to independently provide frequency division in accordance with respective division values. Thus, the fractionally-multiplied reference signal provided at the low-band path as shown in FIG. 11A and further discussed herein may be the same frequency as the reference signal 1108 or a lower frequency that is some fraction thereof. Additionally or alternatively, the reference signal 1108 that is provided at the high-band path may be the frequency $f_{synth}$ of the reference signal 1108 or a lower frequency that is some fraction thereof, e.g., via the use of the DTC 1104B.

Aspects include the transceiver architecture 1100 providing the reference signal 1108 and the fractionally-multiplied reference signal 1110 via the high-band and low-band path, respectively, with respective frequencies that may be dynamically adjusted and have a non-integer relationship with one another. For example, the DTCs 1104A, 1104B may provide their respective fractional frequency multiplications in accordance with a received digital phase ramp value. Although not shown for the optional DTC 1104B, each of the DTCs 1104A, 1104B may operate in a similar manner in this regard. Thus, DTC 1104A and/or DTC 1104B may receive (e.g., via one or more control lines) digital values representing respective digital phase ramps that produce a desired fractional frequency multiplication. These digital phase ramp values may be generated and transmitted via any suitable type of processor circuitry. The processor control of the DTC 1104A and/or DTC 1104B may be implemented, for instance, via the execution of stored instructions by one or more hardware processors as further discussed herein. Likewise, the optional frequency divider circuitry 1106 may receive digital control signals via one or more processor components to vary the frequency division factor applied to the frequency $f_{synth}$ of the reference signal 1108.

Regardless of whether the optional frequency divider 1106 is implemented, the transceiver architecture aspects described herein enable a low to medium frequency to be distributed over each of the phased array elements within the transceiver architecture. Moreover, the fractional ratio introduced by the optional frequency divider 1106 and/or the DTCs 1104A, 1104B do not need to be integer ratios of one another in accordance with the aspects described herein. This may be particularly useful, for instance, with regards to the fine channelization in cellular band applications (e.g., <1 MHz), as well as for CA applications.

Referring now to FIGS. 11B-11C, which illustrate a continuation of the high-band (HB) and low-band (LB) paths, respectively, as shown in FIG. 11A, the transceiver architecture 1100 uses the reference signal 1108 and the fractionally-multiplied reference signal 1110 to generate any suitable number of LO signals. In particular, the transceiver architecture 1100 as shown in FIG. 11B receives the reference signal 1108 as an input and generates any suitable number of HB LO signals via the injection locked frequency multipliers (ILFMs) 1120.1-1120.A. Additionally, as shown in FIG. 11C, the transceiver architecture 1100 receives the fractionally-multiplied reference signal 1110 as input and generates any suitable number of LB LO signals via the ILFMs 1130.1-1130.B.

In various aspects, the IFLMs 1120, 1130 may be implemented using any suitable type of ILFM circuitry, which may include known ILFM configurations, for example. In other aspects, the IFLMs 1120, 1130 may be implemented using the ILCM 306.3 discussed herein with reference to FIGS. 1-10, which may be implemented using a serial or parallel injection architecture. For example, the frequency synthesizers 1102, as well as the frequency synthesizers 1202, 1302 as discussed further below, may be identified with the PLL 302 as shown in FIG. 3. Continuing this example, the transceiver architecture 1100 may be identified with a portion of the transceiver design 300 as shown in FIG. 3. For instance, the HB path as shown in FIG. 11B may be associated with any suitable number of transceiver chains, with four shown in FIG. 11B. Each transceiver chain may include a respective ILFM 1120.1-1120.A, and each IFLM 1120 may be identified with one of the LOG units 304 as shown in FIG. 3. Furthermore, the LB path as shown in FIG. 11C may be associated with any suitable number of transceiver chains, with four shown in FIG. 11C. Each transceiver chain may include a respective ILFM 1130.1-1130.B, and each IFLM 1130 may be identified with one of the LOG units 304 as shown in FIG. 3.

As further discussed herein, the ILFMs implemented in the various aspects with respect to FIGS. 11A-11C as well as those shown and described in further detail below with respect to FIGS. 12A-12B and 13A-13C (e.g., IFLMs 1120, 1130, 1205, 1220, 1305A-1305B, 1352, 1356, etc.) may be identified with the ILCM 306.3 as discussed above with respect to FIGS. 1-10. Moreover, as further discussed herein, aspects include further modifying these ILFMs to incorporate an optional DTC (e.g., IFLM 1220 and DTC 1210, as shown in FIG. 12B). In accordance with such aspects, the DTC may be designed on a common die or otherwise configured with a respective IFLM as part of a single integrated design, which may be identified with a portion of one of the LOG units 300 as shown in FIG. 3. In particular, aspects include implementing the DLL 306.1 (which may be implemented as one of the delay lines 400, 500, 600 as shown in FIGS. 4-6) to generate multiple phase-shifted signals for both digital time control and for use in an edge-combining multiplier (e.g., such as one of the architectures of the ILCM 306.3 as discussed above with respect to FIGS. 3, 8A, and 8B).

FIGS. 11B-11C illustrate each of the ILCMs 1120, 1130 generating a respective set of frequency multiplied signals that are coupled to respective mixers. In an aspect, the frequency-multiplied signals generated by each of the ILCMs 1120, 1130 may correspond to one or more LO signals generated by the ILCM 306.3 as discussed herein with reference to FIG. 3. In various aspects, as discussed above, the LO signals generated by the ILCMs 1120, 1130 may be a single LO signal or a set of quadrature LO signals. In the case when a set of quadrature LO signals are generated, aspects include each mixer shown in FIGS. 11B-11C actually constituting a set of mixers, with each mixer receiving its own I, $\bar{I}$, Q, and $\bar{Q}$ signal component and an accompanying quadrature LO signal that matches each received signal component. In other words, aspects include each transceiver chain associated with the HB path as shown in FIG. 11B and the LB path as shown in FIG. 11C generating its own set of higher frequency quadrature LO signals to downconvert received signals directly to baseband. However, the transceiver aspects are not limited in this regard, and aspects include the transceiver architecture 1100 generating any suitable number of LO signals per transceiver chain.

Aspects include the ILFMs 1120, 1130 associated with the HB and the LB paths as shown in FIGS. 11B and 11C, respectively, being dynamically adjusted with regards to the frequency multiplication of the LO signals input to each mixer. The amount of frequency multiplication may be controlled and adjusted via appropriate processor circuitry, as discussed herein. For example, for aspects that implement ILFMs 1120, 1130 as the ILCM 306.3, the frequency multiplication of the input signal to each mixer may be controlled via the phase control block 308 to select specific sets of phase-shifted versions of the reference signal 1108 (for the HB path) and to select specific sets of phase-shifted versions of the fractionally-multiplied reference signal 1110 (for the LB path). This type of frequency multiplication, which was discussed in the previous Section with regards to FIGS. 1-10 may be referred to herein as edge combination frequency multiplication.

Thus, as shown in FIG. 11B, each transceiver chain within the HB path may down-convert signals (the RX signals). The ILCMs 1120 may provide an integer frequency multiplication of the frequency $f_{synth}$ of the input signal 1108 by an integer factor to substantially match the frequency of the RX signals in the HB path to facilitate direct downconversion. As an example, the RX signals may have a frequency that is associated with a mm-Wave band frequency. Moreover, as shown in FIG. 11C, each transceiver chain within the LB path may down-convert the RX signals, which may also have a frequency that is associated with a mm-Wave band frequency, for example. Thus, the ILCMs 1130 may provide an integer frequency multiplication of the frequency $$fsynth\left(\frac{\alpha}{\beta}\right)\left(\text{or } \frac{fsynth}{\gamma}\left(\frac{\alpha}{\beta}\right)\right),$$

as the case may be) of the fractionally-multiplied reference signal 1110 to substantially match the frequency of the RX signals in the LB path. In an aspect, the frequency division factor $\gamma$, as well as the variables $\alpha$ and $\beta$ that are used to establish the fractional frequency multiplication factors, may be defined as any suitable integer number. As a result, the resulting fractional frequency multiplication factor (e.g., $(\alpha/\beta)$ (or $(\alpha/\beta)(1/\gamma)$) may be a rational number.

In other words, a frequency multiple is used at each ILFM 1120, 1130 implemented within each of the HB and the LB paths to multiply the received reference signal frequency by an integer ratio up to a desired, higher frequency (e.g., a mm-wave frequency). As noted above, because each transceiver chain within the transceiver architecture 100 may generate its own set of LO signals, aspects include the integer multiplication performed by each of the ILFMs 1120, 1130 being programmable and/or dynamically adjusted to allow each transceiver chain to independently adapt to support different bands. Moreover, because of the use of the programmable ratios as described with reference to FIG. 11A, aspects include setting the frequency of the reference signal 1108 and the fractionally-multiplied reference signal 1110 to any suitable value below that of the frequency synthesizer. Aspects include these frequencies being set, for example, using a priori knowledge of other communication channels used for cellular or connectivity and/or using measured feedback during operation. This may facilitate an adaptive use of frequency that avoids interference and opens up preferred frequencies for use without a complex frequency plan.

Figure 12A:
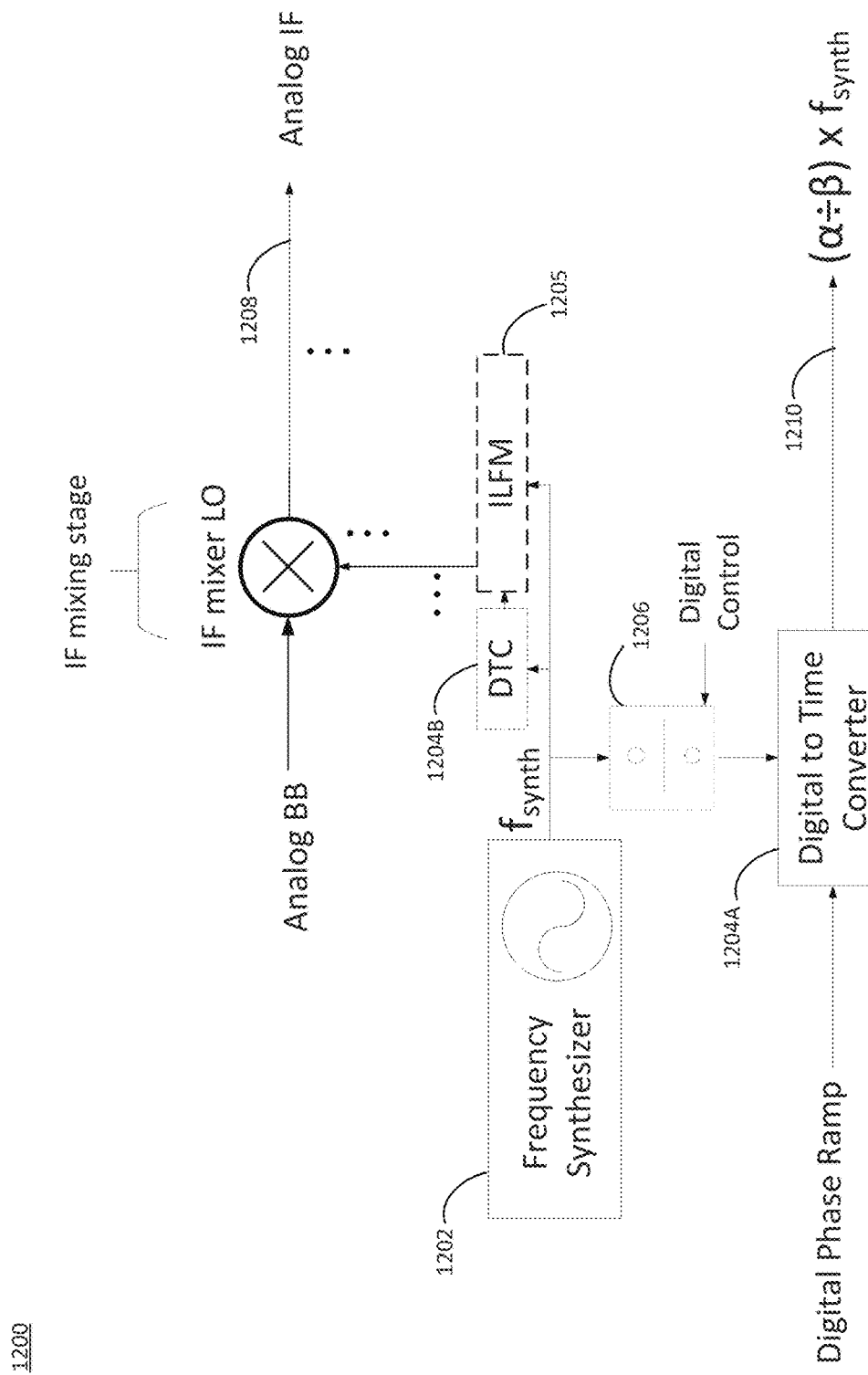
FIGS. 12A-12B illustrate an example of a transceiver architecture implementing a multiple die digital beamformer using a single frequency band of operation, in accordance with an aspect of the disclosure.
Figure 12B:
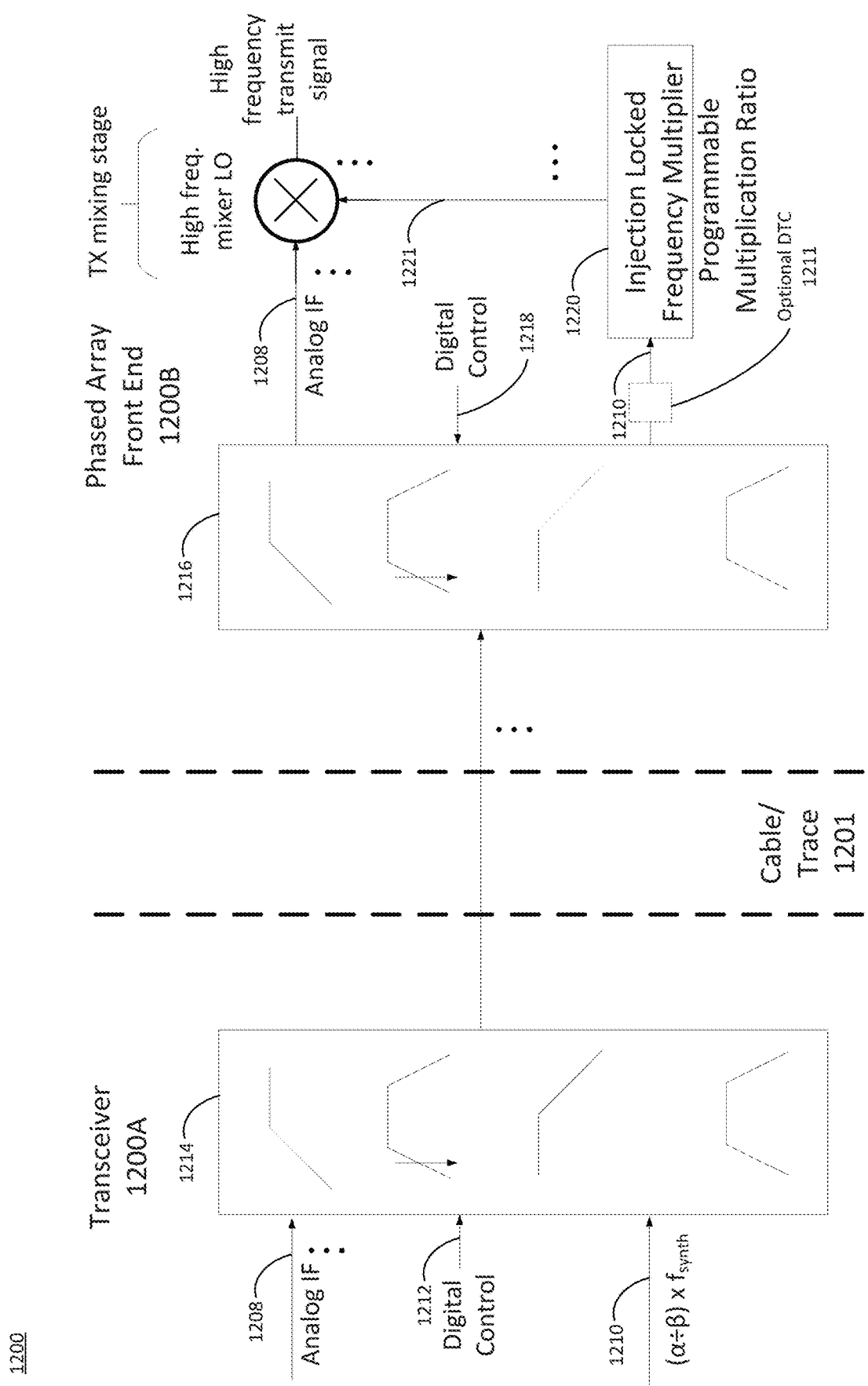

FIGS. 12A-12B illustrate an example of a transceiver architecture implementing a multiple die digital beamformer using a single frequency band of operation, in accordance with an aspect of the disclosure. Again, the transceiver architecture 1200 as shown in FIGS. 12A-12B uses super-heterodyne conversion. Moreover, unlike the transceiver architecture 1100, the transceiver architecture 1200 as shown in FIGS. 12A-12B uses a multi-die implementation, with the transceiver circuitry and the phased array front end circuitry being implemented on separate dies. Furthermore, the example transceiver architectures 1200, 1300 as discussed below illustrate up-conversion and transmit paths within a transceiver chain versus the down-conversion and receive paths discussed above with respect to the transceiver architecture 1100. Of course, the aspects described herein may be equally applicable to either down-conversion/receive paths or up-conversion/transmit paths, with the processes described herein being reversible.

In an aspect, the portion of the transceiver architecture 1200 as shown in FIG. 12A has a similar structure as, and uses similar components as, the portion of the transceiver architecture 1100 as shown in FIG. 11A. Therefore, only differences between these transceiver portions will be further discussed herein. For instance, the transceiver architecture 1200 as shown in FIG. 12A, like the transceiver architecture 1100 as shown in FIG. 11A, uses a common frequency synthesizer 1202, optional frequency divider circuitry 1206, and one or more DTCs 1204A-B to generate a fractional frequency multiplication of the reference signal generated via the frequency synthesizer 1202 and/or a further frequency divided version of the reference signal if the optional frequency divider circuitry 1206 is utilized.

Moreover, the portion of the transceiver architecture 1200 as shown in FIG. 12A may additionally include DTC 1204B, which may be coupled to the input of the mixer circuitry as shown to provide additional flexibility for the desired frequency of the up-converted IF signal 1208. Additionally or alternatively, the portion of the transceiver architecture 1200 as shown in FIG. 12A may include an optional IFLM 1205 coupled to the input of the mixer circuitry as shown to provide further flexibility for the desired frequency of the up-converted IF signals 1208.

The optional IFLM 1205 may be implemented using any suitable type of circuitry configured to provide integer frequency multiplication of the signal generated via the frequency synthesizer 1202. In some aspects, the optional IFLM 1205 may be implemented using known circuit components and/or a known configuration to facilitate this functionality. In other aspects, the optional IFLM 1205 may be implemented as the IFCM 306.3, as discussed above for the ILFMs 1120, 1130 shown in FIGS. 11B-11C. In any event, when implemented, the ILFM 1205 may provide a frequency multiplication value that is adjusted via processor control in a dynamic fashion. Furthermore, as discussed herein with reference to FIG. 11C, the IFLM 1205 may generate any suitable number of LO signals. In an aspect, the IF mixing stages (e.g., up-conversion and down-conversion mixing stages between baseband (BB) and the intermediate frequency (IF)) may utilize quadrature LO signals, whereas the additional up-conversation and down-conversion stages in the RF mixing stage (i.e., up- and down-conversion between the IF frequency and other, higher frequencies) do not require quadrature LO signals (e.g., in the TX mixing stage providing up-conversion from IF to the transmission frequency as shown in FIG. 12B or a down-conversion RX mixing stage from the transmission frequency to the IF frequency that is not shown). In any event, when quadrature LO signals are generated (e.g., by the ILCM 1205), aspects include the IF mixing stage as shown in FIG. 12A actually constituting a set of mixers, with each mixer generating an up-converted analog IF signal from the analog baseband signal that matches the phase of the I, $\bar{I}$, Q, and $\bar{Q}$ signal component. Thus, the analog IF signal as shown in FIG. 12A may constitute a set of quadrature analog IF signals, in accordance with such aspects.

In various aspects, any combination of the optional frequency divider circuitry 1206, the DTCs 1204A-B, and/or the IFLM 1205 may be implemented. In some aspects, more than one of these components may be present in a transceiver implementation but selectively implemented to facilitate greater control over the frequency of the analog IF signal 1208. For instance, the DTC 1204B and the IFLM 1205 may both be implemented in a particular design in series with one another, whereas other implementations may include with each one being selectively activated or coupled to the mixer LO input. In the latter case, the DTC 1204B may be used to fractionally multiply (i.e., divide) the frequency of the reference signal generated by the frequency synthesizer 1202 that is used as the LO signal to the IF mixer, whereas the IFLM 1205 may be activated when frequency multiplication is desired. Regardless of the components that are implemented, aspects include the transceiver architecture 1200 generating up-converted analog IF reference signal 1208 and a fractionally-multiplied reference signal 1210.

Again, to limit the number of frequency synthesizers to reduce power, area, cross-talk, and design complexity, the frequency synthesizer 1202 may be common to several transceiver chains and a digital interface may be implemented (not shown) to dynamically adjust the programmable ratios provided by the DTCs 1204A, 1204B, the frequency divider circuitry 1206, the IFLM 1205, etc., Doing so may dynamically adjust the frequency of the up-converted analog IF reference signal 1208 and the fractionally-multiplied reference signal 1210.

As shown in FIG. 12B, the transceiver architecture 1200 spans multiple dies and interfaces, with one portion (transceiver 1200A) being associated with one die, and another transceiver portion (phased array front end 1200B) being associated with a different die. Because the transceiver architecture 1200 implements a super-heterodyne system, the die associated with the transceiver portion 1200A and the die associated with the phased array front end portion 1200B each includes an IF interface to facilitate distribution of the up-converted analog IF reference signal 1208 and the fractionally-multiplied reference signal 1210 between each die. As shown in FIG. 12B, this IF interface may include, for instance, one or more cables, traces, etc.

Because the up-converted analog IF reference signal 1208 and the fractionally-multiplied reference signal 1210 are lower frequency signals compared to the transmitted signals, the IF interface may be implemented with lower cost components that have a lower loss and are easier to design than higher-frequency solutions. Moreover, as shown in FIG. 12B, to limit connections between the dies, aspects include multiplexing the signals onto a single cable or trace using the multiplexing block 1214 and de-multiplexing block 1216. Although referred to herein as multiplexers and de-multiplexers, the multiplexing block 1214 and de-multiplexing block 1216 may be implemented with any suitable type of known components configured to combine and separate signals, respectively.

For instance, the multiplexing block 1214 and the de-multiplexing block 1216 may be implemented with any number of electronically tunable components that are controlled via one or more processors via the digital control signals 1212, 1218. In various aspects, the multiplexing block 1214 and de-multiplexing block 1216 may be implemented with any suitable type of components to facilitate one or more of a tunable low-pass filter, a tunable band-stop filter, a tunable high-pass filter, a tunable band-pass filter, etc., which may be tuned and frequency-shifted depending upon the particular band of IF signals that are to be combined onto and extracted from the IF interface 1201. For example, because the reference signal generated via the frequency synthesizer 1202 is typically a continuous wave (CW) signal, the fractionally-multiplied reference signal 1210 may also be a CW signal, and the de-multiplexer 1216 may be tuned to remove the fractionally-multiplied reference signal 1210 from the analog IF signals passed over the IF interface 1201 to the phased array front end 1200B using, for instance, a deep and narrow tunable notch filter profile.

With continued reference to FIG. 12B, aspects include the phased array front end 1200B separating the signals passed over the IF interface 1201 into the up-converted analog IF reference signal 1208 and the fractionally-multiplied reference signal 1210. Again, the fractionally-multiplied reference signal 1210 may include a fractional frequency shift compared to the frequency $f_{synth}$ of the reference signal generated by the frequency synthesizer 1202. The phased array front end 1200B may additionally include an ILFM 1220, which may be substantially similar to or identical to the IFLM 1205, and which may also be implemented as the ILCM 306.3 as discussed herein. Therefore, additional details of the ILFM 1220 are not provided for purposes of brevity.

Aspects include the ILFM 1220 receiving the fractionally-multiplied reference signal 1210 as shown in FIG. 12B, and frequency multiplying the fractionally-multiplied reference signal 1210 using an integer frequency multiplier to generate a multiplied, higher frequency LO signal 1221. The phased array front end 1200B may optionally include a DTC 1211 to facilitate greater control and tunability of the high frequency transmit signal, which may operate in a similar or identical manner as the DTCs 1204A-B to provide a fractional frequency shift of the already fractionally-multiplied reference signal 1210.

Furthermore, although not shown in FIG. 12B for purposes of brevity, aspects include the ILFM 1220 generating any suitable number of high frequency LO signals 1221 from the fractionally-multiplied reference signal 1210 (which may be further fractionally frequency shifted via the optional DTC 1211), which may be distributed to any suitable number of mixers within the TX mixing stage as shown, with each mixer receiving the up-converted analog IF reference signal 1208 as an input to generate a higher frequency signal for transmission. For example, because the ILFM 1220 is implemented within the final mixing stage of the super heterodyne architecture, the ILFM 1220 may provide a single phase LO signal versus a multi-phase LO signal (i.e., the BB to IF interface requires quadrature modulation but the IF to RF interface only requires a frequency translation). These higher frequency transmission signals may thus be generated at any suitable frequency based upon the fractional multiplication performed in the transceiver 1200A (and optionally in the phased array front end 1200B is the DTC 1211 is implemented) and the integer multiplication performed via the phased array front end 1200B (e.g., via the ILFM 1220). For example, the high frequency transmit signal may have a frequency within the mm-Wave frequency bands.

Figure 13A:
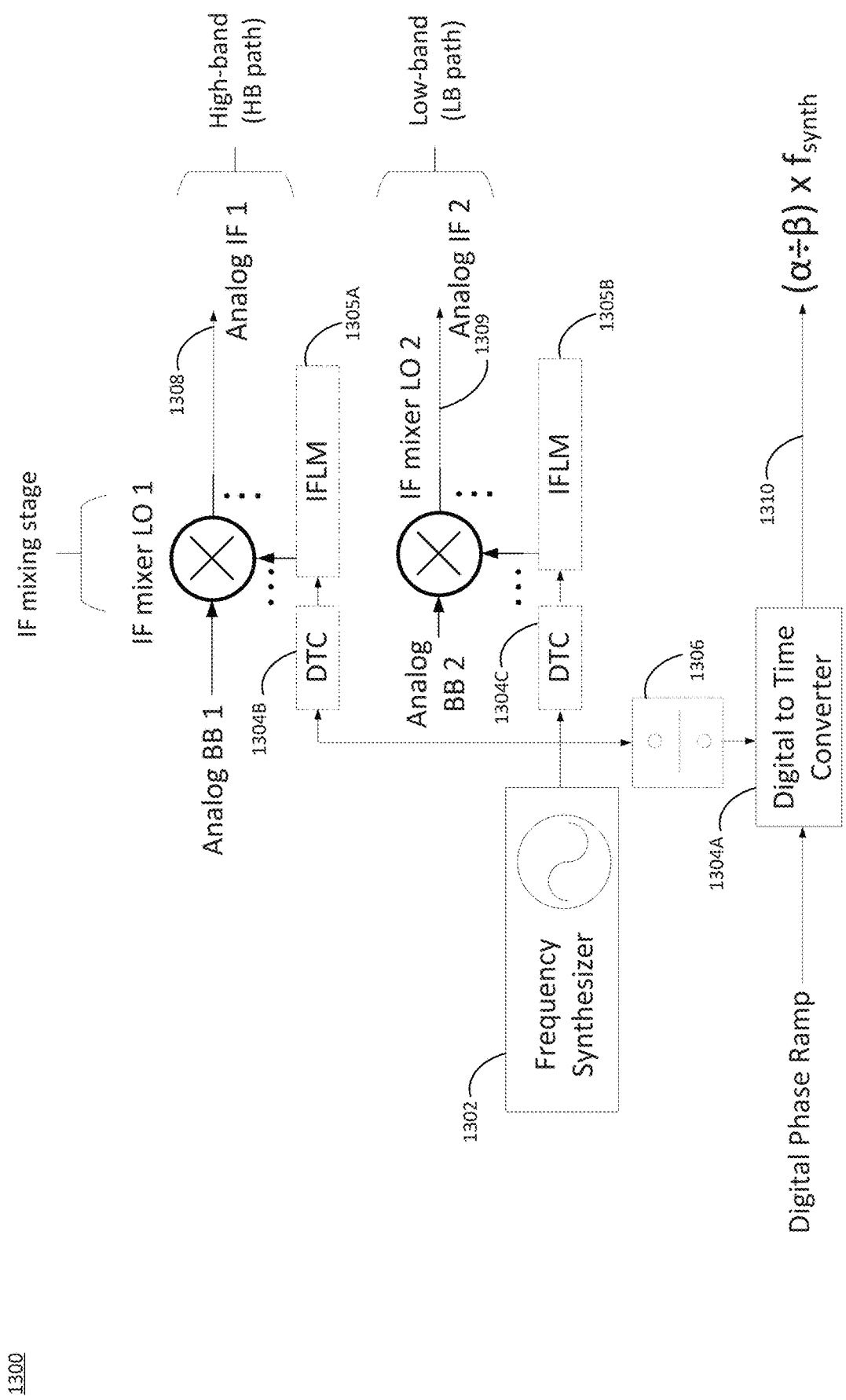
FIGS. 13A-13C illustrate an example of a transceiver architecture implementing a multiple die digital beamformer using multiple frequency bands of operation, in accordance with an aspect of the disclosure.
Figure 13B:
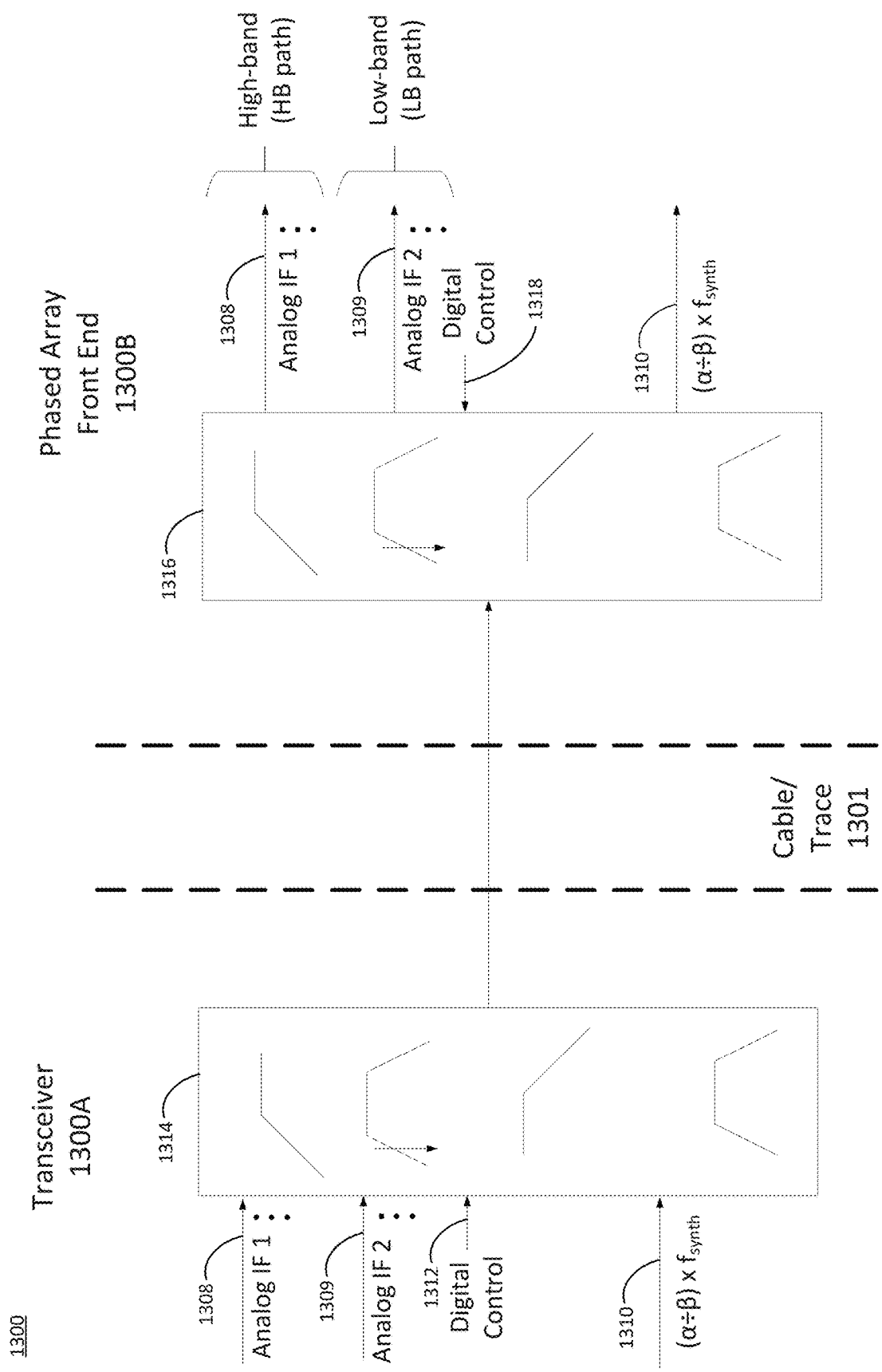
Figure 13C:
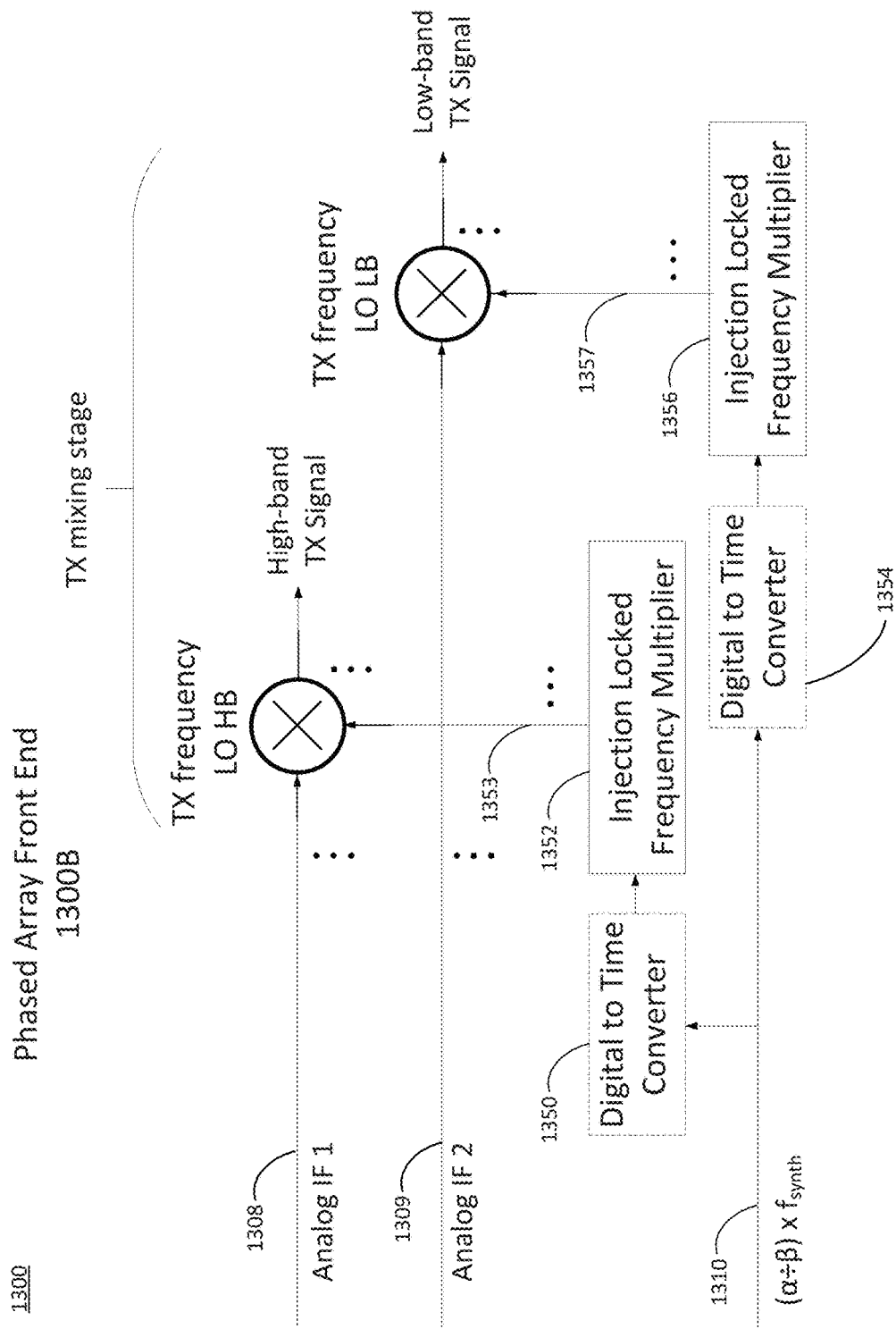

FIGS. 13A-13C illustrate an example of a transceiver architecture implementing a multiple die digital beamformer using multiple frequency bands of operation, in accordance with an aspect of the disclosure. Again, the transceiver architecture 1200 as shown in FIGS. 12A-12B uses super-heterodyne up-conversion. Like the transceiver architecture 1200, the transceiver architecture 1300 as shown in FIGS. 13A-13C uses a multi-die implementation, with the transceiver circuitry and the phased array front end circuitry being implemented on separate dies.

In an aspect, the transceiver architecture 1300 as shown in FIGS. 13A-13C has a similar structure as, and uses similar components as, the transceiver architecture 1200 as shown in FIGS. 12A-12B. Therefore, only differences between these transceiver portions will be further discussed herein. For instance, the transceiver architecture 1300 as shown in FIG. 13A, like the transceiver architecture 1200 as shown in FIG. 12A, uses a common frequency synthesizer 1302, optional frequency divider circuitry 1306, a DTC 1304A to generate a fractional frequency multiplication of the reference signal generated via the frequency synthesizer 1302 and/or a further frequency divided version of the reference signal if the optional frequency divider circuitry 1306 is utilized. Moreover, the transceiver architecture 1300 as shown in FIG. 13A, like the transceiver architecture 1200 as shown in FIG. 12A, may implement one or more optional DTCs 1304B-C and IFLMs 1305A-B, which may provide fractional multiplication or integer multiplication of the reference signal generated via the frequency synthesizer 1302.

In this way, the transceiver architecture 1300 as shown in FIG. 13A may independently provide two different sets of LO signals (or individual signals, as the case may be) to each respective IF mixer. Thus, the portion of the transceiver architecture 1300 as shown in FIG. 13A may be configured to pass two separate IF analog signals, each at its own frequency, to the phased array front end as shown in FIG. 13B. Again, as discussed with respect to FIGS. 12A-12B, when quadrature LO signals are generated by the IFLMs 1305A, 1305B, the analog IF signals as shown in FIG. 13A may include a set of quadrature signal components. However, the transceiver architecture 1300 as shown in FIG. 13A may provide an additional IF signal (or set of IF signals) compared to the transceiver architecture 1200 as shown in FIG. 12A. This may be particularly useful, for example, for applications that simultaneously utilize two independent carrier frequencies for communications, such as CA applications. Regardless of the various optional components that are implemented, aspects include the transceiver architecture 1300 generating two up-converted analog IF signals 1308, 1309 and a fractionally-multiplied reference signal 1310.

Turning now to FIG. 13B, the transceiver architecture 1300, similar to the transceiver architecture 1200, also spans multiple dies and interfaces, with the transceiver portion 1300A being associated with one die, and the phased array front end portion 1300B being associated with a different die. The transceiver architecture 1300 also includes an IF interface 1301 to facilitate distribution of the up-converted analog IF signals 1308, 1309, and the fractionally-multiplied reference signal 1310 between each die. Moreover, as shown in FIG. 13B, the transceiver architecture 1300 includes a multiplexing block 1314 and de-multiplexing block 1316 to facilitate the up-converted analog IF signals 1308, 1309, and the fractionally-multiplied reference signal 1310 being combined onto and extracted from the IF interface 1301, to provide the separate signals as shown in FIG. 13B.

Referring now to FIG. 13C, aspects include the fractionally-multiplied reference signal 1310 having a fractional frequency shift compared to the frequency $f_{synth}$ of the reference signal generated by the frequency synthesizer 1302. The phased array front end 1300B may additionally include two separate mixers (or sets of mixers, with each mixer shown representing an in-phase and quadrature phase path as discussed above with respect to FIG. 12B) to up-convert the up-converted analog IF signals 1308, 1309 to HB and LB transmission signals, respectively. For example, each of the mixers as shown in FIG. 13C may be associated with a separate up-conversion frequency, with one mixer generating a HB transmission signal and the other being a LB transmission signal. In an aspect, these high and low band transmission signals may be mm-Wave frequencies implemented in accordance with a CA communication scheme, although the aspects described herein are not limited to this particular application and may be implemented in accordance with any suitable frequency bands and/or communication protocols.

Additionally, the phased array front end 1300B may include ILFMs 1352, 1356, with the ILFM 1352 providing a HB LO signal to the HB mixer input. The HB LO signal 1353 may represent an integer frequency multiplication of the fractionally-multiplied reference signal 1310 (or a further fractional multiplication thereof in the event that the optional DTC 1350 is also implemented). Similarly, the ILFM 1356 may provide a LB LO signal 1357 to the LB mixer input. The LB LO signal 1357 may represent an integer frequency multiplication of the fractionally-multiplied reference signal 1310 (or a further fractional multiplication thereof in the event that the optional DTC 1350 is also implemented).

The optional DTCs 1350, 1354 may be substantially similar or identical to the optional DTC 1211 as shown in FIG. 12B, as described herein, whereas the IFLMs 1352, 1356 may be substantially similar to or identical to the IFLM 1220 as shown in FIG. 12B. In other words, the IFLMs 1352, 1356 may also be implemented as the ILCM 306.3 as discussed herein. Furthermore, as discussed herein for the transceiver architectures 1100, 1200, aspects include the ILFMs 1352, 1356 generating any suitable number of high frequency LO signals 1353, 1357 using the fractionally-multiplied reference signal 1310 (which may be further fractionally frequency shifted via the optional DTCs 1350, 1354). As discussed above, the high frequency LO signals 1353, 1357 may be one of multiple LO signals that are distributed to any suitable number of respective mixers, with each of the HB and the LB mixer receiving the up-converted analog IF signals 1308, 1309, respectively, as an input to generate a higher frequency signals for transmission.

Aspects include the frequency ratios provided by the DTCs 1304A-C, 1350, 1354, the frequency multiplication provided by the IFLMs 1305A, 1305B, 1354, 1356, and/or the frequency division provided by the frequency divider circuitry 1306 being programmable and capable of being dynamically modified during communications or another suitable time period such that several different frequency bands may be selected and adjusted in a dynamic fashion. As a result of this flexibility, the hardware associated with the transceiver architecture 1300 may be reused for different frequency bands of operation and/or used simultaneously to provide different frequency bands of operation (e.g., for CA applications). Thus, high and low frequency bands can be independently set and adjusted, and frequencies may be chosen to avoid cross-talk or other sources of known or detected interference.

Figure 14:
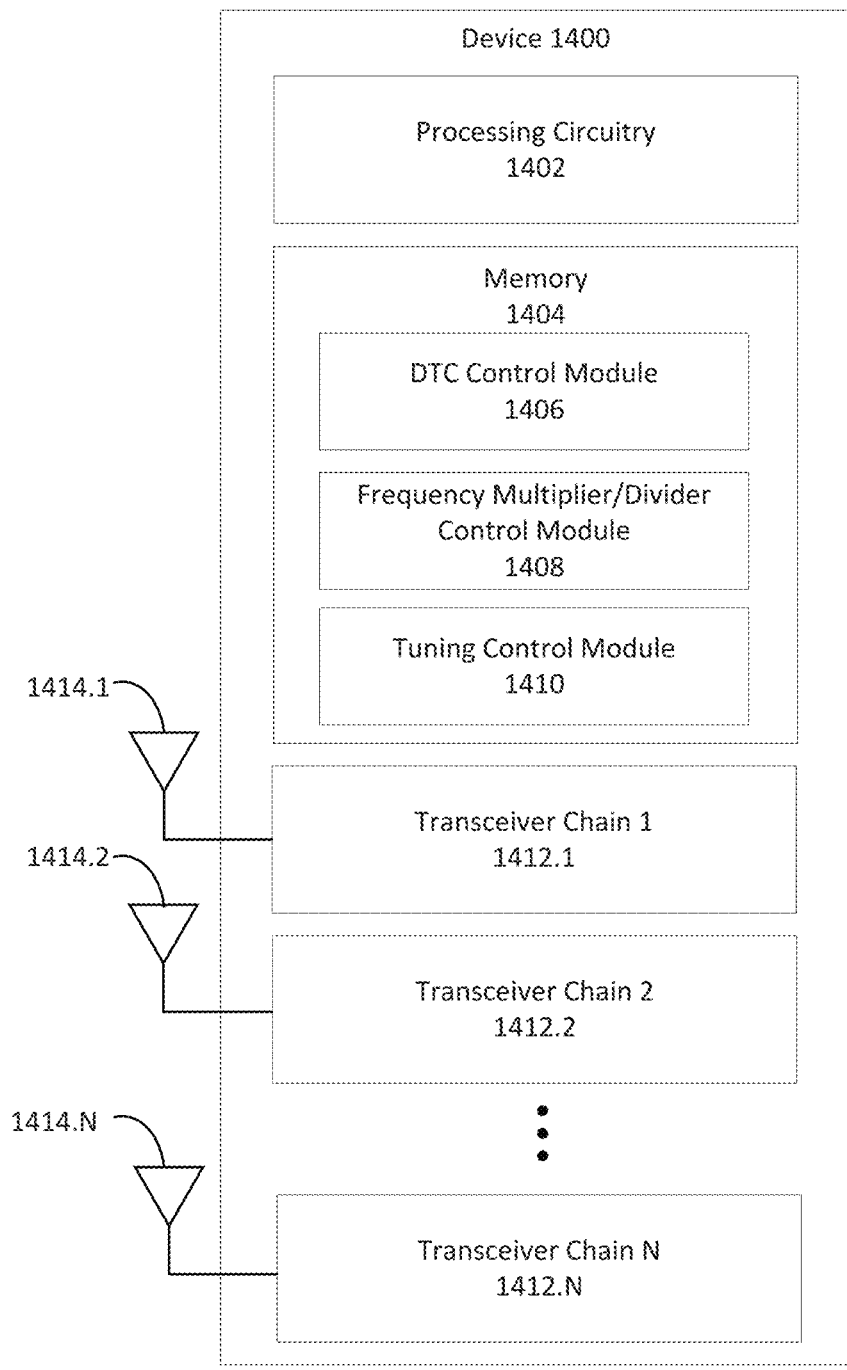
FIG. 14 illustrates a block diagram of a device, in accordance with an aspect of the disclosure.

FIG. 14 illustrates a block diagram of a device in accordance with an aspect of the disclosure. In various aspects, device 1400 may be implemented as any suitable type of device configured to transmit and/or receive wireless signals in accordance with any suitable number and/or type of communication protocols. For instance, the device 1400 may be implemented as a user equipment (UE) such as a mobile phone, tablet, laptop computer, etc. To provide additional examples, the device 1400 may be implemented as an access point or base station. The device 1400 may implement one or more aspects as described herein to facilitate receiving wireless signals in accordance with frequency or band of frequencies, such as mm-Wave frequencies, for example, as further described below. In various aspects, the device 1400 may include additional or alternative functionality as the device 1000 described with respect to FIG. 10.

In an aspect, the device 1400 may include processor circuitry 1402, a memory 1404, and any suitable number N of transceiver chains 1412.1-1412.N, each being coupled to one or more respective antennas 1414-1-1414.N. The components shown in FIG. 14 are provided for ease of explanation, and aspects include device 1400 including additional, less, or alternative components as those shown in FIG. 14. For example, device 1400 may include one or more power sources, display interfaces, peripheral devices, ports, etc. To provide additional examples, the device 1400 may further include one or more transmitters and/or receivers, or the transceiver chains 1412.1-1412.N may alternatively be implemented as transmitters configured to transmit wireless signals via antennas 1414.1-1414.N.

In an aspect, the various components of device 1400 may be identified with functionality further described herein with reference to the generation of LO signals using fractional frequency multiplication. For example, the wireless device 1400 may be configured to transmit wireless signals via one or more of the antennas 1414.1-1414.N at mm-Wave or other suitable frequencies, and to demodulate and process data contained in signals received wirelessly via transceiver chains 1412.1-1412.N. The transceiver chains 1412.1-1412.N may be identified with a respective one of the receiver chains as shown, for example, in FIG. 3 (RX-1-RX-K), and each include a respective LOG unit as shown in FIG. 3 (304.1-304.K).

In an aspect, processor circuitry 1402 may be configured as any suitable number and/or type of computer processors, which may facilitate control of the device 1400 as discussed herein. In some aspects, processor circuitry 1402 may be identified with a baseband processor (or suitable portions thereof) implemented by the device 1400. In other aspects, the processor circuitry 1402 may be identified with one or more processors implemented by the device 1400 that are separate from the baseband processor. In any event, aspects include the processor circuitry 1402 being configured to carry out instructions to perform arithmetical, logical, and/or input/output (I/O) operations, and/or to control the operation of one or more components of the device 1400. For example, the processor circuitry 1402 can include one or more microprocessors, memory registers, buffers, clocks, etc. Moreover, aspects include processor circuitry 1402 communicating with and/or controlling functions associated with the memory 1404 and/or the transceiver chains 1412.1-1412.N. This may include, for example, controlling and/or arbitrating transmit and/or receive functions of the device 1400, performing one or more baseband processing functions (e.g., media access control (MAC), encoding/decoding, modulation/demodulation, data symbol mapping, error correction, etc.).

In an aspect, the memory 1404 stores data and/or instructions such that, when the instructions are executed by the processor circuitry 1402, the processor circuitry 1402 performs the various functions described herein. The memory 1404 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1404 can be non-removable, removable, or a combination of both.

For example, the memory 1404 may be implemented as a non-transitory computer readable medium storing one or more executable instructions such as, for example, logic, algorithms, code, etc. As further discussed below, the instructions, logic, code, etc., stored in the memory 1404 are represented by the various modules as shown in FIG. 14, which may enable the aspects disclosed herein to be functionally realized. The modules shown in FIG. 14 are provided for ease of explanation regarding the functional association between hardware and software components. Thus, aspects include the processor circuitry 1402 executing the instructions stored in these respective modules in conjunction with one or more hardware components to perform the various functions associated with the aspects as further discussed herein.

In an aspect, the executable instructions stored in the DTC control module 1406 may facilitate, in conjunction with the processor circuitry 1402, the generation of digital phase ramp data that is transmitted to the various DTCs implemented via the transceiver architectures 1100, 1200, 1300 as discussed herein. For instance, the executable instructions stored in the DTC control module 1406 may control one or more DTCs to generate a fractional phase shift as a function of the digital phase ramp data. In an aspect, the digital phase ramp data may be selected based upon a correlation to a desired fractional frequency shift, which may be calculated, for example, via a suitable algorithm, function, lookup table (LUT), etc., stored in the memory 1404 or otherwise accessible by the processor circuitry 1402.

In an aspect, the executable instructions stored in the frequency multiplier/divider control module 1408 may facilitate, in conjunction with the processor circuitry 1402, the generation and transmission of control signals to set the appropriate values for the frequency divider circuitry (e.g., 1106, 1206, 1306, etc.), and/or the ILFMs (e.g., IFLMs 1120, 1130, 1205, 1220, 1305A, 1305B, 1352, 1356, etc.) implemented via the transceiver architectures 1100, 1200, 1300 as discussed herein. For example, the executable instructions stored in the frequency multiplier/divider control module 1408 may allow the generated reference frequency to be divided and/or fractionally multiplied before or after up-conversion via the frequency divider circuitry and the frequency multipliers, depending upon the particular implementation of the transceiver architecture. As another example, the functionality associated with the frequency multiplier/divider control module 1408 may establish a desired integer multiplication via the various ILFMs as discussed herein. Again, these values may be changed dynamically to provide flexibility with regards to one or more transmission frequencies used during operation of the device 1400, which may be chosen, for example, based upon desired transmission frequencies, prior knowledge of operation, measured feedback, etc., as discussed herein. In an aspect, the values generated by the frequency multiplier/divider control module 1408 may be selected based upon a correlation to desired changes in the frequency of the input signal for each respectively controlled component. This may be calculated, for example, via a suitable algorithm, function, LUT, etc., stored in the memory 1404 or otherwise accessible by the processor circuitry 1402.

In an aspect, the executable instructions stored in the tuning control module 1410 may facilitate, in conjunction with the processor circuitry 1402, the generation and transmission of control signals to tune the multiplexers (e.g., multiplexers 1214, 1314) and the de-multiplexers (e.g., de-multiplexers 1216, 1316) to facilitate the IF interface between the separate transceiver and phased array front end dies, as discussed herein with respect to FIGS. 12B and 13B, for example. In an aspect, the executable instructions stored in the tuning control module 1410 may include a suitable algorithm, function, LUT, etc., and/or instructions regarding calculations to be performed to derive a set of tuning parameters, which may yield a specific filter type and/or filter response to enable the combination of signals at the transceiver die and the extraction and separation of these signals at the phased array front end die. These tuning parameters, therefore, may facilitate the appropriate bandwidth, filter coefficients, etc., based upon the current IF frequency bands that are being transmitted via the IF interface. Again, aspects include these tuning parameters being dynamically adjusted depending upon the currently used IF frequencies, which may be changed depending upon operating conditions, to avoid blocker signals, based upon measured feedback, etc.

Section III—Array Element-Level Control Using Per-Chain DC-DC Converters

Aspects described in this Section generally relate to transceivers and, more particularly, to a multi-transceiver chain architecture implementing a dedicated DC-DC converter for each transceiver chain.

RF front-ends may implement phased array antennas for beam steering both at the User Equipment (UE) side and the base station side. For the UE side, a typical configuration is to implement analog phased arrays, in which signals from multiple (e.g., 4 or more) antennas are coherently combined with appropriate phase and amplitude weights to scan the beam in specific directions. However, due to the requirement for coherent power combining, tuning at the element level (i.e., the components within each transceiver chain) is limited. As a result, current transceiver architectures may suffer from performance limitations that cannot be easily addressed.

As discussed herein, current transceiver architectures may suffer from performance limitations that cannot be easily addressed. Some examples of these performance limitations include the effects of enclosure, semiconductor process and aging variations, packaging process variations, over the air link conditions, mutual coupling between antennas, etc., which may cause mismatches between the amplifiers and the antennas that changes as the beam is steered off broadside. Typically, this causes output power variations, side-lobe increases, and beam pointing errors. Another example of performance limitations in current transceiver designs include, when amplitude tapering is implemented to reduce the side-lobe level, the generation of non-optimal bias settings for some amplifiers within certain transceiver chains versus others, which may result in wasting DC power and over-heating.

Furthermore, temperature differences across the die implemented in traditional transceiver architectures may cause differences in performance between transceiver chains. And process variations, although limited within a single chip, can further deteriorate these effects. Still further, conventional transceiver architectures may suffer from individual element failure or shut-down due to the temperature exceeding a thermal threshold, which may cause issues with the entire array operation (pointing error, lower Pout, side-lobes, grating lobes, etc.).

Further complicating this issue, conventional transceiver architectures typically use one or two data streams (for multiple-input multiple-output (MIMO) operation)), which are fed into separate analog phased arrays used to perform beam scanning by setting appropriate phase and amplitude weights on the various transceiver chains. For these traditional transceiver architectures, a small number of DC-DC converters are used to supply different voltages for the various transceiver components. Conventionally, each of these DC-DC converters provides an output voltage that is used to power certain elements common to each of the transceiver chains. In other words, the DC-DC converters are shared among the different transceiver chain components within the overall transceiver architecture.

For example, a conventional transceiver architecture may use one DC-DC converter that provides a first supply voltage used for the digital circuits, a second DC-DC converter that provides a second supply voltage for the majority of the analog/RF components (low noise amplifiers (LNAs), switches, active mixers, etc.), and a third DC-DC converter that provides a third supply voltage for the power amplifiers (PAs). Generally, the first, second, and third supply voltages output different supply voltages such that the first DC-DC converter provides the lowest supply voltage, the third DC-DC converter provides the highest supply voltage, and the second DC-DC converter provides an intermediate supply voltage in between the first and the third supply voltages. Furthermore, for conventional transceiver architectures, each of the transceiver chains shares the same first, second, and third power supply voltage provided by the first, second, and third DC-DC converter, respectively. For example, the same third supply voltage (i.e., the highest voltage) may be applied to all the active power amplifiers within a transceiver array architecture, i.e., to all active power amplifiers associated with each transceiver chain in the array.

Generally, for operation of the phased array, transceivers utilize a pre-set codebook, which is typically loaded onto the chip memory. This codebook may define various transceiver parameters for each transceiver chain to operate in conjunction with a specific communication protocol, band of frequencies, and number and type of antenna elements within the phased array. For example, the codebook may include transceiver parameters such as the optimum amplifier bias, amplitude, and phase settings per transceiver chain depending on the frequency, beam pointing angle, data modulation and waveform, current die temperature, etc. These codebooks are typically based on array calibrations done in advance at the factory, and cannot compensate for changes that occur at the element-level post-calibration (for example, random element failure, individual element shutdown due to temperature over-shoot, changes in antenna voltage standing wave ratio (VSWR) due to external conditions, etc.).

In other words, a main disadvantage of conventional transceiver architectures is the inability to individually tune and control each transceiver chain within the phased array system, which has several implications. First, as the antenna beam is scanned, the VSWR between each of the power amplifiers and their corresponding antennas changes. This VSWR change affects the power amplifier output power, gain, and the dissipated power. Thus, as the beam is scanned through space, the transmitted power from each amplifier changes, and this change can be different for each amplifier in the array. This also impacts the power amplifier non linearities (amplitude modulation (AM)-AM and AM-phase modulation (PM) errors) and therefore reduces the benefit of using digital pre-distortion (DPD).

Second, as the antenna beam is scanned, the mutual coupling between the antennas changes. This also affects the VSWR between the power amplifiers and the antennas, further compounding the issue mentioned above.

Third, to lower the level of side-lobes, the amplitude transmitted from each transceiver chain is typically "tapered," i.e., the amplitude transmitted at each chain relative to one another may be varied. This tapering is typically realized by adding a variable attenuator at the output of each transceiver chain, which reduces the transmitted signal magnitude according to the pre-defined codebook. This is further discussed below with reference to FIG. 16A. However, this means that in most cases, when aperture tapering is applied, the amplifiers are not biased at their optimum setting. Instead, each of the amplifiers is biased with the same voltage, and thus power is wasted via the use of the attenuators.

Fourth, temperature differences across the die can result in performance differences between the various transceiver chains. For example, transceiver chains that are at the center of the chip typically run at higher junction temperatures compared to the transceiver chains at the edge of the chip, as these are not surrounded by other high-temperature components. This temperature variation affects the gain, output power, and efficiency of the power amplifiers, as well as the gain and noise figure of the low noise amplifiers (LNAs). Because conventional transceiver designs only allow for the bias settings of all amplifiers to be controlled as a single entity, the bias can only be set as an average value based on the average temperature of the entire chip. In other words, there is no way to individually apply optimum bias conditions to amplifiers based on their individual junction temperature.

Fifth, as the junction temperatures increase further, individual element failure or shut-down may occur (due to temperature exceeding a thermal threshold), and this may cause issues with the entire array operation. In particular, the transceiver system coherently combines operational transceiver chain signals, which may include chains that work sub-optimally due to higher temperatures as well as chains that are off (e.g., due to failure or shut-down). As a result, this leads to performance deterioration at the system level, which is demonstrated as pointing error, lower Pout, side-lobes, grating lobes, lower throughput, higher error vector magnitude (EVM) etc.

Therefore, to address the issues present in conventional transceiver architecture solutions, the aspects disclosed in this Section are directed to transceiver implementations that utilize multiple DC-DC converters for controlling individual digital transceiver chains associated with a digital RF head. In particular, the aspects described herein eliminate the need for multiple DC-DC converters that provide different supply voltages that are shared among specific components among all transceiver chains. Instead, the aspects described herein allow each transceiver chain, which may alternatively be referred to herein as a transceiver "slice," or transceiver "portion," to implement a single DC-DC converter that may be used for each of the components within that transceiver chain. This provides the capability to control the bias of each transceiver chain, and offers multiple advantages in terms of optimizing performance and reducing the impact of performance degradation when individual transceiver chains have failed or are operating under non-optimal conditions.

As further discussed below, the various aspects described in this Section facilitate a digitally-controlled RF head that has the capability to individually tune and bias each transceiver chain depending on a particular application and/or the current operating conditions. For example, as the beam is steered off broadside, the bias of each transceiver chain may be adapted to account for aperture tapering, changes in the VSWR, mutual coupling between elements, process and temperature variations, and the use of DPD. Thus, the amplifiers associated with each of the transceiver chains may be biased at their respective values to achieve the best RF performance and provide a substantial DC power savings.

Figure 15:
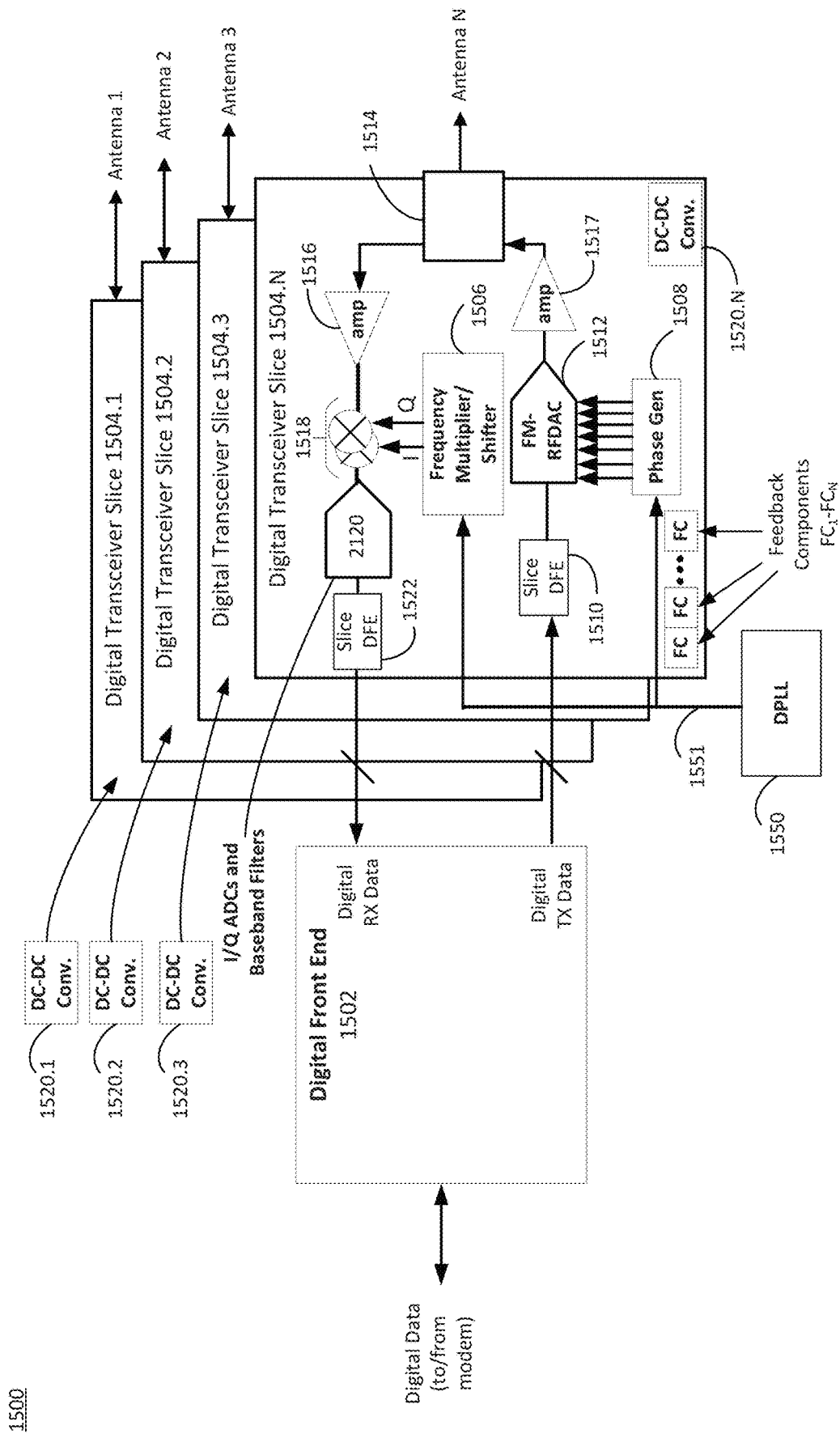
FIG. 15 illustrates a block diagram of an exemplary transceiver design, in accordance with an aspect of the disclosure.

FIG. 15 illustrates a block diagram of an exemplary transceiver design, in accordance with an aspect of the disclosure. In general terms, the transceiver design as shown in FIG. 15 illustrates a digital RF head that includes a common digital front end (DFE) 1502 and any suitable number of digital transceiver slices 1504.1-1504.N. The digital RF head is connected via a digital interface (e.g., a flex cable or other suitable connection) to a modem, such that digital data is communicated between the modem and the digital RF head. The common DFE 1502 may be configured to manage digital processing, whereas the multiple digital transceiver slices 1504.1-1504.N may function to convert digital transmit signals to analog, and up-convert these analog signals for transmission via a corresponding coupled antenna (and down-convert received analog signals via a coupled antenna and digitize the down-converted received analog signals during reception). The signals to be transmitted and those received via the antennas within the phased array are thus passed between the common DFE 1502 and each respectively coupled antenna 1-N (or group of antennas) via a switching component 1514.

As further discussed herein, aspects include the transceiver design 1500 being implemented as a portion of an overall transceiver architecture that has several components omitted for brevity and ease of explanation. In an aspect, the common DFE 1502 may be coupled to any suitable number N of the digital transceiver slices 1504.1-1504.N. The transceiver design 1500 shown in FIG. 15 illustrates the shared DFE 1502 being coupled to only one the digital transceiver slices 1504 for purposes of brevity. However, aspects include the shared DFE 1502 being coupled to each of the digital transceiver slices 1504.1-1504.N via any suitable number and/or type of wired or wireless links, which may include wired buses configured to carry digital baseband data streams to and from the digital transceiver slices 1504.1-1504.N (e.g., the "digital RX data" and the "digital TX data").

In any event, the DFE 1502 may include any suitable number and/or type of components configured to perform functions known to be associated with digital front ends. For example, the DFE 1502 may be implemented as processing circuitry, portions of processing circuitry, one or more portions of an on-board chip having dedicated digital front end functionality (e.g., a digital signal processor), etc. For example, the DFE 1502 may provide the digital baseband data for transmission to each of the digital transceiver slices 1504.1-1504.N via a respectively coupled antenna, as further discussed below. To provide another example, the common DFE 1502 may facilitate receiving digital baseband data from each of the digital transceiver slices 1504.1-1504.N, which may be processed to recover data included in wireless data transmissions.

To do so, the common DFE 1502 may be implemented with decimators and components suitable to perform reconfigurable computing (e.g., a virtual reconfigurable circuit (VRC)), as well as processing circuitry configured to perform receive impairment correction such as DC offset correction, IQ imbalance correction, and ADC skew. To provide additional examples, the common DFE 1502 may further facilitate adjacent channel rejection (ACR) filtering, receiver digital gain control (DGC), down-sampling, etc.

To provide yet additional examples, the common DFE 1502 may be implemented with interpolators and a VRC coupled to each digital transceiver slice 1504.1-1504.N. Moreover, the common DFE 1502 may include other components associated with data transmission such as, for instance, transmitter impairment correction such as LO correction, IQ imbalance, digital pre-distortion (DPD) calculation, correction factor (CF) calculation, and pre-emphasis (pre. emp.) calculation. To provide additional examples, the DFE common 1502 may facilitate transmitter DGC, up-sampling, zero crossing detection algorithms, phase modulation, etc. Additionally, aspects include the common DFE 1502 being implemented with components suitable to perform beam management, digital blocker cancelation, received signal strength indicator (RSSI) measurements, DPD and calibration accelerators, test signal generation, etc.

In any event, aspects include the common DFE 1502 selectively performing specific functions based upon the operating mode of the transceiver design 1500. In particular, and as further discussed below, the common DFE 1502 and/or the slice DFEs 1510, 1522 implemented within each respective digital transceiver slice 1504.1-1504.N may dynamically re-calculate and/or update DPD coefficients based upon measured feedback during operation of the wireless device in which the transceiver design 1500 is implemented. Additionally or alternatively, aspects included the common DFE 1502 and/or the slice DFEs 1510, 1522 dynamically adjusting the various transceiver parameters associated with one or more each digital transceiver slices 1504.1-1504.N. In various aspects, as further discussed below, the DPD coefficients and/or the transceiver parameters may be adjusted on a per-transceiver chain basis by leveraging the use of the per-transceiver chain DC-DC converters 1520.1-1520.N, as shown in FIG. 15.

In an aspect, the transceiver design 1500 may include digital phase-locked loop circuitry (DPLL) 1550, which may be implemented using any suitable known circuit components to generate a reference signal 1551, which may include a low phase noise DPLL. Moreover, aspects include the reference signal 1551 being distributed to frequency multiplier/shifter circuitry 1506 and phase generation circuitry 1508. Therefore, aspects include the phase generation circuitry 1508 being identified with, for instance, the phase configuration circuitry 306.2 as shown in FIG. 3. Additionally, the frequency multiplier/shifter 1506 may be implemented as any suitable type of frequency multiplier, such as the edge combination frequency multipliers discussed in the previous Sections (e.g., the ILCM 306.3) that may provide any suitable number LO signals to the mixers 1518. Moreover, aspects include the frequency multiplying radio frequency digital-to-analog converter (FM-RFDAC) 1512 being implemented as any suitable known FM-RFDAC design.

Again, the transceiver design 1500 includes any suitable number N of transceiver slices 1504. In an aspect, each of the transceiver slices 1504 has a separate transmit and receive path. For purposes of brevity and ease of explanation, each transceiver slice 1504 is shown throughout the Figures in this section as being coupled to a single respective antenna. However, in various aspects, each transceiver slice 1504 may be coupled to any suitable number of antennas, low noise amplifiers, etc., in any suitable configuration to facilitate transmitting and receiving data in accordance with a phased array architecture.

With continued reference to FIG. 15, the transceiver slice 1504.N may be representative of each of the transceiver slices 1504.1-1504.N and implement a transmit path including a TX slice DFE 1510 that is coupled to the FM-RFDAC 1512. The FM-RFDAC 1512 is, in turn, coupled to a power amplifier (PA) 1517 and to an antenna N via the switching component 1514, which may represent any suitable type of component(s) to facilitate TX and RX mode switching. In an aspect, the transmit path of each transceiver slice 1504 may include a TX slice DFE 1510, which functions to provide additional DFE functionality on a per-transmit chain basis (i.e., a separate TX DFE 1510 may be implemented for each transceiver slice 1504). The additional DFE functionality includes, for example, interpolation, digital predistortion, I/Q compensation and gain control, etc.

Moreover, aspects include each transceiver slice 1504 also including a receive path coupled to the switching component 1514. For example, the receive path may include one or more amplifiers 1516 (e.g., a LNA), frequency multiplier/shifter circuitry 1506, one more mixers 1508, I/Q ADC and baseband filter circuitry 1520, and an RX slice DFE 1522. Again, aspects include each transceiver slice 1504 implementing a separate receive path, each having components similar to those represented by the transceiver slice 1504.N as shown in FIG. 15. Thus, aspects further include each of the components associated with the receive path being independently controlled on a per-receive chain basis (i.e., each transceiver slice 1504 may have a receive path with components that are separately controlled from one another).

In an aspect, each transceiver slice 1504 may include its own DC-DC converter 1520.1-1520.N, which may be implemented as any suitable type of circuitry configured to output a stable DC supply voltage using a reference input voltage. This reference input voltage may include any suitable DC voltage generated in the transceiver design 1500 using known techniques, such connections and reference input voltages not being shown in the Figures for purposes of brevity. In various aspects, each of the DC-DC converters 1520.1-1520.N may provide a supply voltage that is independent from one another, such that the DC-DC converters 1520.1-1520.N may provide the same supply voltage or different supply voltages to each respective transceiver slice 1504.

Aspects include the supply voltage output from each DC-DC converter 1520.1-1520.N being fixed or adjustable (e.g., adjusted via control signals from suitable processor circuitry, as discussed further below). In an aspect, the DC-DC converters 1520 may be formed on the same chip or die as the other components implemented within each transceiver slice 1504. For example, the DC-DC converter 1520.N may be integrated as part of the same die (i.e., formed as part of the same silicon) that is used for the mixers 1518, the amplifier 1516, etc. As another example, one or more of the transceiver slices 1504.1-1504.N may be integrated as part of the same chip as the common or shared DFE 1502 (and/or the modem referenced in FIG. 15 but not otherwise shown), whereas other aspects include the DFE 1502 and one or more of the transceiver slices 1504.1-1504.N (and/or the modem referenced in FIG. 15) being integrated as separate chips. Thus, any functions provided by the transceiver slices 1504.1-1504.N, the shared DFE 1502, and/or the modem referenced in FIG. 15 may be performed by one or more of these components on the same chip or on a different chip on which the components are integrated. Although not shown in FIG. 15 for purposes of brevity, each transceiver slice 1504 may include additional components that may likewise share the power supply provided by each respective DC-DC converter 1520. Moreover, aspects include one or more of the transceiver slices 1504.1-1504.N including more than one DC-DC converter 1520, with specific components within each respective transceiver slice utilizing supply voltage provided by different DC-DC converters implemented within that particular transceiver slice.

In an aspect, each transceiver slice 1504 may additionally include its own set of feedback components FC, which are represented in FIG. 15 as any suitable number N of feedback components $FC_1$-$FC_N$. The various interconnections of the feedback components are not shown in FIG. 15 for purposes of brevity. However, as further discussed below, these feedback components may include any suitable number and/or type of known sensors, measurement devices, sampling devices, couplers, etc., which may monitor various conditions of each transceiver slice 1504 during operation. For instance, these feedback components may include temperature monitors at one or more die locations to facilitate the measurement of junction temperatures of various components associated with each transceiver slice 1504, power meters measuring forward and reverse power in the transmit and/or receive paths, element failure detectors, etc.

Figure 16B:
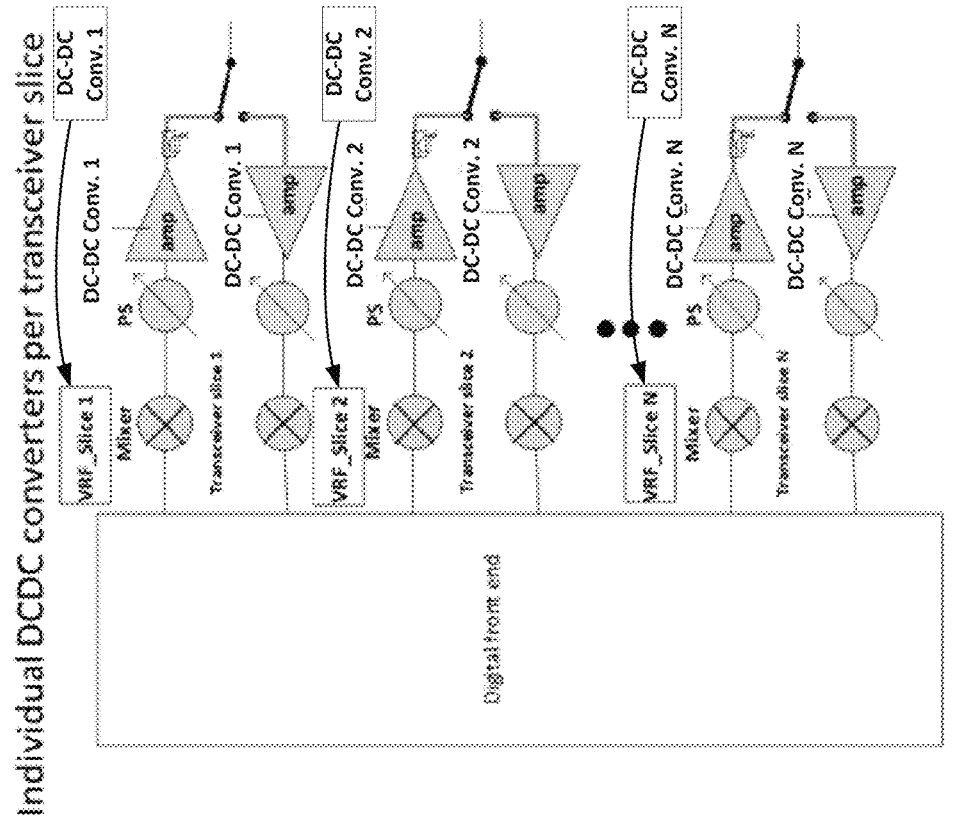
FIG. 16B illustrates a block diagram of a transceiver architecture using multiple DC-DC converters, one for each transceiver chain, in accordance with an aspect of the disclosure.
Figure 16A:
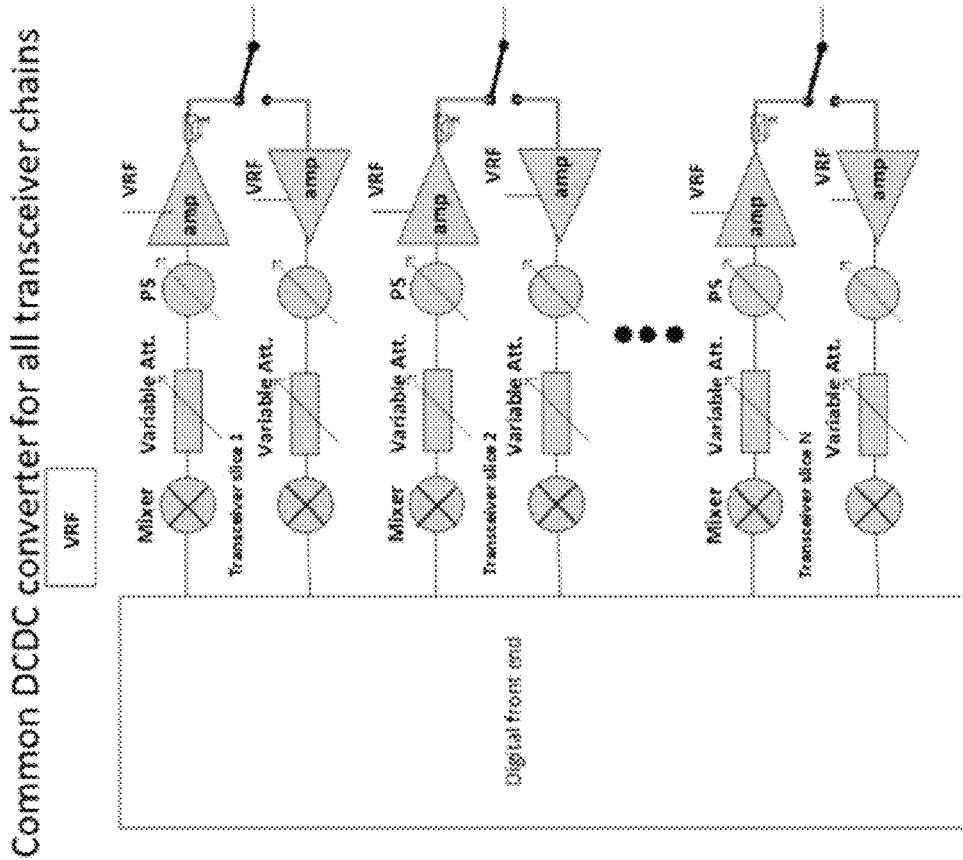
FIG. 16A illustrates a block diagram of a conventional transceiver architecture using a common DC-DC converter among each of the transceiver chains.

FIGS. 16A-B illustrate a generic block diagram of digital transceiver slices. In particular, FIG. 16A illustrates a block diagram of a conventional transceiver architecture using a common DC-DC converter among each of the transceiver chains. FIG. 16B, however, illustrates a block diagram of a transceiver portion using multiple DC-DC converters, i.e., one per transceiver slice, as shown in FIG. 15. Thus, the block diagram shown in FIG. 16 may represent an alternate representation of the transceiver slices 1504.1-1504.N, as shown in FIG. 15.

Figure 17B:
FIG. 17B illustrates a simulated far-field radiation pattern for a 4×4 antenna array with aperture tapering showing a reduction of side lobe level, in accordance with an aspect of the disclosure.
Figure 17A:
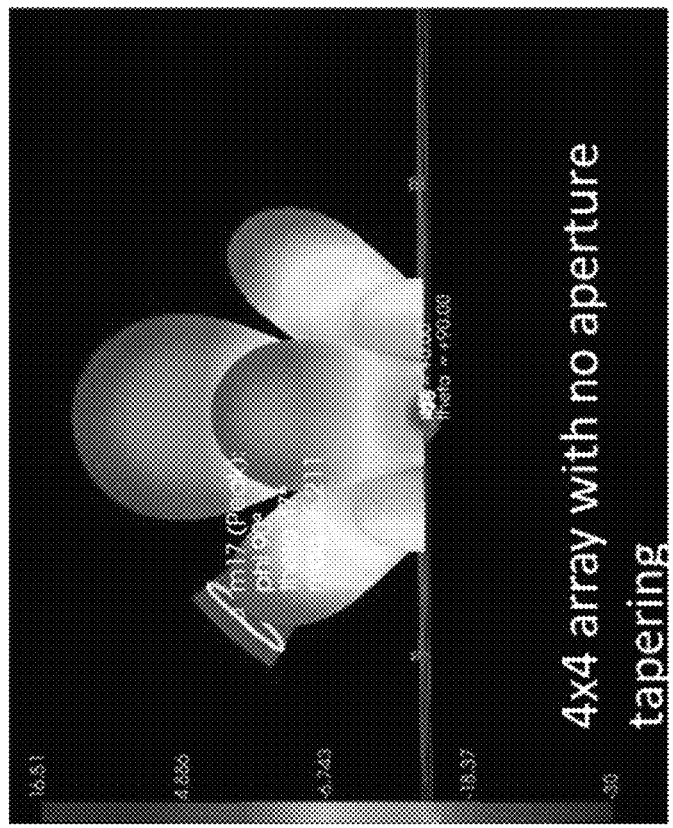
FIG. 17A illustrates a simulated far-field radiation pattern for a 4×4 antenna array without aperture tapering.

As noted above, one advantage of the per-transceiver slice DC-DC converter aspects described herein is related to aperture tapering. In typical phased arrays, the amplitude transmitted via each transceiver chain is tapered to reduce the power leaking into the side lobes. This can be observed in the radiation patterns shown in FIGS. 17A-17B, which illustrate simulated far field radiation pattern of a 4×4 array without (FIG. 17A) and with (FIG. 17B) the use of aperture tapering. The simulations indicate that application of the amplitude tapering decreases the side lobe level by about 15 dB.

As shown in FIG. 16A, the conventional transceiver design approach uses DC-DC converters common to components across all transceiver slices, which are implemented for biasing all the transceiver slice components. However, FIG. 16B represents a block diagram of a transceiver architecture using multiple DC-DC converters, one for each transceiver chain, in accordance with an aspect of the disclosure. Aspects include the per-transceiver chain DC-DC converters as shown in FIG. 16B facilitating various options to tune and optimize the bias settings for each transceiver slice, allowing the digital RF head to obtain optimum RF performance using a lower dissipated DC power.

For example, as shown in FIG. 16A, a single shared DC supply voltage (VRF) is used. This supply voltage may be utilized, for instance, to bias the receive and transmit amplifiers within each transceiver chain. In doing so, the receive and transmit amplifiers within all transceiver chains are biased with the same voltage VRF, such that any changes to the VRF supply voltage impact the amplifiers within all transceiver chains. As noted above, to lower the level of side-lobes, the amplitude transmitted from each transceiver chain is typically "tapered," i.e., the amplitude transmitted at each chain relative to one another may be varied. But because the same supply voltage VRF is distributed to all transceiver chains, conventional solutions utilize a variable attenuator within the transmit and receive paths of each transceiver chain ("Variable Att.") while the amplifiers are fully biased. This allows for the magnitude of the transmitted and/or received signal to be reduced to a desired value in accordance with the pre-defined codebook. In other words, the conventional use of the same supply voltage to fully bias each amplifier results in wasted power, as all amplifiers within the transceiver need to be biased at the same level and operated at their full power while transmitting attenuated power. This inefficient solution requires that the same amount of DC power be utilized even though a lower RF power may actually be required to be received or transmitted from several transceiver slices (i.e., based upon the codebook values).

In contrast, the transceiver architecture as shown in FIG. 16B may be identified with the transceiver architecture 1500 as shown in FIG. 15, with additional detail shown regarding the DC-DC converters. Thus, the DC-DC converters 1, 2, and N that are associated, respectively, with the "VRF_Slice 1," "VRF_Slice 2," "VRF_Slice N," etc., may be identified with the DC-DC converters 1520.1-1520.N. These supply voltages may thus be used to bias the amplifiers within each of the transceiver slices using different voltage values, as shown in FIG. 16B. In doing so, aspects include eliminating the variable attenuators that are otherwise implemented as part of a conventional transceiver architecture, saving power and allowing for a more efficient transceiver design. In particular, instead of attenuating the signals within each transceiver chain, aspects include facilitating amplitude tapering directly via the amplifiers by adjusting their respective bias conditions to acquire the appropriate output power. In this way, each amplifier may be biased individually at its optimum condition depending on the output power it actually needs to transmit or receive based upon a desired tapering. This improves the overall DC-to-RF efficiency of the transceiver, as no DC power is wasted via attenuators.

In other words, referring back to FIG. 15, the aspects described in this Section enable the efficiency of the PAs 1517 included in one or more of the digital transceiver slices 1504.1-1504.N to be enhanced. In particular, the specific supply voltage provided by the DC-DC converters 1520.1-1520.N may control the individual power supply rails used via each of the PAs 1517 to yield an optimal load line for the transceiver design 1500. Because the slice DC-DC converters 1520.1-1520.N may be controlled independently at each of the digital transceiver slices 1504.1-1504.N, the aspects described in this Section enable the transceiver design 1500 to maintain an optimal load line over the entire range of transmitter output power levels. That is, it is undesirable (i.e. not optimal) for a PA 1517 to use a high power supply to transmit at a low power level, as power is wasted during this process, resulting in a low PA efficiency. The embodiments described herein facilitate an individualized adjustment of power supply rails for each PA 1517, thus enabling the transceiver design 1500 to operate at an optimal efficiency for all output power levels.

Figure 18B:
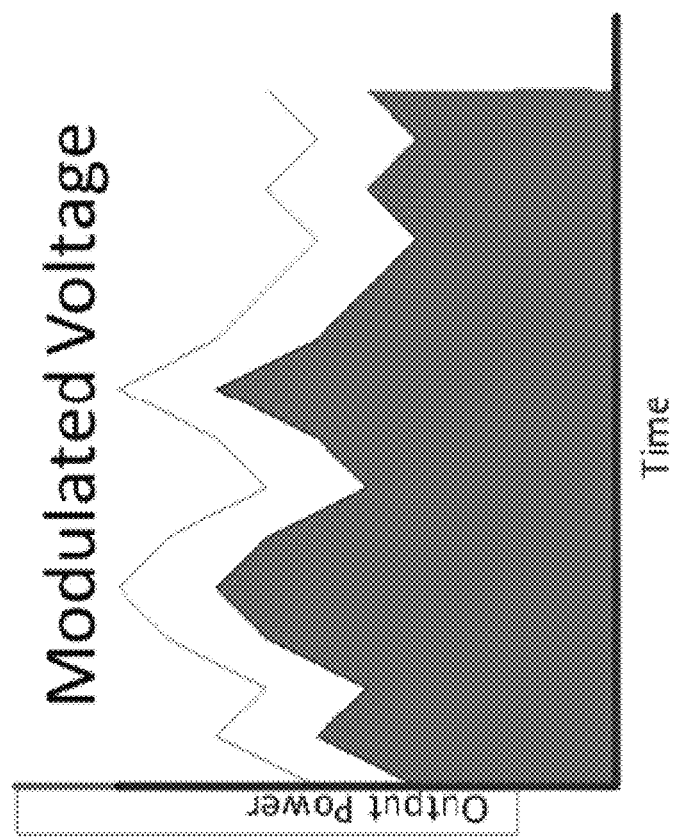
FIG. 18B illustrates a modulated amplifier supply voltage using multiple DC-DC converters, in accordance with an aspect of the disclosure.
Figure 18A:
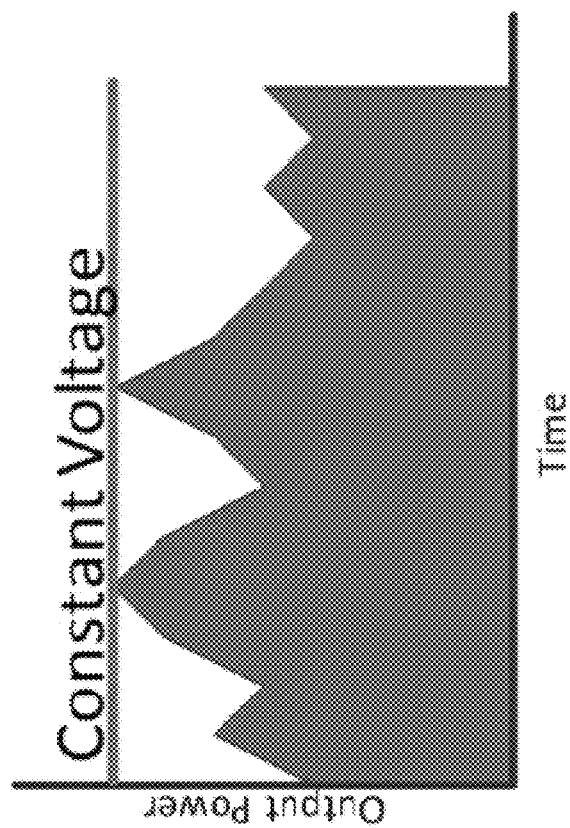
FIG. 18A illustrates a constant amplifier supply voltage using a common DC-DC converter as part of a conventional transceiver architecture.

Another advantage of the per-transceiver slice DC-DC converter aspects described herein, which further relates to aperture tapering, is described below with reference to FIGS. 18A-18B. In particular, when the transceiver slices 1504 are implemented for the transmission of signals in accordance with certain communication protocols (e.g., OFDM signals) the output power of the transmitter varies significantly over time as a function of the transmitted modulation and waveform. Therefore, if the same DC-DC supply is used across each of the transceiver slices, as is the case in conventional approaches, this results in a constant voltage being applied during signal transmission, as shown in FIG. 18A. This is typically done to compensate for the highest level of output power, but results in wasted DC power when an amplifier is transmitting at a lower output power level.

In accordance with the aspects as described herein, however, the individual DC-DC converters 1520 integrated within each transceiver slice may independently supply power for each amplifier within its respective transceiver slice. As a result, aspects include modulating the amplifier bias voltage such that the DC bias level tracks the envelope of the transmitted signal, as shown in FIG. 18B, thus providing an improvement in DC-to-RF efficiency.

Yet another advantage of the per-transceiver slice DC-DC converter aspects described herein is that individual bias control for each transceiver slice may function to alleviate some of the effects of VSWR mismatch from antenna to amplifier, as well as the mutual coupling between antennas. Both of these effects may vary per transceiver chain and change as the radiated beam is steered off from broadside. For instance, a transceiver design having N transceiver slices (as shown in FIGS. 15 and 16B), will be coupled to N number of antennas. Moreover, each antenna will have a slightly different impedance due to its physical location within the phased array, its mutual coupling with adjacent antennas, and the overall environment (e.g., where the antenna is located, the direction of radiation, the type of enclosure, the enclosure materials, the distance between the antenna element and its enclosure, the existence of large reflectors in the near field of the UE, etc.).

With each transceiver slice, these different impedances create a different VSWR at each interface between the amplifier and the coupled antenna, which in term affects the amplifier performance (e.g., the output power, gain, and efficiency). Changes to the VSWR may also affect the non-linearity of the amplifier (i.e., introducing AM-AM and AM-PM errors). Furthermore, as mentioned before, as the antenna steers its beam off broadside, the VSWR observed via each transceiver slice changes. Therefore, being able to track the VSWR changes and then adjust the amplifier bias conditions to account for these changes is advantageous to maintain high performance while the beam is steered and when the system radiates in non-optimal environments.

Furthermore, semiconductor process variations can also result in different power amplifiers with different AM-AM and AM-PM characteristics. To account for such differences, a different back-off value may be required for each power amplifier (PA) (e.g., the PA 1517 as shown in FIG. 15). But without a mechanism to increase the linearity of weaker PAs, the PAs for the entire transceiver system would be required to operate at a transmit power back-off to support the weakest PA, thereby reducing the overall efficiency and transmitting less power. Therefore, another advantage of the per-transceiver slice DC-DC converter aspects described herein is that the supply bias for lower performing PAs within individual transceiver chains may be increased within the overall transceiver array to maintain output power and efficiency for the whole system. This process is further discussed below with respect to the process flow shown in FIG. 19.

Figure 19:
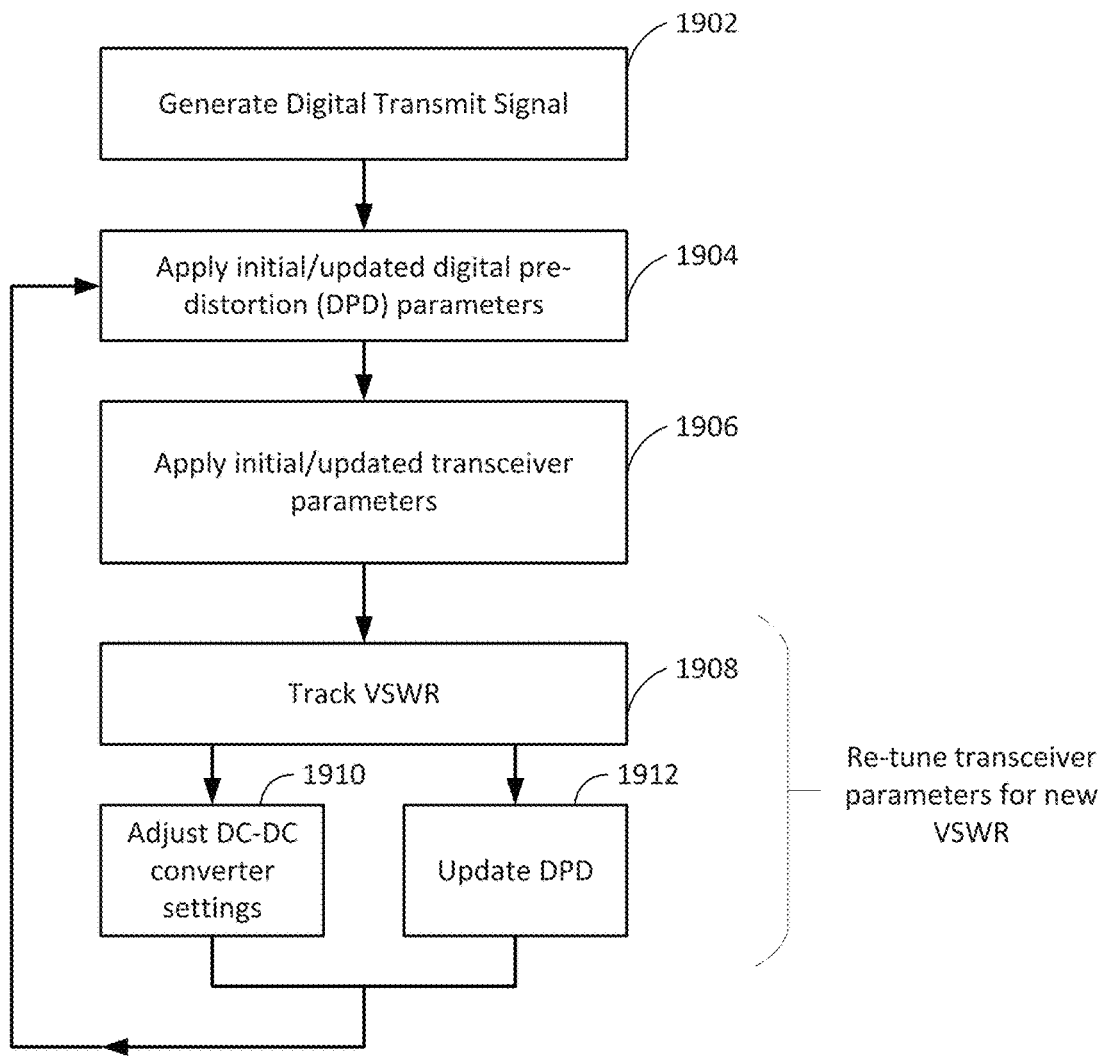
FIG. 19 illustrates a process flow for voltage standing wave ratio (VSWR) correction and collaboration with a digital pre-distortion (DPD) front end module, in accordance with an aspect of the disclosure.

FIG. 19 illustrates a process flow for voltage standing wave ratio (VSWR) correction and collaboration with a digital pre-distortion (DPD) front end module, in accordance with an aspect of the disclosure. In an aspect, the process flow 1900 may be implemented via one more portions of the transceiver design 1500 as shown and described herein with reference to FIG. 15. Although the process flow 1900 is described herein with reference to the transmission of a signal, this is by way of example and not limitation. The aspects described herein may include the modification of various DPD coefficients and/or transceiver parameters associated with each transceiver slice implemented as part of the transceiver architecture as discussed herein, which may be utilized as part of the receiver chain and/or the transmit chain components.

For example, as shown in FIG. 15, each transceiver slice 1504.1-1504.N may implement a slice DFE 1522, 1510 within each of the receive and transmit paths, respectively. In an aspect, the process flow 1900 may be performed via any suitable combination of processing circuitry and/or other suitable components implemented by the common DFE 1502 and/or the shared DFEs 1510, 1522 associated with each respective transceiver slice 1504. For example, the slice DFEs 1510, 1522 may further modify, update, override, and/or adjust the DPD coefficients and/or transceiver parameters initially established by the common DFE 1502.

As shown in FIG. 19, the process flow 1900 may begin with the generation of a digital transmit signal (block 1902). This may include, for instance, the calculation of digital data as shown in FIG. 15, which may be performed by a modem or other suitable signal processing component coupled to the common DFE 1502. Thus, the digital transmit signal may represent a digital data bitstream that is processed first by the common DFE 1502, which applies an initial or common DPD correction to the digital transmit signal and then redistributes the digital transmit signal with the DPD corrections (e.g., the "digital TX data") to each transceiver slice 1504.1-1504.N via the slice DFEs 1510, 1522, as shown in FIG. 15. The application of the initial DPD correction via the common DFE 1502 may be performed using pre-calibrated information, for example.

Again, each of the transceiver architecture 1500 includes a dedicated DFE slice 1510, 1522 for each transmit and receive path, as well as a dedicated DC-DC converters 1520.1-1520.N implemented within each transceiver slice 1504. Thus, aspects include each transceiver slice further modifying the settings of the transceiver components and/or providing further DPD correction to the transmit (or receive) signal (which may already have some DPD correction via the shared DFE 1502 in the case of a transmit signal). Therefore, process flow 1900 includes an initial application of DPD parameters for the initial transmission of data via the phased array using each of the transceiver slices 1504.1-1504.N (block 1904). This may include, for instance, initializing each of the transceiver slices 1504 for data transmission in accordance with the settings of the pre-set codebook.

Moreover, aspects include the process flow 1900 further applying, via each transceiver slice 1504, initial transceiver parameters (block 1906). These additional transceiver parameters may be separate from the DPD applied by the DFE slices 1510, 1522 associated with each transceiver slice 1504 (and/or the common DFE 1502). For instance, the initial transceiver parameters may include various transceiver component settings for each transceiver slice 1504 to use when transmitting each respective DPD-corrected digital transmit signal. The initial transceiver parameters may also be designated by the stored pre-set codebook, and may include any suitable component settings that may be adjusted at each transceiver slice 1504 to improve system performance. Examples of these transceiver parameters include initial amplifier bias conditions, phase shifter settings, the gain required by each of the transceiver slices 1502 based on the type of signal that needs to be transmitted (e.g., modulation type, waveform, signal bandwidth, etc.) at what frequency band, and in which direction (e.g., amplitude tapering parameters).

Again, as shown in FIG. 15, each of the transceiver chains 1504.1-1504.N may include any suitable number of feedback components $FC_1$-$FC_N$. In various aspects, these feedback components may include power monitoring circuitry such as couplers, power detectors, etc. Such power monitoring circuit components may be implemented within the transmit and/or receive paths of each transceiver slice 1504, and may include any suitable type of known circuit components to facilitate the measurement of power in the forward and backward direction for each respective path.

These power monitoring circuit components may enable the slice DFEs 1510, 1522 within each transceiver slice 1504 (or other suitable components of the transceiver architecture 1500 such as the shared DFE 1502, for instance) to monitor the forward and reverse power in the transmit path for each transceiver slice 1504 during signal transmission. These measurements may facilitate the calculation and tracking of VSWR between each transmitting transceiver slice 1504 and its coupled antenna within the phased array during transmission (block 1908). In other words, the VSWR between the outputs of the amplifiers and the antennas at each transceiver slice 1504 may be calculated using numerical values derived from the forward and reverse power measurements in a known manner.

In an aspect, if the monitored VSWR changes unexpectedly or exceeds a predetermined threshold, the bias of that particular transceiver chain amplifier may be adjusted to compensate. In an aspect, this may be implemented via the slice DFEs 1510, 1522 within each transceiver slice 1504 (or other suitable components of the transceiver architecture 1500 such as the shared DFE 1502, for instance) adjusting the setting of the DC-DC converter that supplies power to the amplifier on that particular transceiver slice (block 1910). In doing so, the DC-DC converter may bias the amplifier with an adjusted DC voltage value.

Aspects also include the slice DFEs 1510, 1522 within each transceiver slice 1504 (or the shared DFE 1502, etc.) simultaneously, prior to, or after the DC-DC converter setting adjustment, using the VSWR calculation (block 1908) to update the initial DPD parameters (block 1912). Doing so may alter the signal pre-distortion of the signal to be subsequently transmitted to correct for amplifier non-linearities. Thus, aspects include a VSWR re-tuning compensation being performed at one or more of the transceiver slices 1504. This re-tuning process may include adjusting the supply power provided by the DC-DC converters 1520 on one or more transceiver chains 1504 and the application of updated DPD via each slice DFE 1510, 1522 on one or more transceiver chains 1504 to re-tune the power amplifiers with adjusted bias settings while adjusting the amplifier performance for the new VSWR. This overall re-tuning process advantageously facilitates the transmission of improved quality signals while utilizing a lesser amount of DC power. As shown in FIG. 19, process flow 1900 includes dynamically re-tuning the transceiver chains 1504 by repeating this process over time as changes in the VSWR value are detected. Of course, aspects are not limited to performing both the transceiver parameter updates and the DPD parameter updates in response to the tracked VSWR changes, and aspects include performing either the transceiver parameter updates or the DPD parameter updates independently from one another, or performing one and not the other.

The tuning procedure shown in FIG. 19 is with respect to detected VSWR changes, and is one example of the dynamic tuning process that may be enabled using the dedicated DC-DC converter transceiver slice architecture described in this Section. However, other aspects includes dynamically tuning transceiver slice components to compensate for other conditions that may not be considered during factory calibration. For instance, the amplifier bias supplied by each dedicated DC-DC converter 1520 may provide temperature compensation per each transceiver slice 1504, taking into account aperture tapering and the location of each antenna element within the phased array die. For example, centrally-located amplifiers are typically hotter than amplifiers located at the edge of the die. This temperature difference may result in performance differences between antenna elements in terms of Pout, Gain, noise figure, noise factor, error vector magnitude (EVM), etc.

As an illustrative example, the transceiver architecture 1500 as shown in FIG. 15 may be implemented on a chip or die. The feedback components $FC_1$-$FC_N$ may include multiple temperature sensors to track temperatures at various locations during normal operation. The aspects described herein additionally or alternatively enable each dedicated DC-DC converter to adjust the amplifier bias of each transceiver slice (e.g., via the slice DFEs 1510, 1522 within each transceiver slice 1504, the shared DFE 1502, etc.), using a temperature reading from a relevant sensor located in proximity to that particular transceiver chain 1504, thereby compensating for temperature variations between the different transceiver slices.

The aspects described herein may also utilize the dedicated DC-DC power converters to compensate for degrading transceiver array performance when individual components fail or are shut down because they exceed a maximum operating temperature threshold, which may occur during operation of transceivers as a safety measure. For example, the feedback components $FC_1$-$FC_N$ may include multiple voltage/current sensors at various die locations. Aspects include using tracked data obtained via the multiple temperature, voltage, and/or current sensors to adjust the bias settings provided by the dedicated DC-DC converters 1520.1-1520.N.

For example, if a particular transceiver slice 1504 component (e.g., a power amplifier) exceeds a temperature threshold, the DC-DC converter 1520 may temporarily shut off this component, whereas the other transceiver slice power amplifiers may continue to function in accordance with the bias supplied by each dedicated transceiver slice DC-DC converter. Additionally, if a transceiver slice 1504 begins to fail (e.g., draws current exceeding a predetermined threshold value), or one or more measured voltage values are outside a predetermined operating range of voltage values, then that component may be turned off by via that component's respective DC-DC converter 1520 switching off the DC supply power.

Figure 20A:
FIG. 20A illustrates a simulated far-field radiation pattern for a 4×4 antenna array without element failure, in accordance with an aspect of the disclosure.
Figure 20B:
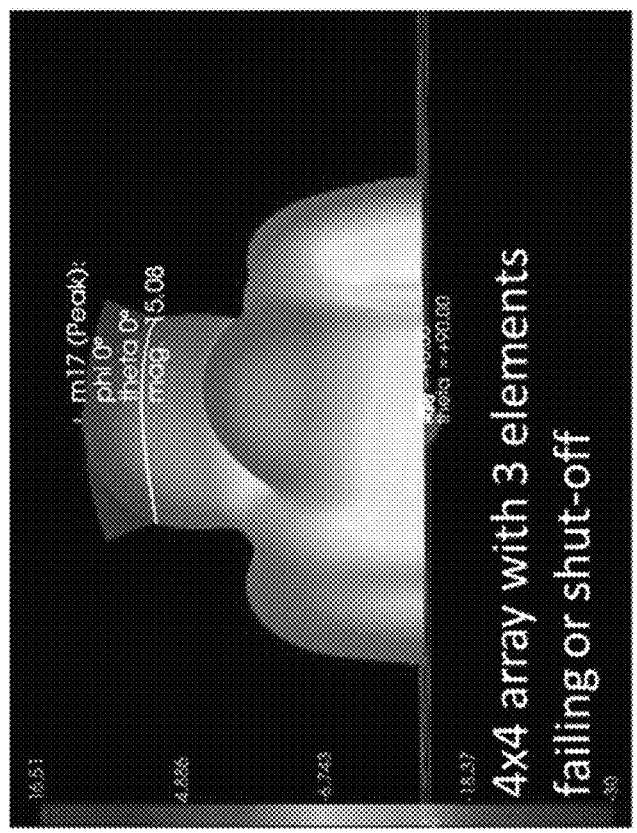
FIG. 20B illustrates a simulated far-field radiation pattern for a 4×4 antenna array associated with 3 elements failing or being deactivated.

In doing so, aspects include reducing the effect of a failed transceiver slice (or a transceiver slice being temporarily shut down) by adjusting the DC-DC converters for other transceiver slices to thereby adjust the individual performance of adjacent transceiver slices. Without the fine granularity of control facilitated by the dedicated DC-DC converter aspects described herein, such correction would not be possible. Again, losing individual elements in the array can cause errors in pointing angle and increases in side-lobes. An example of the impact of lost or failed elements on the radiation pattern is shown in FIG. 20A-20B. In particular, FIG. 20A illustrates a 4×4 antenna array that is fully operational, whereas FIG. 20B illustrates the same 4×4 antenna array with 3 elements failing or turned off. As shown in FIG. 20B, this 3 element failure results in a loss of 1.5 dB in gain, as well as a significant distortion of the radiation pattern.

Figure 21:
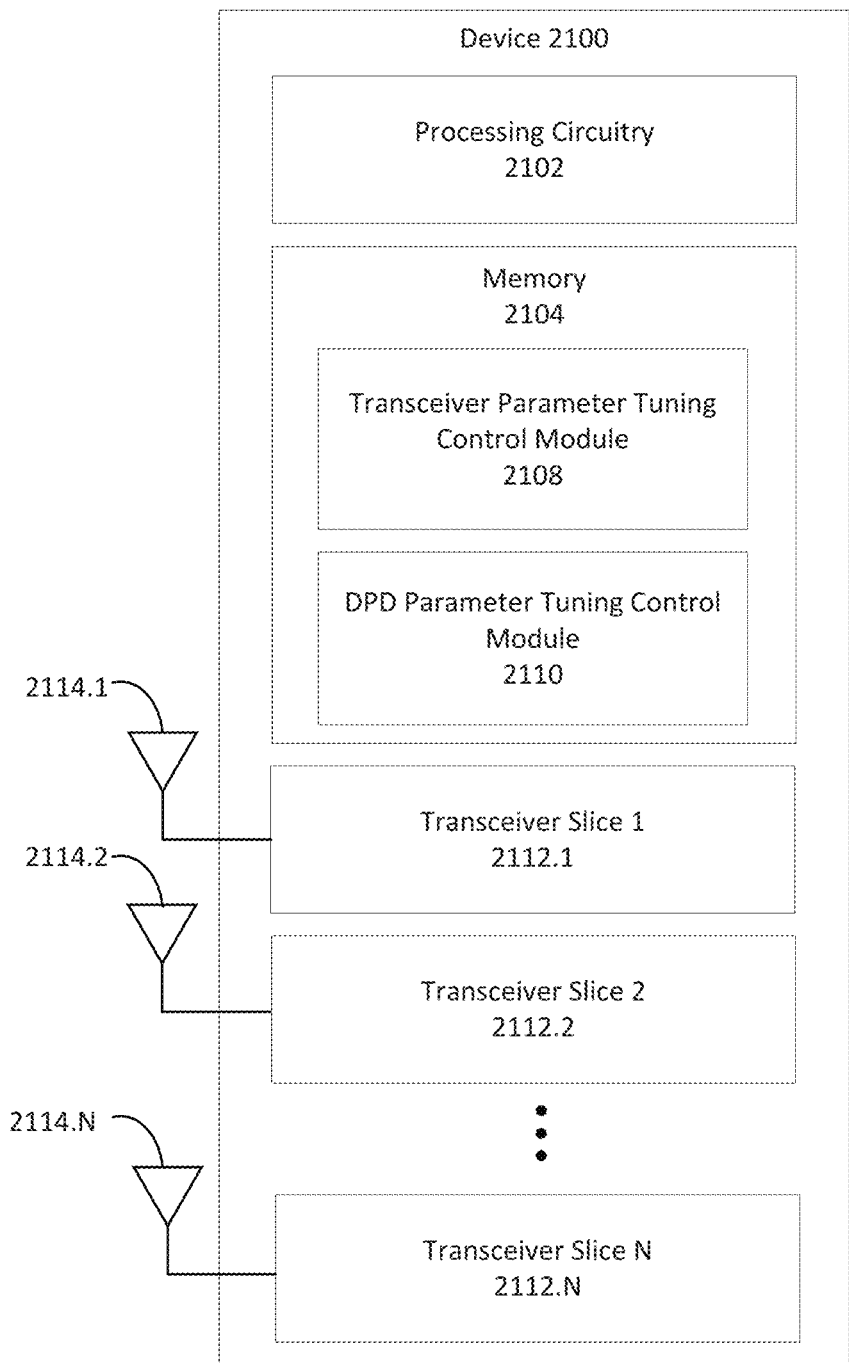
FIG. 21 illustrates a block diagram of an exemplary device, in accordance with an aspect of the disclosure.

FIG. 21 illustrates a block diagram of an exemplary device in accordance with an aspect of the disclosure. In various aspects, device 2100 may be implemented as any suitable type of device configured to transmit and/or receive wireless signals in accordance with any suitable number and/or type of communication protocols. For instance, the device 2100 may be implemented as a user equipment (UE) such as a mobile phone, tablet, laptop computer, etc. To provide additional examples, the device 2100 may be implemented as an access point or base station. The device 2100 may implement one or more aspects as described herein to facilitate transmitting wireless signals in accordance with a particular frequency or band of frequencies, such as mm-Wave frequencies, for example, as further described herein.

As referenced further in this and the other Sections, the term "mm-Wave frequency," which the aspects described in this Section as well as others may operate, may include, for example, frequencies and frequency bands above 20 GHz, 24 GHz, 28 GHz, etc., up to an upper frequency. For instance, mm-Wave frequency bands may include frequencies ranging from 20 GHz to 300 GHz, from 24 GHz to 300 GHz, etc. This may include, for instance, the various bands known to be associated with or otherwise referred to as mm-Wave frequency bands such as 24 GHz, 28 GHz, 37 GHz, 39 GHz, 40 GHz, 47 GHz, 60 GHz, etc.

In an aspect, the device 2100 may include processing circuitry 2102, a memory 2104, and any suitable number N of transceiver slices or chains 2112.1-2112.N, each being coupled to one or more respective antennas 2114.1-2114.N. The components shown in FIG. 21 are provided for ease of explanation, and aspects include device 2100 including additional, less, or alternative components as those shown in FIG. 21. For example, device 2100 may include one or more power sources, display interfaces, peripheral devices, ports, etc.

In an aspect, the various components of device 2100 may be identified with functionality further described herein with reference to the dynamic application of DPD and/or transceiver parameters. Each of the transceiver slices 2112.1-2112.N may be identified with a respective one of the transceiver slices 1504.1-1504.N discussed, for example, with reference to the transceiver design 1500 as shown in FIG. 15. Thus, aspects include each of the transceiver slices 2112.1-2112.N implementing its own dedicated DC-DC converter to provide a supply voltage to each of the transceiver components integrated as part of each respective transceiver slice 2112.

Aspects include the processing circuitry 2102 being configured as any suitable number and/or type of computer processors, which may facilitate control of the device 2100 as discussed herein. In some aspects, processing circuitry 2102 may be identified with a baseband processor (or suitable portions thereof) implemented by the device 2100. In other aspects, the processing circuitry 2102 may be identified with one or more processors implemented by the device 2100 that are separate from the baseband processor (e.g., one or more digital signal processors, one or more processors associated with a shared DFE 1502 and/or a transceiver slice DFE 1510, 1522, etc.). In still other aspects, the functionality of the device 2100 may be combined with that discussed herein with reference to the device 1400, which in turn may have functionality combined with that discussed herein with reference to device 1000, as discussed above. Additionally or alternatively, aspects include the various functions discussed herein with reference to device 2100 being performed by one or more components associated with device 1400 and/or the device 1000.

In any event, aspects include the processing circuitry 2102 being configured to carry out instructions to perform arithmetical, logical, and/or input/output (I/O) operations, and/or to control the operation of one or more components of the device 2100. For example, the processing circuitry 2102 can include one or more microprocessors, memory registers, buffers, clocks, etc. Moreover, aspects include processing circuitry 2102 communicating with and/or controlling functions associated with the memory 2104 and/or the transceiver slices 2112.1-2112.N.

This may include, for example, controlling and/or arbitrating transmit and/or receive functions of the device 2100, facilitating the measurement of data provided by the various feedback components discussed herein, and using the measured data obtained via the feedback components to adjust the supply bias provided by the DC-DC converters and/or the DPD parameters, as discussed herein. Additionally, processing circuitry 2102 may facilitate the calculation of the initial transceiver parameters, adjusted transceiver parameters, and/or the initial and/or adjusted DPD parameters for one or more of the one or more transceiver slices 2112, controlling the state of the device 2100 to operate in a receiving mode or a transmit mode, performing one or more baseband processing functions (e.g., media access control (MAC), encoding/decoding, modulation/demodulation, data symbol mapping, error correction, etc.), identifying groupings of transceiver slices for DPD management, as well as any other suitable functions to carry out the functionality associated with the aspects as described herein.

In an aspect, the memory 2104 stores data and/or instructions such that, when the instructions are executed by the processing circuitry 2102, the processing circuitry 2102 performs the various functions described herein. The memory 2104 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 2104 can be non-removable, removable, or a combination of both.

For example, the memory 2104 may be implemented as a non-transitory computer readable medium storing one or more executable instructions such as, for example, logic, algorithms, code, etc. As further discussed below, the instructions, logic, code, etc., stored in the memory 2104 are represented by the various modules as shown in FIG. 21, which may enable the aspects disclosed herein to be functionally realized. The modules shown in FIG. 21 are provided for ease of explanation regarding the functional association between hardware and software components. Thus, aspects include the processing circuitry 2102 executing the instructions stored in these respective modules in conjunction with one or more hardware components to perform the various functions associated with the aspects as further discussed herein. Again, the modules shown in FIG. 21 are for ease of explanation with regards to the aspects described in this section of the disclosure.

In an aspect, the executable instructions stored in the transceiver parameter tuning control module 2108 may facilitate, in conjunction with the processing circuitry 2102, the device 2100 adjusting the DC-DC converter settings of one or more of the dedicated per-transceiver chain DC-DC converters implemented within the transceiver slices 2112.1-2112.N. This may include, for example, generating appropriate control signals that are transmitted to one or more of the DC-DC converters via a suitable communication medium and protocol. These control signals may, in response, cause each DC-DC converter change an aspect of operation. For example, the control signals may adjust DC-DC converter settings to modify the output supply voltage for specific transceiver chains 2112, as discussed herein. To provide another example, the control signals may place one or more of the DC-DC converters into an off state, or re-activate a DC-DC converter that was previously placed into an off state into an on state.

Again, the DC-DC converter settings may be adjusted in various ways to adjust transceiver parameters associated with one or more of the transceiver chains 2112. Thus, the term "transceiver parameters" as used herein may refer to any type of transceiver component settings that may be modified as a result of changes to the DC-DC converter settings or state. For example, the DC-DC converter settings for specific transceiver chains 2112.1-2212.N may be adjusted to change the amplifier bias settings to compensate for various external factors such as VSWR mismatch or temperature, to comply with codebook settings for a desired amplitude taper, to compensate for lower performing PAs, to modulate the amplifier bias settings to track a modulation envelope, etc. This may additionally or alternatively include adjusting the bias settings of transceiver components other than the amplifier, such as mixers, for example.

In an aspect, the transceiver parameters may be adjusted to achieve a desired result based upon the measurements provided via the feedback components as discussed herein. This may include, for instance, the use of a lookup table (LUT), algorithm, etc., stored in the memory 2104 or otherwise accessible to the processing circuitry 2102. For example, a LUT or algorithm may define sets of bias settings for each transceiver slice 2112 based upon particular detected conditions, such that the desired, adjusted transceiver parameters may be correlated or otherwise derived from the measurement data obtained via the feedback components.

In an aspect, the executable instructions stored in the DPD parameter tuning control module 2110 may facilitate, in conjunction with the processing circuitry 2102, the device 2100 performing various functions related to DPD parameter calculation and application to baseband signals. For example, aspects include the executable instructions stored in the DPD parameter tuning control module using the measurements provided via the feedback components as discussed herein related to non-linearity mismatches, temperature mismatches, VSWR mismatches, etc., or other mismatched characteristics among the transceiver slices 2112.1-2112.N. Moreover, the executable instructions stored in the DPD parameter tuning control module 2110 may enable the processing circuitry 2102 to determine whether the common DFE 1502 or the individual transceiver slice DFEs (e.g., DFEs 1510, 1522) should calculate and/or apply the DPD parameters at each transceiver slice 2112. In any event, the executable instructions stored in the DPD parameter tuning control module may facilitate the processing circuitry 2102 adjusting the initial DPD parameters (e.g., those provided at pre-factory calibration and/or those provided by the common DFE 1502) to realize per-transceiver chain DPD correction, as discussed herein.

In an aspect, like the transceiver parameters, the DPD parameters may also be adjusted to achieve a desired result based upon the measurements provided via the feedback components as discussed herein. This may include, for instance, the use of a lookup table (LUT), algorithm, etc., stored in the memory 2104 or otherwise accessible to the processing circuitry 2102. For example, a LUT or algorithm may define DPD coefficients for each transceiver slice 2112 based upon particular detected conditions or mismatches, such that the desired, adjusted DPD parameters may be correlated or otherwise derived from the measurement data obtained via the feedback components.

Although several examples discussed herein are provided with respect to the transmit paths associated with each transceiver slice, this is by way of example and not limitation. The aspects described herein may be equally applicable to any suitable components within the transmit or the receive paths within each individual transceiver slice, which may utilize the same DC-DC converter on the same transceiver chain or different DC-DC converters (e.g., 2 DC-DC converters per transceiver slice). In aspects in which a single DC-DC converter is used, the DC-DC converter settings may be adapted further when switching between the transmit and the receive modes. For instance, the amplifier biasing discussed herein with respect to the PA 1517 may also be applied to the amplifier 1516 within the receive path circuitry as shown in FIG. 15, to bias the amplifier 1516 to match a codebook setting or for any other suitable reasons as discussed herein with respect to the transmit path circuitry. As another example, the aspects described herein may be used to track the VSWR between the antenna and the receive amplifier 1516 and to adjust the bias of the amplifier 1516 to compensate for VSWR mismatches.

Section IV—Adaptive Spatial Filtering and Optimal Combining of ADCS to Maximize Dynamic Range in Digital Beamforming Systems Aspects described in this Section generally relate to radio receivers and, more particularly, to a radio receiver architecture implementing adaptive spatial filtering.

Compared to conventional phased arrays, in which the signals from multiple antenna elements are combined with gain and phase shifts in the RF or analog domain, digital beamforming requires the replication of a complete transceiver chain per antenna element with signal combining only in the digital domain. This replication of hardware results in higher power dissipation, and requires additional gain stages to maintain the level plan because there is no array gain in the RF stages.

Again, conventional digital beamforming solutions results in higher power dissipation. Further adding to this issue, because each transceiver chain is omnidirectional, conventional receivers offer no immunity to spatial blockers. As a result, each complete transceiver chain is required to support a higher effective dynamic range, with the greatest impact being with regards to the data-converters. The higher dynamic range required in each chain, when combined with the additional circuitry, results in a significant increase in power dissipation.

For some communication protocols, such as those implementing mm-Wave communication frequencies, for example, digital beam-forming (DBF) allows a system to fully exploit certain benefits offered by the mm-Wave bands. Specifically, full DBF radios are expected to be able to form and independently control multiple simultaneous beams to support connections to multiple UE and/or base-stations. This is a required feature to support vehicle-to-vehicle networks for autonomous vehicles and drones. It is also a key component for base-station solutions. In addition, multi-beam capability will facilitate fast beam acquisition and tracking, especially of moving objects. Multiple, independently-controlled simultaneous beams may also be useful when implemented for diversity in the uplink and downlink. For example, secondary beams can scan for a better link direction in parallel while maintaining the connection through the primary beam.

Digital beamforming has still not been deployed in commercial systems despite its system level benefits, mainly due to the significant power penalty and the challenge of meeting stringent blocker scenarios. With regards to mm-Wave systems in particular, conventional mm-Wave systems typically implement phased arrays. Such conventional phased arrays create a single TX or RX beam that can only be sequentially switched to different directions, resulting in slower acquisition and hand-offs, and limiting the number of users that can be supported simultaneously.

As referenced further in this and the other Sections, the term "mm-Wave frequency," which the aspects described in this Section as well as others may operate, may include, for example, frequencies and frequency bands above 20 GHz, 24 GHz, 28 GHz, etc., up to an upper frequency. For instance, mm-Wave frequency bands may include frequencies ranging from 20 GHz to 300 GHz, from 24 GHz to 300 GHz, etc. This may include, for instance, the various bands known to be associated with or otherwise referred to as mm-Wave frequency bands such as 24 GHz, 28 GHz, 37 GHz, 39 GHz, 40 GHz, 47 GHz, 60 GHz, etc.

Other approaches to implementing a beamforming system include the so-called "brute force implementation," which aims to perform an exhaustive signal search using a large combination of steered beam directions. This technique, however, suffers from power overheads resulting from the need for one mixer and one data converter per antenna element. As explained above, each receive chain, and particularly each data converter, needs to support a higher dynamic range due to the absence of any spatial selectivity in the RF and analog sections of the transceiver and the missing array gain from the RX line-up/level plan. This further magnifies the power dissipation penalty.

With these future developments and the advantages of digital beamforming in mind, the aspects presented in this Section of the disclosure are directed to methods that address these issues by optimally combining the signals from each element to implement DBF systems with suppression of spatial blockers and a relaxation of dynamic range in each transceiver chain. In particular, the aspects described in this Section address the dynamic range constraints that currently present issues for digital beamforming systems in various ways. First, dynamic range may be addressed by performing a multi-element estimation of the RX signal in an adaptive spatial filter to suppress the correlated ADC quantization noise. Second, coarse sectorized scans may be performed in different directions simultaneously (in parallel) to detect spatial blockers. Third, the detected spatial blockers, either through low-latency feedback around the ADC or through feedforward coupling between multiple RX elements, may function to provide blocker signal attenuation and/or nulling in specific spatial directions.

As discussed in further detail throughout this Section, some advantages from the aspects as described include fast beam acquisition and tracking, simultaneously supporting of multiple beams, as well as nulling interferers. Moreover, to enable mm-Wave communications in mobile devices and base-stations, it is paramount to have a very low power consumption (battery life, thermals etc.). The aspects as described in this Section allow this to be achieved together with the other aforementioned advantages.

Figure 22:
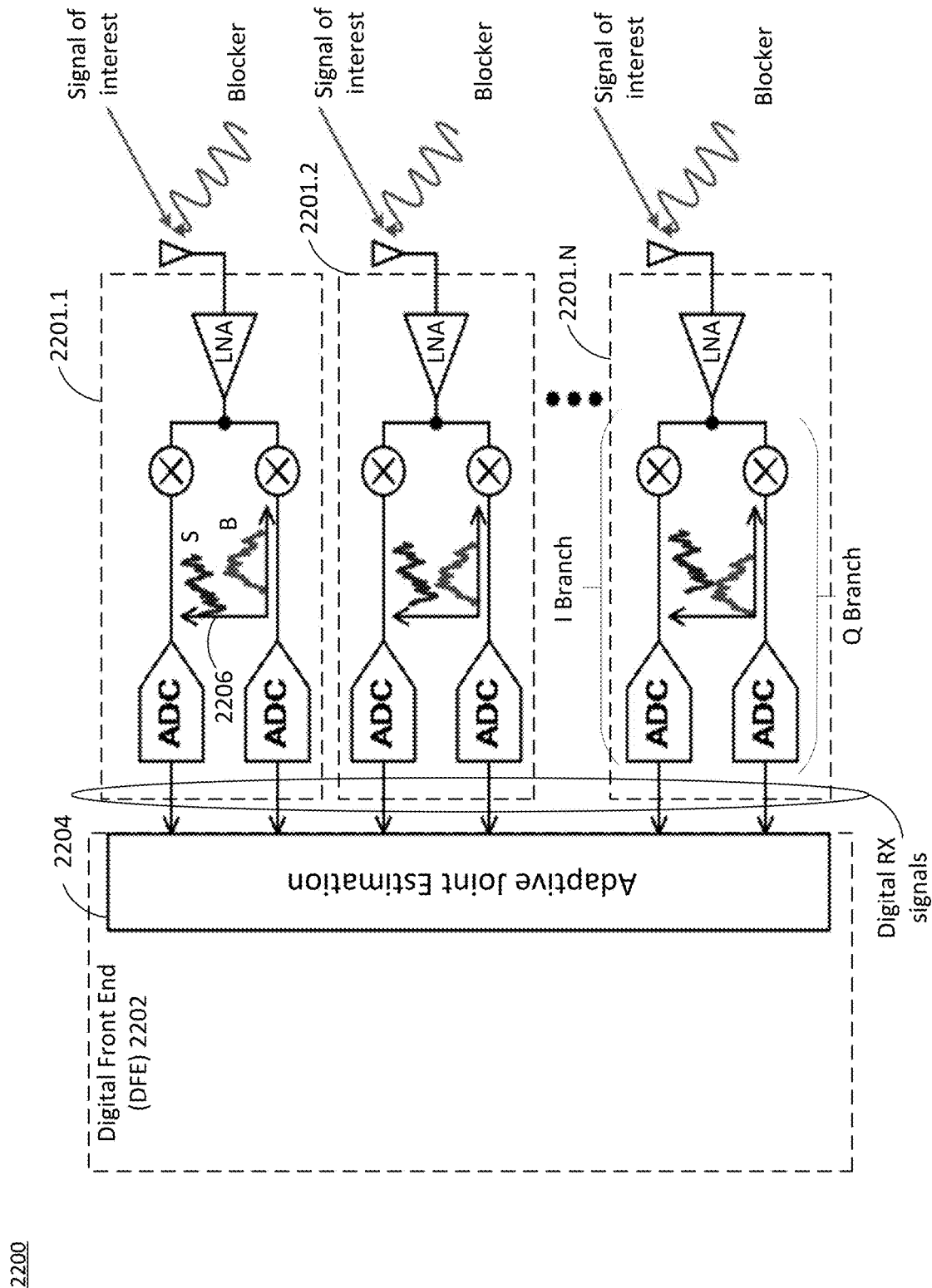
FIG. 22 illustrates a block diagram of an exemplary receiver design using multi-element joint estimation of received (RX) signals in an adaptive spatial filter, in accordance with an aspect of the disclosure.

FIG. 22 illustrates a block diagram of an exemplary receiver design using multi-element joint estimation of received signals in an adaptive spatial filter, in accordance with an aspect of the disclosure. The receiver design 2200 as shown in FIG. 22 may form part of a larger overall receiver design, and may additionally or alternatively form part of a larger overall transceiver design. For example, the receiver design 2200 may be a portion of the transceiver designs as discussed herein with reference to the other Sections 1-3. In an aspect, the receiver design 2200 may include any suitable number N of receive chains 2201.1-2201.N, with each receive chain 2201 being implemented within a separate transceiver chain. Moreover, aspects include each of the receive chains 2202.1-2202.N being implemented as part of a separate transceiver slice in a transceiver design that utilizes a transceiver slice architecture, as discussed above in one or more of Sections 1-3.

As an illustrative example, each of the receiver chains 2201.1-2201.N may be implemented as a receive chain associated with each respective one of transceiver slices 1504.1-1504.N, as shown and discussed in Section 3 above with reference to FIG. 15. In other words, receive chain 2201.1 may be implemented as the receive chain associated with the transceiver slice 1504.1, receive chain 2201.2 may be implemented as the receive chain associated with the transceiver slice 1504.2, etc. To provide additional examples, each of the receive chains 2201.1-2201.N may be implemented as a receive chain associated with each respective one of transceiver chains 1012.1-1012.N, as shown and discussed in Section 1 above with reference to FIG. 10. As another example, each of the receiver chains 2201.1-2201.N may be implemented as a receive chain associated with each respective one of transceiver slices 1412.1-1412.N, as shown and discussed in Section 2 above with reference to FIG. 14. Of course, the aspects described in the other Sections 1-3 may or may not be combined with the functionality as discussed in this Section, in various aspects.

The receiver design 2200 as shown in FIG. 22 omits several connections and components for ease of explanation. Thus, the receiver design 2200 aspects as described herein may include additional, less, or alternate components as those shown in FIG. 22 and elsewhere in the present disclosure.

As shown in FIG. 22, each receive chain 2201.1-2201.N is coupled to a respective antenna, which is then coupled to a respective low-noise amplifier (LNA). The output of the LNA within each receive chain 2201 is further coupled to a respective in-phase (I) and quadrature (Q) phase branch. Each I and Q branch includes a mixer that may be coupled to a local oscillator (not shown) for the downconversion of received signals to baseband (or another suitable lower frequency). The ADC within each of the I and Q branches is configured to convert the downconverted received signals to digital signals (e.g., a digital data stream) that are subsequently processed via a digital front end (DFE) 2202. In various aspects, each of the ADC's within each of the receive chains 2201.1-2201.N may be implemented in any suitable manner to provide a digital output to the DFE 2202. For example, the ADCs may be implemented successive approximation (SAR), sigma-delta, pipeline, flash ADCs, etc., so as to support sufficiently wide channel bandwidths.

In various aspects, the adaptive joint estimation circuitry block 2204 may be implemented with any suitable combination of processing circuitry and/or software implemented by the DFE 2202, which may include execution of a suitable algorithm to perform the relevant functions described throughout this Section. The DFE 2202 may include any suitable number and/or type of components configured to perform functions known to be associated with digital front ends. For example, the DFE 2202 may be implemented as processing circuitry, portions of processing circuitry, one or more portions of an on-board chip having dedicated digital front end functionality (e.g., a digital signal processor), etc. For example, the DFE 2202 may receive digital baseband data (e.g., the digital RX signals as shown) from each of the receive chains 2201.1-2201.N, which may be processed to recover data included in wireless data transmissions. The DFE 2202 may perform other functions not shown or discussed herein for purposes of brevity, such as wireless data transmission functions, for example. Alternatively, the DFE 2202 may be implemented as one of the DFEs discussed in one of the previous Sections 1-3. To provide an illustrative example, the adaptive joint estimation block 2202 may be part of a DFE 2202 that is similar or identical to the DFE 1502, as shown and described in Section 3 with reference to FIG. 15.

Moreover, the DFE 2202 may be integrated with one or more other components of the receiver design 2200 to form part of a common IC (e.g., an RFIC), or these components may be located on separate chips. As an illustrative example, the DFE 2202 and one or more of the receive chains 2201.1-2201.N may be integrated onto a common RFIC, which may be particularly useful to address signal bandwidth and latency that may otherwise be present when these components are located on separate chips. This may likewise be the case for the DFEs and other components discussed elsewhere throughout this Section as well as the other Sections. For instance, the sectorized scanning circuitry block 2304 and blocker extraction circuitry block 2306 may be integrated as part of a DFE that is part of the same IC as the receive chains 2301.1-2301.N, as discussed with reference to FIG. 23A. As another example, the DFE circuitry block 2404 may be integrated as part of a DFE that is part of the same IC as the receive chains 2401.1-2401.N, as discussed with reference to FIG. 24.

For a digital beamforming solution, each of the antennas as shown in FIG. 22 may be omnidirectional and thus not discriminate signals received in one direction from those received in another direction. In other words, each individual antenna element may be omnidirectional, with the beamforming accomplished as an aggregate function of gain and phase shifting that is obtained as a result of digital processing in the DFE 2202. As a result of the omnidirectional nature of each antenna element, the antenna element of each receive chain 2201.1-2021.N may receive a desired signal of interest from one direction (e.g., the main beam direction) and receive a blocker signal in a different direction. These blocker signals may be associated with various sources of signal interference independent of the signal of interest, and may have frequencies that are very close to the signal of interest (e.g., co-channel), but are often mostly stationary with respect to the receiver design 2200. This fact may be exploited as further discussed below to facilitate adaptive spatial filtering.

In contrast, traditional digital beamforming systems do not implement spatial filtering, and co-channel asynchronous spatial blockers, which may include the example blocker signals as shown in FIG. 22, remain largely unfiltered. In addition, in fully digital beamforming systems, the array gain associated with combining the signal from multiple antenna elements occurs in the digital domain, and does not have the benefit of an applied gain in the analog domain, which results in a lower gain in the receive chains. These two issues result in the need for more ADCs, each having a higher dynamic range.

The aspects as described in this Section, however, recognize that the RX error vector magnitude (EVM) budget is typically dominated by phase noise and ADC quantization noise. Because each receive chain 2201.1-2201.N receives signals in an omnidirectional manner to support digital beamforming, each receive chain 2201 will receive correlated signals with unknown, signal dependent delays. And, even though ADC quantization noise is often modeled as an additive uniform noise, the aspects as described herein exploit the fact that this results from the non-linear characteristic of the ADC quantizer. Therefore, the ADC quantization noise is signal dependent, and since the ADCs see correlated signals, their quantization noise is also correlated.

For example, each receive chain 2201.1-2202.N is shown receiving a desired signal of interest (S) and a blocker signal (B), which may be received at each antenna element at a different angle of arrival. Although these signals would each be summed in each of the I and Q branches within each receive chain 2201, for clarity FIG. 22 illustrates two separate signals in the signal graph 2206. The signal graph 2206 may correspond to either the I or the Q branch as an example and illustrates that, for each receive chain 2201.1-2201.N, the desired signal and the blocker signal may have different delays with respect to one another within a single receive chain 2201 as well as with respect to the other receive chains 2201, which is dependent upon the different incident angles of the desired signal and the blocker signal at each antenna element and the physical location of each antenna element relative to one another.

In other words, each of the receive chains 2201.1-2201.N receives the desired signal A and the blocker signal B with a different delay, which is dependent upon the angle of arrival of each particular signal. Continuing this example, the desired signal is shown in each signal graph 2206 as having a greater delay while progressing from receive chains 2201.1 to 2201.N, with the receive chain 2201.1 first receiving the signal S and the receive chain 2201.1 being the last to receive the signal S. The opposite is true for the blocker signal B in this example, with the receive chain 2201.N being the first to receive the blocker signal B and the receive chain 2201.1 being the last to receive the blocker signal B. In general, this time relationship is dependent upon the angle of arrival of the two signals at each antenna element associated with each receive chain 2201.1-2201.N, but the delays associated with the desired signal S and the blocker signal B with respect of one receive chain to another are not generally known a priori.

However, although the delays between each of the receive chains 2201.1-2201.N are unknown, each antenna element operates in an omnidirectional manner, meaning each receive chain 2201.1-2201.N is receiving essentially the same signals with the exception of a (unknown) time-shifted delay among each one. Thus, in an aspect, the adaptive joint estimation circuitry block 2204 receives digital RX data signals from each of the ADCs associated with the receive chains 2201.1-2201.N in parallel. The RX data signals received in this manner include a combination of both the desired signal S and the blocker signal B received at each receive chain 2201. In accordance with this aspect, the adaptive joint estimation circuitry block 2204 is configured detect both the signal S and the blocker signal B together while removing the blocker signal.

For ease of explanation, a hypothetical example is provided in which the delay between the desired signal S and the blocker signal B is known for each of the receive chains 2201.1 and 2201.2, as well as the delay for the desired signal S and the blocker signal S from one receive chain 2201.1-2201.N to another. In such a case, a time shift may be introduced as part of the processing of the digital RX signals (i.e. the digital samples) received from the ADCs in receive chain 2201.1 for each of the desired signal S and the blocker signal B, with the results being independently correlated to the actual received RX signals provided by the ADCs of receive chain 2201.1. These two sets of correlations, respectively, amplify the desired signal in one case and amplify the blocker signal in the other case. This correlation could thus be repeated for each receive chain to select a correlation result that amplifies only the desired signal S and not the blocker signal B.

However, as mentioned above, the delays between the desired signal S and the blocker signal B, as well as the delays between each receive chain 2201.1-2201.N are unknown. In this case, the signal delays also need to be estimated for each receive chain 2201.1-2201.N. The aspects described in this Section facilitate this via a joint estimation technique that is performed via the adaptive joint estimation circuitry block 2204. In an aspect, the adaptive joint estimation circuitry block 2204 may estimate, for each receive chain 2201.1-2201.N using the digital RX signals received in parallel from each ADC as shown in FIG. 22, the delays associated with the desired signal S and the blocker signal B. The result of this delay estimation may then be used, for each receive chain 2201.1-2201.N, to correlate the results of performing a phase shift or a time delay to the desired signal S and the blocker signal B to the received digital RX signals received from the ADCs of each respective receive chain 2201.1-2201.N.

That is, because the delay and the correlation each impact one another, the aspects described herein perform the delay and correlation steps together. In an aspect, this may include, for instance, the use of a maximum likelihood estimation (MLE) to determine estimated signal and blocker delays that best correlate to the received digital RX signals received from the ADCs of each respective receive chain 2201.1-2201.N. For example, correlation may be implemented via the adaptive joint estimation circuitry block 2204 for each one of the receive chains 2201.1-2202.N to time shift the desired signal S received via the ADCs for that particular receive chain 2201 using an initial estimated delay, which is then multiplied by the un-shifted version of the same desired signal S at the same receive chain 2201 and integrated over a period of time. The accuracy of each estimated delay that is used to perform the time shift may thus be determined based upon which estimated delay provides a maximum result when multiplied and integrated over each period of time in the manner noted above.

In an aspect, the technique described above may be performed the adaptive joint estimation circuitry block 2204 in parallel with a correlation to each of the other receive chains 2201.1-2201.N. In other words, the estimated delays for the desired signal S and the blocker signal B for each receive chain 2201.1-2201.N may be correlated for each receive chain and with every other receive chain 2201.1-2201.N in a parallel manner. That is, instead of sequentially performing a delay estimation and signal correlation sequentially and individually for each of the receive chains 2201.1-2201.N, the time-shifted version of each desired signal S and blocker signal B may be correlated in parallel (e.g., concurrently) to the (un-shifted) ADC outputs of each other receive chain 2201.1-220.N until a solution is obtained that includes a set of estimated time delays for the desired signal S and the blocker signal B for each one of the receive chains 2201.1-2201.N. This solution set of estimated delays may be obtained by analyzing the results of the receive chain correlations, for instance, in a maximum-likelihood sense to identify the set of estimated delays that results in minimum errors with respect to the distribution of the digital RX signals received via the adaptive joint estimation circuitry block 2204.

The use of correlation via the adaptive joint estimation circuitry block 2204 is but one example of a technique that may be utilized to estimate the signal delays at each receive chain, and is provided herein by way of example and not limitation. Aspects include the adaptive joint estimation circuitry block 2204 adaptively and jointly estimating the delay of the desired signal S and the blocker signal B from each of the receive chains 2201.1-2201.N (as well as jointly estimating the signals themselves together with the estimated delay) in any suitable manner.

Once the set of estimated delays are obtained in this manner, aspects include the adaptive joint estimation circuitry block 2204 canceling the delay associated with the desired signal S and the blocker signal B in each receive chain 2201.1-2201.N. After this is done, the signals received as the digital RX signals from the ADCs of each of the receive chains 2201.1-2201.N will be substantially the same as one another, as the delays are accounted for and the signals are otherwise received via each antenna element in an omnidirectional manner as noted above. This advantageously allows for an improvement in the signal-to-noise ratio of the receiver design 2200.

Furthermore, if the signals received from the different antenna elements are combined in the digital domain by applying gain and phase shifts, then the RX signal-to-noise ratio (SNR) improves by a factor of $\sqrt{\text{Nelem}}$, where Nelem is the number of elements. As further discussed below, the aspects described herein implement a multi-element joint estimation of the received signals in an adaptive spatial filter to exploit the correlation property between the receive chains 2200.1-2201.N, as shown in FIG. 22. Doing so suppresses any correlated noise, such as quantization noise and sampling jitter, for instance. Therefore, the aspects as described in this Section improve the effective ADC resolution while implementing digital beamforming solutions, enabling the use of lower resolution converters in each of the receive chains 2201.1-2201.N. Doing so advantageously lowers the total power dissipation, allowing for the feasible implementation of a full DBF system. For purposes of clarity in this regard, system simulations were performed for different array sizes in accordance with the adaptive joint estimation techniques as described in this section, with the SNR gain from the joint estimation being summarized in Table 1 below.

TABLE 1

| Antennas | Joint Estimation SNR Gain |
|---|---|
| 16 | 14.5 dB |
| 64 | 22.5 dB |

In other words, the aspects as described in this Section utilize a parallel (e.g., concurrently or jointly) estimation of both the desired signal S, the blocker signal B, and the time delay associated with both of these signals, correlating the results with each of the other receive chains 2201.1-2201.N. Doing so exploits the fact that the received signals in the receiver design 2200 are partially correlated to one another, thereby allowing the quantization requirements of the ADCs to be relaxed and the overall power consumption of the receiver may be reduced.

The receiver design 2200 may be configured to direct the main beam toward the signal of interest using information from channel estimation. For example, a short preamble that is part of a communication protocol may include channel estimation information to enable the main beam direction to be calculated. Once the direction of the signal of interest is known, the DFE 2202 may digitally apply gains and phases to the digital RX signals to achieve beamforming of the main beam in this direction. However, the analog-to-digital converters (ADCs) in a DBF can become saturated from blocker signals that are incident from a direction different than the main beam, given that signals are received by the receive chains in an omnidirectional nature as discussed above. Thus, as further discussed below in FIGS. 23A-C and 24, the receiver design aspects described in this Section may enable spatial blocker detection and, once detected, feedback or feedforward correction may be applied to provide spatial filtering.

FIG. 23A illustrates a block diagram of an exemplary receiver design implementing spatial blocker detection with a coarse sector scan, in accordance with an aspect of the disclosure. The receiver design 2300 as shown in FIG. 23 may include any suitable number of receive chains 2301.1-2301.N. The receive chains 2301.1-2301.N may be identical or substantially similar to the receive chains 2202.1-2201.N, as shown and described above with reference to FIG. 22. Thus, only differences between the receive chains 2201 and 2301 are further discussed herein.

The ADCs implemented by each of the receive chains 2301.1-2301.N may be configured to digitize the most significant bit of the downsampled received signal first. The aspects described with reference to FIGS. 23A-23C use a coarse resolution to detect, in parallel, fast envelope signals along directions other than the main beam direction (known from the received packet preamble), and exploit this function of the ADCs to estimate the blocker signal using only the MSB or, alternatively, additional bits following the MSB, to perform a partial cancellation of the blocker signal.

Figure 23B:
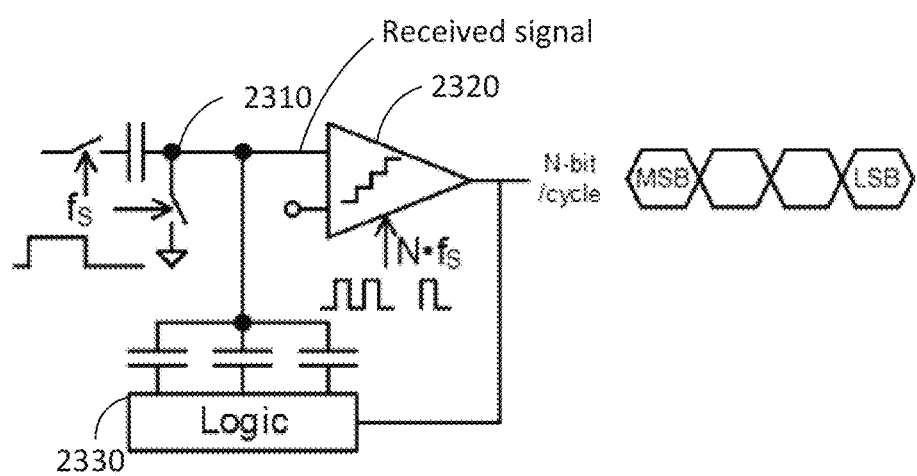
FIG. 23B illustrates a block diagram of an example ADC design, in accordance with an aspect of the disclosure.

To do so, the receiver design 2300 may include sectorized scanning circuitry block 2304 and blocker extraction circuitry block 2306. The sectorized scanning circuitry block 2304 and the blocker extraction circuitry block 2306 may be implemented as part of the DFE 2202, in a similar manner as discussed with reference to the adaptive joint estimation circuitry block 2204. This is explained in further detail with reference to FIGS. 23B-C, which show additional detail of one of the ADCs as shown in FIG. 23A. Thus, the sectorized scanning circuitry block 2304 may facilitate a coarse scanning operation, which may be implemented using a digital parallel rotation scheme as shown in FIG. 23A. The blocker extraction circuitry block 2306 may be configured to analyze the results of the coarse scanning from each ADC in parallel using only the MSB output from one or more ADCs or some suitable number of MSBs output from one or more of the ADCs. Thus, the blocker signal may be estimated from partially-digitized data (e.g., partially digitized as a result of processing only some of the bits output by the ADCs), which represents a coarse estimation of the blocker signal. The blocker extraction circuitry block 2306 may then use the estimation of the blocker signal to provide digital feedback to each of the ADCs via the ADC feedback path 2308, as shown in FIG. 23A.

To do so, the receive design 2300 may exploit the architecture of the ADCs implemented within each receive chain 2301. Referring now to FIG. 23B, an example ADC design is shown that implements a SAR-based design, which includes a quantizer 2320 (e.g., comparator circuitry) that is configured to quantize a signal received at the input node 2310. This signal may be received, for example, via a coupled mixer output within the I and Q branch of one or more of the receive chains 2301.1-2301.N. In other words, the example ADC design shown in FIGS. 23B and 23C may be implemented in each ADC, although this particular ADC topology is by way of example and not limitation. The ADCs may be configured in any suitable configuration as long as the MSB is digitized first in such an arrangement, in various aspects.

Figure 23C:
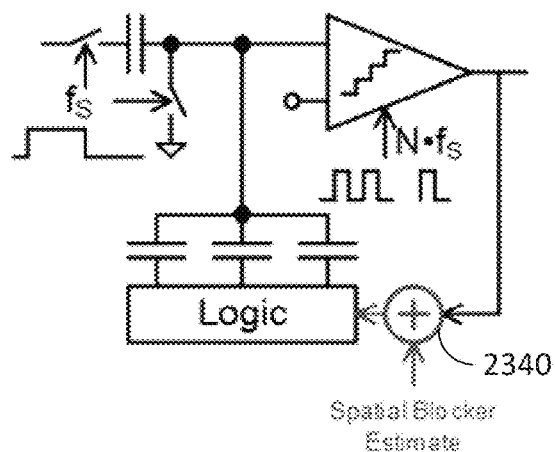
FIG. 23C illustrates a block diagram of an example ADC design using a feedback path, in accordance with an aspect of the disclosure.

Thus, the ADC as shown in FIGS. 23B-C outputs digital data that represents a digitized, sampled version of the downsampled analog data within the I and Q branches of one or more (e.g., all) of the receive chains 2301.1-2301.N. In accordance with the SAR topology example as shown in FIGS. 23B-C, the received signal is sampled by the quantizer 2320 at any suitable sampling frequency $f_s$. Further, the ADC quantizer 2320 is configured to output a digitized bitstream corresponding to each sampling period of the received signal in accordance with the sampling frequency. Thus, as shown in FIGS. 23B-C, the ADC quantizer 2320 may provide an N-bit output of the received signal within each sampling period. Thus, the quantizer 2320 may output data bits with an N-bit cycle at a higher frequency that is represented in FIGS. 23B-C as $N \cdot f_s$.

In SAR configurations as shown in FIGS. 23B-C, a coarse estimation of the signal is performed via the quantizer 2320. The estimate is then output and used as feedback to subtract from the input signal, which is re-quantized, and so on. Thus, as each bit is output by the quantizer 2320 in an N-bit cycle, the most recently-output bit may be used as feedback via the logic circuitry 2330, which supplies a voltage to the quantizer 2330 input at the node 2310. The logic circuitry 2330 may include any suitable configuration of components to selectively couple a desired adjustable voltage to the node 2310 in accordance with SAR ADC techniques, which may include known techniques to do so.

For example, the logic circuitry 2330 may include a digital-to-analog (DAC) converter (not shown) that is configured to vary the voltage applied to the node 2310 by selectively switching the coupling of the capacitors in accordance with known techniques used for SAR-based ADCs, in this example. This is just one example of the logic circuitry 2330, and aspects include the use of any suitable technique and/or DAC to provide a variable voltage to the node 2310. In any event, the logic circuitry 2330 may thus utilize the bit output from the quantizer 2320 as feedback. This feedback may be utilized by the logic circuitry 2330 in conjunction with the current sampling of the received signal at the node 2310 to enable the quantizer 2320 to generate the next successive approximation of the received signal as the next bit in the N-bit cycle, and so on until the entire current received signal at the node 2310 has been fully sampled and digitized. Again, the first bit output by the quantizer 2320 in this manner may be the MSB of the N-bit cycle.

To provide an illustrative example referring back to FIG. 23A, the desired signal in this example has an angle of incidence of approximately 30 degrees, whereas the blocker signal has an angle of incidence of approximately −45 degrees. The outputs of each ADC within each receive chain 2301.1-2301.N are provided in parallel to the sectorized scanning circuitry block 2304 and include digitized data that represents a summation of the desired signal and the blocker signal, given the omnidirectional nature of operation of the receiver design 2300.

Continuing this example, aspects include the sectorized scanning circuitry block 2304 performing a "coarse" sectorized scan across several regions of space in parallel, although sequential scanning may be used as an alternative aspect. This may include, for example, performing a coarse parallel scan across larger regions of space such as quadrants, octants, etc., which may be implemented via the sectorized scanning circuitry block 2304 using a digital rotation as shown in FIG. 23A. In the example shown in FIG. 23A, the receiver deign performs a coarse, parallel sectorized scan of 8 different octants, each being associated with a beam angle of −135°, −90°, −45°, 0°, +45°, +90°, +135°, and +180°. However, aspects include any suitable number of regions being scanned in this manner in parallel with one another, and the scan may consider the known angle of incidence of the desired signal to calculate adjacent regions for sectorized scanning if the entire space need not be scanned. Thus, as opposed to analyzing the energy along every possible angle of incidence, the MSB(s) is used to perform a coarser scan of several larger regions.

Continuing this example, the sectorized scanning circuitry block 2304 may provide the partially-digitized output from each ADC as a result of the coarse scanning operation to the blocker extraction circuitry block 2306. This partially-digitized output may include a representation of energy received in parallel from each ADC using the MSB (or MSBs) as initially output from each ADC. Using the output of the MSB(s) from one or more of the ADCs in parallel in this manner, the blocker extraction circuitry block 2306 may quickly ascertain whether additional signal energy is present (e.g., in excess of a threshold value) in one of the coarsely-scanned regions that corresponds to a region other than the known main beam location. If so, the sectorized scanning circuitry block 2304 may use this information to determine the presence of a blocker signal in that particular scanned region having additional signal energy. Furthermore, the blocker extraction circuitry block 2306 may calculate an estimation of the blocker signal in one or more of the coarsely scanned regions using the MSB(s) output by the one or more ADCs. Advantageously, because this coarse scan utilizes the MSB(s) of the ADCs instead of the entire digital ADC output, the coarse scanning process may provide results with a low latency that enables the coarse scan to be performed in parallel with signal processing operations associated with communications via the main beam.

Again, if a blocker is detected in this manner, then aspects include the blocker extraction circuitry block 2306 estimating the blocker signal and using this estimated blocker signal to attenuate the actual received blocker signal. In accordance with an aspect, this may be performed by applying a cancellation signal through the switch-cap DAC in the feedback path of the ADC, as shown in FIG. 23C. FIG. 23C illustrates the details of an example ADC design similar to the one shown in FIG. 23B. The example ADC design shown in FIG. 23C operates in a similar manner as the example ADC design as shown in FIG. 23B, and thus only differences between these example ADC designs are further discussed.

In contrast to the example ADC design shown in FIG. 23B, the example ADC design shown in FIG. 23C includes a summer circuit block 2340 that is introduced into the ADC quantizer feedback path, which may be present in each of the ADCs within each receive chain 2301.1-2301.N as shown in FIG. 23A. The spatial blocker estimate may thus represent a digitized estimate of the blocker signal based on the coarse scanning and analysis of the MSB(s) output by one or more of the ADCs as described above, and may be provided to each ADC via the ADC feedback path 2308. The digitized spatial blocker estimate may be formatted in a manner such that, when added to the output of the ADC via the summer circuitry block 2340, it cancels the output of the quantizer 2320 provided to the logic circuitry 2330 that is used to drive the ADC. In this way, the blocker signal energy is not quantized by the ADC, preventing saturation.

Aspects further include providing the switch-cap DAC feedback into an N-path RF/IF for further optimization. For example, the example receiver architecture as shown and discussed in this Section provides a single ADC per receive chain. However, the embodiments are not limited to these examples, and include the use of any suitable number N of ADCs coupled in parallel within one or more of the receive chains. For instance, the receive chain 2201.1 may include any suitable number of ADCs in parallel within each of the I and Q branches. The use of the digitized spatial blocker estimate discussed in this Section with reference to FIGS. 23B and 23C, for example, may be implemented and extended to any suitable number of such parallel ADCs when applicable. In this way, power consumption can be reduced because each ADC can operate at a lower resolution for the required RX signal EVM. Advantageously, given the nature of the coarse scan, aspects include selectively applying (e.g., via the DFE) the blocker cancellation only when an active blocker is detected (e.g., via the sectorized scanning circuitry block 2304), thus saving power during normal operation.

Although a precise angle of incidence of the blocker signal may not be determined using the coarse scan described above, and an estimated blocker signal may not completely match the actual blocker signal using only the ADC output MSB(s), the estimated blocker signal may still sufficiently attenuate the blocker signal to alleviate the saturation of the ADCs. Moreover, the use of the MSB(s) for blocker signal estimation provides a sufficiently low latency to ensure that the blocker is sufficiently attenuated within a current sampling window being processed by each ADC. Although using only the MSB will provide a minimum latency in this regard, the aspects are not limited to this implementation. In fact, additional bits following the MSB may be utilized as part of the blocker signal estimation. Although doing so will increase latency, it will also increase the accuracy of estimating the blocker signal. Thus, aspects include using only the MSB for coarse beam scanning or, alternatively, using any suitable number of bits following the MSB depending upon the application, recognizing the tradeoff between lower latency and higher accuracy.

The use of coarse scanning provides further advantages in that the detection of blocker signals may be wholly contained in the radio-head itself (e.g., the components in which the DFE 2202 is implemented). Thus, the coarse beam scanning described herein may be performed without incurring the latency introduced via the baseband signal processing. This is of particular importance to enable correction for asynchronous blocker signals. In other words, coarse spatial scanning should be sufficient for blocker detection, as there is no need to accurately digitize the blocker signal, but merely to estimate the blocker signal enough to reduce the dynamic range needed to handle it. In this way, coarse blocker signal scanning advantageously provides fast (e.g. low latency) results of blocker signal estimation and requires low hardware complexity. For example, in contrast with conventional brute force techniques that scan each possible angle of arrival, the embodiments described in this Section implement a coarse scan to detect blocker signals. Doing so advantageously detects blocker signals in a less computationally-intensive manner than conventional blocker signal detection techniques and results in greater power savings as well.

To summarize, as discussed in this Section with reference to FIG. 22, spatial filtering may be performed using a correlated adaptive joint estimation of the desired signal and any accompanying blocker signals to suppress the correlated ADC quantization noise. Moreover, as discussed in this Section with reference to FIGS. 23A-C, coarse sectorized scans may be performed in different directions simultaneously (in parallel) to detect spatial blockers, which may then be estimated using the MSB(s) output from the ADCs and used to at least partially cancel blocker signals. As further discussed below, aspects include alternately implementing the spatial filtering either via the digital front-end or at the downconverted output (e.g. baseband) of the mixer output before the ADC within one or more receive chains, as further discussed below with reference to FIG. 24.

Figure 24:
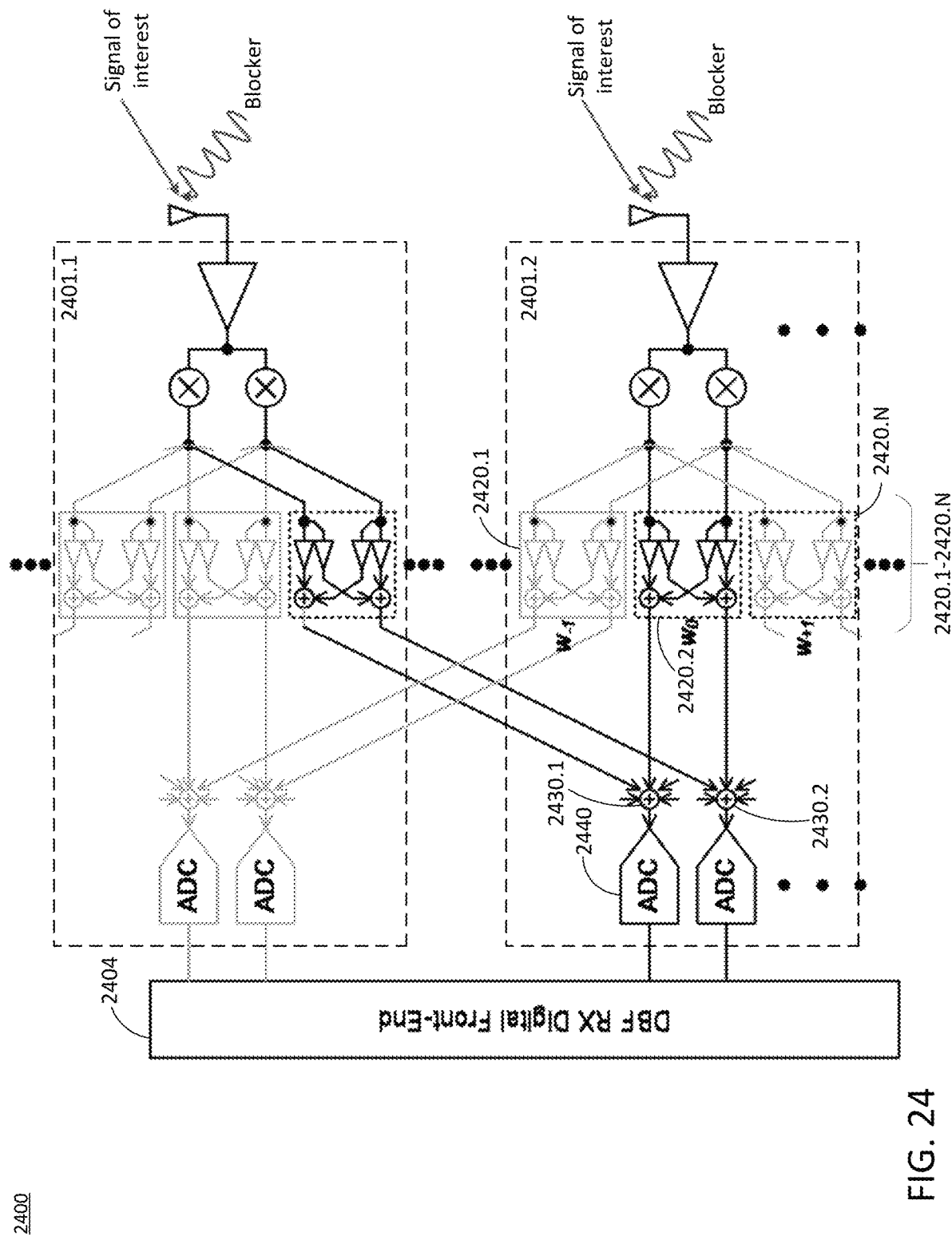
FIG. 24 illustrates a block diagram of an exemplary receiver design implementing a feed-forward spatial filter using coupling between a set of nearest neighbor RF chains, in accordance with an aspect of the disclosure.

FIG. 24 illustrates a block diagram of an exemplary receiver design implementing a feed-forward spatial filter using coupling between a set of nearest neighbor RF chains, in accordance with an aspect of the disclosure. In an aspect, the receiver design 2400 as shown in FIG. 24 may function to perform a coarse sectorized scan to detect blockers in directions deviating from the main beam direction in a similar or identical manner as described above with reference to the receiver design 2300 as shown in FIG. 23A. However, instead of using the MSB(s) output via the ADCs to construct an estimate of the blocker signal that is used for blocker attenuation via feedback, the receiver design 2400 may implement a spatial filter using a feedforward implementation, as further disused below.

The use of the feedforward design may present additional advantages such as further reducing the overall system latency. For instance, although the receiver design 2300 may use only the MSB output by one or more ADCs within the receive chains, doing so still introduces a minimum amount of latency to facilitate subsequent blocker signal attenuation. Thus, aspects include using the coarse sectorized scan as discussed herein to detect an angle of arrival of the blocker signal. But instead of reconstructing the blocker signal to cancel the signal, the implementation described with reference to the receiver design 2400 tunes a spatial notch filter along the identified blocker direction as identified in the aforementioned coarse spatial scan.

To do so, the receiver design 2400 implements an interconnected feedforward coupling of adjacent receiver chains to introduce a notch filter in the spatial response. For example, as shown in FIG. 24, the receiver design 2400 may include any suitable number of receive chains 2401.1-2401.N, which may be configured in a similar manner as the receive chains 2301.1-2301.N as discussed with reference to the receiver design 2300, and thus only differences between these components will be further described. Moreover, the receiver design 2400 may include a DFE circuitry block 2404, which may be implemented as part of any suitable type of DFE and may include the sectorized scanning circuitry block 2304 as discussed herein with reference to FIG. 23. Like the other DFEs discussed herein with reference to FIGS. 22 and 23A-C, the DFE in which the sectorized scanning circuitry block 2304 is implemented may be part of one of the other DFEs described in this Section or one of the other Sections 1-3, in various aspects.

Aspects also include each of the receive chains 2401.1-2401.N implementing any suitable number of tuning circuitry blocks 2420.1-2420.N, which may be interconnected from adjacent receive chains. The example receiver design 2400 as shown in FIG. 24 includes an interconnection of two adjacent receive chains for ease of explanation, although the aspects described herein are not limited in this regard and any suitable number of receive chains may be interconnected in a feedforward manner. Moreover, any suitable number of tuning circuitry blocks 2420 may be implemented for each adjacent receive chain that is coupled in this manner. To exploit correlations between the interconnected receive chains, aspects include the interconnected adjacent received chains being associated with antenna elements that are in physical proximity to one another.

For example, if the antennas as shown in FIG. 24 are part of a one-dimensional antenna array, then the three interconnected tuning circuitry blocks 2420.1, 2420.2, and 2420.N may be associated with receive chains 2401 coupled to physically adjacent antennas associated with, for instance, a top, middle, and lower antenna within the array, respectively. As another example, if the antennas as shown in FIG. 24 are part of a two-dimensional antenna array, then there may be eight or more interconnected tuning circuitry blocks 2420.1-2420.N coupled in a feedforward manner, such as, for instance, eight adjacent antenna elements being coupled to a respective one of the surrounding antenna elements with the 2-D antenna array. Aspects include the receive design 2400 implementing an interconnected architecture of any suitable number of receive chains 2401 being coupled in a feedforward manner based upon adjacent connected antenna elements. However, because there is a point of diminishing return as additional, further antenna elements are interconnected in this manner, aspects include recognizing a tradeoff between system complexity and cost with the benefits of coupling additional interconnected receive chains.

The tuning circuitry blocks 2420.1-2420.N may be implemented as any suitable number and type of circuitry components to facilitate the application of adjustable gain weights and/or adjustable phase shifts to the downsampled signals received via each respective receive chain 2401. For example, the tuning circuitry blocks 2420.1-2420.N may include a number of amplifiers as shown in FIG. 24, with each tuning circuitry block 2420 having amplifiers with respective gains that are independently and electronically adjustable for each of the I and Q branches, which are coupled to the downsampled received data output from the mixers within each receive chain 2401. With reference to the receive chain 2401.2 as an example, this may include the three tuning circuitry blocks 2420.1, 22420.2, and 2420.N. The implementation of the tuning circuitry blocks 2420.1-2420.N as shown in FIG. 24 is by way of example and not limitation. Thus, although the tuning circuitry blocks 2420.1-2420.N may be implemented with additional or alternate components to facilitate an adjustable phase shift of the baseband signals, using the configuration as shown in FIG. 24 with the use of the cross-coupled I and Q branches allows for the phase to be adjusted by adjusting only the amplifier gains of specific amplifiers within each tuning circuitry block 2420.1-2420.N.

For example, for the adjacent coupling configuration as shown in FIG. 24 in which two adjacent antennas are coupled in a feedforward architecture, the tuning circuitry block 2420.1 includes a configuration of coupled tunable amplifiers and summing circuitry to output a downsampled and received signal with an adjustable weighting $W_{-1}$. The weighted output of the circuitry block 2420.1 is coupled to the summing circuitry associated with the inputs of the ADCs for each of the I and Q branches of the receiver chain 2401.1. Furthermore, the tuning circuitry block 2420.2 includes a configuration of coupled tunable amplifiers and summing circuitry to output a downsampled and received signal having an adjustable weighting WO, with the weighted output of the tuning circuitry block 2420.2 being coupled to the summing circuitry associated with the inputs of the ADCs for each of the I and Q branches of the receiver chain 2401.2. Moreover, the tuning circuitry block 2420.N includes a configuration of coupled tunable amplifiers and summing circuitry to output a downsampled and received signal having an adjustable weighting $W_{+1}$, with the weighted output of the tuning circuitry block 2420.N being coupled to the summing circuitry associated with the inputs of the ADCs for each of the I and Q branches of a third receiver chain 2401.2. This coupling is not shown in FIG. 24 for purposes of brevity but may be coupled in the same manner as the coupling between the tuning circuitry block 2420.1 and the receive chain 2401.1 as shown. Thus, the example receiver design 2400 implements a feedforward architecture that couples, within each receive chain 2401.1-2401.N, a weighted downconverted signal received from via its own antenna as well as a weighted downconverted signal received via each of two adjacent antennas.

In various aspects, the summing circuitry coupled to the input of each ADC as shown in FIG. 24 (e.g., ADC 2440), an example of which as shown with reference to the receiver chain 2041.2 as summing circuitry 2430.1, 2430.2, may include any suitable configuration of circuit components to combine weighted signals from any suitable number of adjacent receiver chains 2401.1-2401.N. In doing so, the aspects of the receiver design 2400 include implementing a hybrid beamforming technique as opposed to the use of a full digital beamforming system. In other words, the weighting associated with the tuning circuitry blocks 2420.1-2420.N may be applied in the analog domain such as in the baseband or via another downconverted, lower frequency than the signal received via each receiver chain antenna. The interconnections that constitute the overall feedforward architecture of the receiver design 2400 may be connected as part of the overall level or system plan. However, aspects include selectively combining weighted signals from one of more adjacent antennas by controlling the gain of each tuning circuitry block 2420. For example, the gain of one or more amplifiers within a tuning circuitry block 2420 may be set to a sufficiently low value such that the weighted output from a tuning circuitry block 2420 is not combined with other weighted outputs. Thus, different weights may be applied using the tuning circuitry blocks 2420.1-2420.N such that the ADCs within one or more of the receive chains 2401.1-2401.N receive different analog weighted signals from adjacent antennas.

Aspects include the DFE circuitry block 2404 receiving digital data output from one or more of the ADCs 2440 in accordance with any suitable subset of antennas that constitute the overall antenna array. In doing so, the DFE circuitry block 2404 may calculate a resulting beamforming pattern to facilitate spatial filtering by forming a null in the pattern in a detected direction of the blocker signal. And because the coarse spatial scanning may identify the direction of the blocker signal based upon the detected energy in each scanned direction, the various interconnections of adjacent receive chains 2401-1-2401.N may facilitate the application of different weightings using the tuning circuitry blocks 2420 based on the detected direction of the blocker signal. The beamforming implemented via the DFE 2404 may be implemented in any suitable manner to form a spatial notch filter in this manner, which may use knowledge of the main beam direction and the detected spatial blocker direction (from the coarse scan mentioned herein) to formulate the resulting pattern having a spatial notch as needed. In an embodiment, the weighting applied to the tuning circuitry blocks 2420 may be calculated using the detected direction of spatial blockers, and may be applied on a per-receive-chain basis based upon detected energy values. For example, using the results of the coarse scan discussed above, the angle of the blocker signal may be estimated. Using this information, a suitable combination of weights may be applied via the tuning circuitry blocks 2420.1-2420.N to yield a beamforming shape that functions as spatial filter with regards to the estimated blocker signal direction.

As an example, the DFE 2404 may utilize the weighted outputs received via the ADCs of each receiver chain 2401.1-2401.N in parallel with one another, and use the weighted and combined data to formulate appropriate beamforming weights such that the blocker signal is canceled or at least partially attenuated as a result of the spatial filter. By coupling the signals between the multiple adjacent antenna elements in this manner, the tunable spatial notch may be formed without significantly limiting the field of view of each receive chain 2401.1-2401.N while providing a relaxation of the ADC dynamic range.

Figure 25:
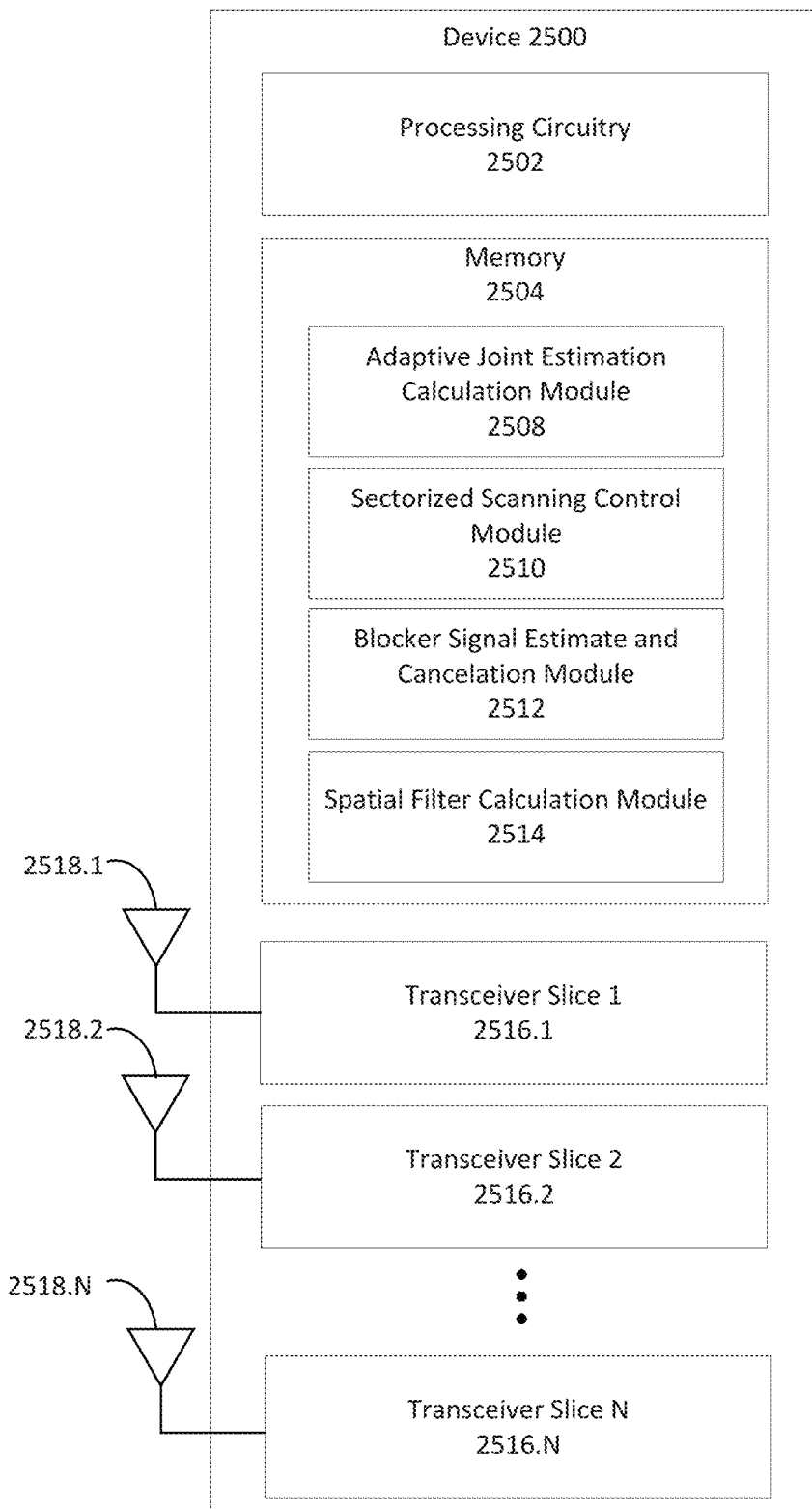
FIG. 25 illustrates a block diagram of an exemplary device, in accordance with an aspect of the disclosure.

FIG. 25 illustrates a block diagram of an exemplary device, in accordance with an aspect of the disclosure. In various aspects, device 2500 may be implemented as any suitable type of device configured to transmit and/or receive wireless signals in accordance with any suitable number and/or type of communication protocols. For instance, the device 2500 may be implemented as a user equipment (UE) such as a mobile phone, tablet, laptop computer, etc. To provide additional examples, the device 2500 may be implemented as an access point or base station. The device 2500 may implement one or more aspects as described herein to facilitate receiving and/or transmitting wireless signals in accordance with a particular frequency or band of frequencies, such as mm-Wave frequencies, for example, as further described herein.

In an aspect, the device 2500 may include processing circuitry 2502, a memory 2504, and any suitable number N of transceiver slices or chains 2516.1-2516.N, each being coupled to one or more respective antennas 2518.1-2518.N. The components shown in FIG. 25 are provided for ease of explanation, and aspects include device 2500 including additional, less, or alternative components as those shown in FIG. 25. For example, device 2500 may include one or more power sources, display interfaces, peripheral devices, ports, etc.

In an aspect, the various components of device 2500 may be identified with functionality further described herein with reference to performing a multi-element estimation of the RX signal in an adaptive spatial filter to suppress correlated ADC quantization noise, performing coarse sectorized scans in different directions simultaneously (in parallel) to detect spatial blockers, and/or suppressing spatial blockers either through low-latency feedback around the ADC or through feedforward coupling between multiple RX elements to provide attenuation/nulling in specific spatial directions, as discussed throughout this Section in greater detail. Each of the transceiver slices 2516.1-2516.N may be identified with a respective one of the transceiver slices 1504.1-1504.N discussed, for example, with reference to the transceiver design 1500 as shown in FIG. 15 and discussed in Section 3, and/or one of the receiver chains discussed throughout this Section (e.g., receiver chains 2201.1-2201.N, 2301.1-2301.N, 2401.1-2401.N, etc.).

Aspects include the processing circuitry 2502 being configured as any suitable number and/or type of computer processors, which may facilitate control of the device 2500 as discussed herein. In some aspects, processing circuitry 2502 may be identified with a baseband processor (or suitable portions thereof) implemented by the device 2500. In other aspects, the processing circuitry 2502 may be identified with one or more processors implemented by the device 2500 that are separate from the baseband processor (e.g., one or more digital signal processors, one or more processors associated with a DFE such as DFE 2202, 2404, DFE 1502 as discussed in Section 3, etc.). In still other aspects, the functionality of the device 2500 may be combined with that discussed herein with reference to the device 2100 (as discussed in Section 3), which may have functionality combined with the device 1400 (as discussed in Section 2), which in turn may have functionality combined with that discussed herein with reference to device 1000 (as discussed in Section 1). Additionally or alternatively, aspects include the various functions discussed herein with reference to device 2500 being performed by one or more components associated with device 2100, the device 1400, and/or the device 1000.

In any event, aspects include the processing circuitry 2502 being configured to carry out instructions to perform arithmetical, logical, and/or input/output (I/O operations, and/or to control the operation of one or more components of the device 2500. For example, the processing circuitry 2502 can include one or more microprocessors, memory registers, buffers, clocks, etc. Moreover, aspects include processing circuitry 2502 communicating with and/or controlling functions associated with the memory 2504 and/or the transceiver slices 2516.1-2516.N.

This may include, for example, controlling and/or arbitrating transmit and/or receive functions of the device 2500, facilitating the detection of blocker signals discussed herein, using the detection of blocker signals to attenuate or cancel the blocker signals, etc., as discussed herein. Additionally, processing circuitry 2502 may facilitate the calculation of beamforming weights that may be digitally applied (e.g., via a suitable DFE) and/or applied in the analog domain via the tuning circuitry blocks 2420, adjusting various parameters such as the phase and/or gain of the tuning circuitry blocks 2420, adjusting parameters for one or more of the one or more transceiver slices 2516, controlling the state of the device 2500 to operate in a receiving mode or a transmit mode, performing one or more baseband processing functions (e.g., media access control (MAC), encoding/decoding, modulation/demodulation, data symbol mapping, error correction, etc.), identifying subsets of interconnected receiver chains for application of analog weighting for spatial filtering, as well as any other suitable functions to carry out the functionality associated with the aspects as described herein.

In an aspect, the memory 2504 stores data and/or instructions such that, when the instructions are executed by the processing circuitry 2502, the processing circuitry 2502 performs the various functions described herein. The memory 2504 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 2504 can be non-removable, removable, or a combination of both.

For example, the memory 2504 may be implemented as a non-transitory computer readable medium storing one or more executable instructions such as, for example, logic, algorithms, code, etc. As further discussed below, the instructions, logic, code, etc., stored in the memory 2504 are represented by the various modules as shown in FIG. 25, which may enable the aspects disclosed herein to be functionally realized. The modules shown in FIG. 25 are provided for ease of explanation regarding the functional association between hardware and software components. Thus, aspects include the processing circuitry 2502 executing the instructions stored in these respective modules in conjunction with one or more hardware components to perform the various functions associated with the aspects as further discussed herein. Again, the modules shown in FIG. 25 are for ease of explanation with regards to the aspects described in this section of the disclosure.

In an aspect, the executable instructions stored in the adaptive joint estimation calculation module 2508 may facilitate, in conjunction with the processing circuitry 2502, the device 2500 performing multi-element estimation of the received signal in an adaptive spatial filter to suppress correlated ADC quantization noise. This may include, for example, processing the digitized signals received via the ADCs associated with each receiver chain 2201.1-2201.N, as discussed herein with reference to FIG. 22.

In an aspect, the executable instructions stored in the sectorized scanning control module 2510 may facilitate, in conjunction with the processing circuitry 2502, the device 2500 performing a coarse scan of various region of space to detect blocker signals in directions that deviate from that of the main beam. For example, aspects include the executable instructions stored in the sectorized scanning control module 2510 facilitating digital rotation of the scanning angle of data received via each of the receiver chains 2301 as discussed with reference in this Section to FIG. 23A-23C. The sectorized scanning control module 2510 may facilitate, in conjunction with the processing circuitry 2502, the device 2500 receiving digital data representing signal energy received over the scanned regions of space for each of the receive chains in parallel, as discussed herein.

In an aspect, the executable instructions stored in the blocker signal estimate and cancelation module 2512 may facilitate, in conjunction with the processing circuitry 2502, the device 2500 analyzing the digitized data obtained via the coarse scanning operation described herein. This may include, for example, the DFE (e.g., the DFE 2202) analyzing the signal energy received over the various scanned directions in accordance with the MSB(s) output by the ADCs within each receive chain, as discussed herein with reference to FIGS. 23A-23C, for instance.

Moreover, the blocker signal estimate and cancelation module 2512 may facilitate the calculation of signal energy within each of the scanned regions. For scanned regions (other than the region occupied by the main beam) in which a level of energy is detected exceeding a threshold energy value, an estimation of the detected blocker signal may be calculated using the signal energy received over the various scanned directions in accordance with the MSBs output by the ADCs within each receive chain, as discussed herein with reference to FIGS. 23A-23C, as discussed herein. Again, once the blocker signal estimation is calculated, the blocker signal estimate may be used as feedback to one or more of the ADCs within the receive chains to prevent the blocker signal energy from being quantized and thus prevent ADC saturation.

In an aspect, the executable instructions stored in the spatial filter calculation module 2514 may facilitate, in conjunction with the processing circuitry 2502, the device 2500 dynamically and adaptively tuning a spatial filter to avoid receiving a portion (or the entire) blocker signal in one or more detected directions. This may include, for example, generating and providing control signals to adjust various parameters such as the phase and/or gain of the tuning circuitry blocks 2420, as discussed herein with reference to FIG. 24, for example. Again, the output of the tuning circuitry blocks 2420 may be combined in a weighted manner from adjacent receiver chains and used in a feed-forward architecture, as discussed herein with reference to FIG. 24.

The various aspects described in this Section, as well as Sections 1-3, may be combined with one another in any suitable manner to provide further improvements. For example, the aspects described herein with reference to FIG. 22, which aims to jointly estimate the time delays and signals received via each receive chain 2201, may be combined with the ADC feedback aspects as discussed with reference to FIGS. 23A-23C and/or the spatial filtering aspects as discussed with respect to FIG. 24.

EXAMPLES—I

The following examples pertain to further aspects.

Example 1. A local oscillator (LO) signal generator, comprising: a delay-locked loop (DLL) configured to generate, from an input signal having a sub-harmonic frequency that is a fraction of an output signal frequency, a set of phase-shifted input signals at the sub-harmonic frequency; phase configuration circuitry coupled to the DLL, the phase configuration circuitry being configured to output a subset of phase-shifted signals from among the set of phase-shifted input signals; and an injection locked clock multiplier (ILCM) configured to receive the subset of the phase-shifted signals as injected inputs, and to combine and frequency-multiply the subset of the phase-shifted signals to generate a set of LO signals at the output signal frequency.

Example 2. The LO signal generator of Example 1, wherein the subset of the phase-shifted signals have an equally-spaced phase-shift with respect to another that is a fraction of a full clock cycle, the fraction of the full clock cycle being equal to the fraction of the output signal frequency.

Example 3. The LO signal generator of any combination of Examples 1-2, wherein the ILCM is configured to combine the subset of the phase-shifted signals to destructively interfere with one another to suppress harmonics of the sub-harmonic frequency except for a harmonic of the sub-harmonic signal that is equal to the output signal frequency, wherein the subset of the phase-shifted signals that destructively interfere with one another provide, as a result of a phase relationship between the phase-shifted signals, a summed signal that is attenuated as compared to the individual phase-shifted signals prior to being combined.

Example 4. The signal generator of any combination of Examples 1-3, wherein the ILCM is configured to combine the subset of the phase-shifted signals to constructively interfere with one another at a sub-harmonic signal that is equal to the output signal frequency, wherein the subset of the phase-shifted signals that constructively interfere with one another provide, as a result of a phase relationship between the phase-shifted signals, a summed signal that is amplified as compared to the individual combined phase-shifted signals prior to being combined Example 5. The LO signal generator of any combination of Examples 1-4, wherein the set of LO signals are quadrature differential LO signals.

Example 6. The LO signal generator of any combination of Examples 1-5, wherein the output signal frequency is within a range of mm-Wave frequencies.

Example 7. The LO signal generator of any combination of Examples 1-6, wherein the DLL comprises a controlled delay-line having a number of delay elements, and wherein a unit-phase shift associated with the set of phase-shifted input signals is a function of the number of delay elements.

Example 8. The LO signal generator of any combination of Examples 1-7, wherein the DLL comprises an interpolating delay line having a plurality of delay elements, and wherein a unit-phase shift associated with the set of phase-shifted input signals is less than the delay associated with a single delay element from among the plurality of delay elements.

Example 9. The LO signal generator of any combination of Examples 1-8, wherein the DLL comprises a two-dimensional matrix of delay elements interleaved with one another, with each node in the matrix being fed by two delay elements.

Example 10. The LO signal generator of any combination of Examples 1-9, wherein the ILCM comprises: an oscillator circuit; a tank circuit coupled to an output of the oscillator circuit; and a feedback path coupled between the output of the oscillator circuit and an input of the oscillator circuit, wherein the input of the oscillator circuit is coupled to the subset of phase-shifted signals.

Example 11. The LO signal generator of any combination of Examples 1-10, wherein the ILCM comprises: an oscillator circuit; a tank circuit coupled to an output of the oscillator circuit; and a feedback path coupled between the output of the oscillator circuit and an input of the oscillator circuit, wherein the output of the oscillator circuit is coupled to the subset of the phase-shifted signals, and wherein the subset of the phase-shifted signals are coupled to the tank circuit.

Example 12. A wireless device, comprising: a plurality of transceiver chains; processing circuitry; and a memory configured to store executable instructions that, when executed by the processing circuitry, causes each transceiver chain from the plurality of transceiver chains to: generate, from an input signal having a sub-harmonic frequency that is a fraction of an output signal frequency, a set of phase-shifted input signals at the sub-harmonic frequency, output a subset of phase-shifted signals from among the set of phase-shifted input signals, and combine and frequency multiply, via an injection locked clock multiplier (ILCM), the subset of phase-shifted signals to generate a set of LO signals at the output signal frequency Example 13. The wireless device of Example 12, wherein the subset of the phase-shifted signals have an equally-spaced phase-shift with respect to another that is a fraction of a full clock cycle, the fraction of the full clock cycle being equal to the fraction of the output signal frequency.

Example 14. The wireless device of any combination of Examples 12-13, wherein each transceiver chain from among the plurality of transceiver chains is configured to generate a respective set of LO signals at the output signal frequency having phases that are phase-shifted with respect to the set of LO signals generated via the other transceiver chains.

Example 15. The wireless device of any combination of Examples 12-14, wherein each transceiver chain from among the plurality of transceiver chains is configured to combine a respective subset of the phase-shifted signals to destructively interfere with one another such that harmonics of the sub-harmonic frequency are suppressed except for a harmonic of the sub-harmonic signal that is equal to the output signal frequency, wherein the subset of the phase-shifted signals that destructively interfere with one another provide, as a result of a phase relationship between the phase-shifted signals, a summed signal that is attenuated as compared to the individual phase-shifted signals prior to being combined.

Example 16. The wireless device of any combination of Examples 12-15, wherein each transceiver chain from among the plurality of transceiver chains is configured to combine the subset of the phase-shifted signals to constructively interfere with one another at a sub-harmonic signal that is equal to the output signal frequency, wherein the subset of the phase-shifted signals that constructively interfere with one another provide, as a result of a phase relationship between the phase-shifted signals, a summed signal that is amplified as compared to the individual combined phase-shifted signals prior to being combined.

Example 17. The wireless device of any combination of Examples 12-16, wherein the set of LO signals are quadrature differential LO signals, and wherein the output signal frequency is within a range of mm-Wave frequencies.

Example 18. The wireless device of any combination of Examples 12-17, wherein each transceiver chain from among the plurality of transceiver chains includes a delay-locked loop (DLL) that comprises a controlled delay-line having a number of delay elements, and wherein a unit-phase shift associated with the set of phase-shifted input signals is a function of the number of delay elements.

Example 19. The wireless device of any combination of Examples 12-18, wherein each transceiver chain from among the plurality of transceiver chains includes a delay-locked loop (DLL) that comprises an interpolating delay line having a plurality of delay elements, and wherein a unit-phase shift associated with the set of phase-shifted input signals is less than the delay associated with a single delay element from among the plurality of delay elements.

Example 20. The wireless device of any combination of Examples 12-19, wherein each transceiver chain from among the plurality of transceiver chains includes a delay-locked loop (DLL) that comprises a two-dimensional matrix of delay elements interleaved with one another, with each node in the matrix being fed by two delay elements.

Example 21. The wireless device of any combination of Examples 12-20, wherein the ILCM associated with each transceiver chain from among the plurality of transceiver chains comprises: an oscillator circuit; a tank circuit coupled to an output of the oscillator circuit; and a feedback path coupled between the output of the oscillator circuit and an input of the oscillator circuit, wherein the input of the oscillator circuit is coupled to the subset of the phase-shifted signals.

Example 22. The wireless device of any combination of Examples 12-21, wherein the ILCM associated with each transceiver chain from among the plurality of transceiver chains comprises: an oscillator circuit; a tank circuit coupled to an output of the oscillator circuit; and a feedback path coupled between the output of the oscillator circuit and an input of the oscillator circuit, wherein the output of the oscillator circuit is coupled to the subset of phase-shifted signals, and wherein the subset of phase-shifted signals are coupled to the tank circuit.

Example 23. A local oscillator (LO) signal generator, comprising: a delay-locked loop (DLL) configured to generate, using a reference clock signal having a sub-harmonic frequency that is a fraction of an output signal frequency, a set of phase-shifted signals at the sub-harmonic frequency; phase configuration circuitry coupled to the DLL and to a plurality of buffers, the phase configuration circuitry selectively coupling each phase-shifted signal from among a subset of the set of phase-shifted signals to respective buffers of the plurality of buffers; and an injection locked clock multiplier (ILCM) including an oscillator circuit that is coupled to the plurality of buffers, the oscillator circuit being tuned to the output signal frequency, wherein the oscillator circuit is configured to utilize a current supplied by the respective buffers of the plurality of buffers associated with the subset of the set of phase-shifted signals to combine and frequency-multiply the subset of the phase-shifted signals to thereby generate a set of LO signals at the output signal frequency.

Example 24. The LO signal generator of Example 23, wherein the subset of the set of phase-shifted signals have an equally-spaced phase-shift with respect to another that is a fraction of a full clock cycle, the fraction of the full clock cycle being equal to the fraction of the output signal frequency.

Example 25. A local oscillator (LO) signal generator means, comprising: a delay-locked loop (DLL) means for generating, from an input signal having a sub-harmonic frequency that is a fraction of an output signal frequency, a set of phase-shifted input signals at the sub-harmonic frequency; a phase configuration means coupled to the DLL, the phase configuration means outputting a subset of phase-shifted signals from among the set of phase-shifted input signals; and an injection locked clock multiplier (ILCM) means for receiving the subset of the phase-shifted signals as injected inputs, and combining and frequency-multiplying the subset of the phase-shifted signals to generate a set of LO signals at the output signal frequency.

Example 26. The LO signal generator means of Example 25, wherein the subset of the phase-shifted signals have an equally-spaced phase-shift with respect to another that is a fraction of a full clock cycle, the fraction of the full clock cycle being equal to the fraction of the output signal frequency.

Example 27. The LO signal generator means of any combination of Examples 25-26, wherein the ILCM means combines the subset of the phase-shifted signals to destructively interfere with one another to suppress harmonics of the sub-harmonic frequency except for a harmonic of the sub-harmonic signal that is equal to the output signal frequency, wherein the subset of the phase-shifted signals that destructively interfere with one another provide, as a result of a phase relationship between the phase-shifted signals, a summed signal that is attenuated as compared to the individual phase-shifted signals prior to being combined.

Example 28. The signal generator means of any combination of Examples 25-27, wherein the ILCM means combines the subset of the phase-shifted signals to constructively interfere with one another at a sub-harmonic signal that is equal to the output signal frequency, wherein the subset of the phase-shifted signals that constructively interfere with one another provide, as a result of a phase relationship between the phase-shifted signals, a summed signal that is amplified as compared to the individual combined phase-shifted signals prior to being combined Example 29. The LO signal generator means of any combination of Examples 25-28, wherein the set of LO signals are quadrature differential LO signals.

Example 30. The LO signal generator means of any combination of Examples 25-29, wherein the output signal frequency is within a range of mm-Wave frequencies.

Example 31. The LO signal generator means of any combination of Examples 25-30, wherein the DLL means includes a controlled delay-line means having a number of delay elements, and wherein a unit-phase shift associated with the set of phase-shifted input signals is a function of the number of delay elements.

Example 32. The LO signal generator means of any combination of Examples 25-31, wherein the DLL means includes an interpolating delay line having a plurality of delay elements, and wherein a unit-phase shift associated with the set of phase-shifted input signals is less than the delay associated with a single delay element from among the plurality of delay elements.

Example 33. The LO signal generator means of any combination of Examples 25-32, wherein the DLL means includes a two-dimensional matrix of delay elements interleaved with one another, with each node in the matrix being fed by two delay elements.

Example 34. The LO signal generator means of any combination of Examples 25-33, wherein the ILCM means includes: an oscillator circuit; a tank circuit coupled to an output of the oscillator circuit; and a feedback path coupled between the output of the oscillator circuit and an input of the oscillator circuit, wherein the input of the oscillator circuit is coupled to the subset of phase-shifted signals.

Example 35. The LO signal generator means of any combination of Examples 25-34, wherein the ILCM means includes: an oscillator circuit; a tank circuit coupled to an output of the oscillator circuit; and a feedback path coupled between the output of the oscillator circuit and an input of the oscillator circuit, wherein the output of the oscillator circuit is coupled to the subset of the phase-shifted signals, and wherein the subset of the phase-shifted signals are coupled to the tank circuit.

Example 36. A wireless device means, comprising: a plurality of transceiver chain means; processing means; and a memory configured to store executable instructions that, when executed by the processing means, causes each transceiver chain means from the plurality of transceiver chain means to: generate, from an input signal having a sub-harmonic frequency that is a fraction of an output signal frequency, a set of phase-shifted input signals at the sub-harmonic frequency, output a subset of phase-shifted signals from among the set of phase-shifted input signals, and combine and frequency multiply, via an injection locked clock multiplier (ILCM), the subset of phase-shifted signals to generate a set of LO signals at the output signal frequency Example 37. The wireless device means of Example 36, wherein the subset of the phase-shifted signals have an equally-spaced phase-shift with respect to another that is a fraction of a full clock cycle, the fraction of the full clock cycle being equal to the fraction of the output signal frequency.

Example 38. The wireless device means of any combination of Examples 36-37, wherein each transceiver chain from among the plurality of transceiver chains is configured to generate a respective set of LO signals at the output signal frequency having phases that are phase-shifted with respect to the set of LO signals generated via the other transceiver chains.

Example 39. The wireless device means of any combination of Examples 36-38, wherein each transceiver chain f means rom among the plurality of transceiver chain means is configured to combine a respective subset of the phase-shifted signals to destructively interfere with one another such that harmonics of the sub-harmonic frequency are suppressed except for a harmonic of the sub-harmonic signal that is equal to the output signal frequency, wherein the subset of the phase-shifted signals that destructively interfere with one another provide, as a result of a phase relationship between the phase-shifted signals, a summed signal that is attenuated as compared to the individual phase-shifted signals prior to being combined.

Example 40. The wireless device means of any combination of Examples 36-39, wherein each transceiver chain means from among the plurality of transceiver chain means is configured to combine the subset of the phase-shifted signals to constructively interfere with one another at a sub-harmonic signal that is equal to the output signal frequency, wherein the subset of the phase-shifted signals that constructively interfere with one another provide, as a result of a phase relationship between the phase-shifted signals, a summed signal that is amplified as compared to the individual combined phase-shifted signals prior to being combined.

Example 41. The wireless device means of any combination of Examples 36-40, wherein the set of LO signals are quadrature differential LO signals, and wherein the output signal frequency is within a range of mm-Wave frequencies.

Example 42. The wireless device means of any combination of Examples 36-41, wherein each transceiver chain means from among the plurality of transceiver chain means includes a delay-locked loop (DLL) means that includes a controlled delay-line having a number of delay elements, and wherein a unit-phase shift associated with the set of phase-shifted input signals is a function of the number of delay elements.

Example 43. The wireless device means of any combination of Examples 36-42, wherein each transceiver chain means from among the plurality of transceiver chain means includes a delay-locked loop (DLL) means that includes an interpolating delay line having a plurality of delay elements, and wherein a unit-phase shift associated with the set of phase-shifted input signals is less than the delay associated with a single delay element from among the plurality of delay elements.

Example 44. The wireless device means of any combination of Examples 36-43, wherein each transceiver chain means from among the plurality of transceiver chain means includes a delay-locked loop (DLL) means that includes a two-dimensional matrix of delay elements interleaved with one another, with each node in the matrix being fed by two delay elements.

Example 45. The wireless device means of any combination of Examples 36-44, wherein the ILCM associated with each transceiver chain means from among the plurality of transceiver chain means comprises: an oscillator circuit; a tank circuit coupled to an output of the oscillator circuit; and a feedback path coupled between the output of the oscillator circuit and an input of the oscillator circuit, wherein the input of the oscillator circuit is coupled to the subset of the phase-shifted signals.

Example 46. The wireless device means of any combination of Examples 36-45, wherein the ILCM associated with each transceiver chain means from among the plurality of transceiver chain means comprises: an oscillator circuit; a tank circuit coupled to an output of the oscillator circuit; and a feedback path coupled between the output of the oscillator circuit and an input of the oscillator circuit, wherein the output of the oscillator circuit is coupled to the subset of phase-shifted signals, and wherein the subset of phase-shifted signals are coupled to the tank circuit.

Example 47. A local oscillator (LO) signal generator means, comprising: a delay-locked loop (DLL) means for generating, using a reference clock signal having a sub-harmonic frequency that is a fraction of an output signal frequency, a set of phase-shifted signals at the sub-harmonic frequency; phase configuration means coupled to the DLL means and to a plurality of buffer means, the phase configuration means selectively coupling each phase-shifted signal from among a subset of the set of phase-shifted signals to respective buffer means of the plurality of buffer means; and an injection locked clock multiplier (ILCM) means including an oscillator circuit that is coupled to the plurality of buffer means, the oscillator circuit being tuned to the output signal frequency, wherein the oscillator circuit is configured to utilize a current supplied by the respective buffer means of the plurality of buffer means associated with the subset of the set of phase-shifted signals to combine and frequency-multiply the subset of the phase-shifted signals to thereby generate a set of LO signals at the output signal frequency.

Example 48. The LO signal generator means of Example 47, wherein the subset of the set of phase-shifted signals have an equally-spaced phase-shift with respect to another that is a fraction of a full clock cycle, the fraction of the full clock cycle being equal to the fraction of the output signal frequency.

An apparatus as shown and described.
A method as shown and described.

EXAMPLES—II

The following examples pertain to further aspects.

Example 49. A local oscillator (LO) signal generator, comprising: a frequency synthesizer configured to generate a first reference signal having a first frequency; a digital to time converter (DTC) configured to generate a second reference signal based upon the first reference signal, the second reference signal having a second frequency that is a fractional multiple of the first frequency; a high-band (HB) path including a HB injection locked frequency multiplier (ILFM), the HB ILCM configured to generate one or more HB local oscillator (LO) signals having a HB LO frequency that is based upon the first frequency associated with the first reference signal; and a low-band (LB) frequency path including a LB ILFM, the LB ILCM configured to generate one or more LB local oscillator (LO) signals having a LB LO frequency that is based upon the second frequency associated with the second reference signal.

Example 50. The LO signal generator of Example 49, wherein the HB ILCM is from among a plurality of HB ILCMs within the HB path, each one of the plurality of HB ILCMs being associated with a respective transceiver chain, and wherein the LB ILCM is from among a plurality of LB ILCMs within the LB path, each one of the plurality of LB ILCMs being associated with a respective transceiver chain.

Example 51. The LO signal generator of any combination of Examples 49-50, wherein the HB ILCM is configured to generate a set of quadrature LO signals as the one or more HB LO signals, and wherein the LB ILCM is configured to generate a set of quadrature LO signals as the one or more LB LO signals.

Example 52. The LO signal generator of any combination of Examples 49-51, wherein the HB ILCM is coupled to one or more mixers configured to perform direct downconversion of received signals to baseband using the one or more HB LO signals, and wherein the LB ILCM is coupled to one or more mixers configured to perform direct downconversion of received signals to baseband using the one or more LB LO signals.

Example 53. The LO signal generator any combination of Examples 49-52, wherein the received signals that are directly downconverted to baseband via the one or more mixers in the HB path and the received signals that are directly downconverted to baseband via the one or more mixers in the LB path are within a range of mm-wave frequencies.

Example 54. The LO signal generator of any combination of Examples 49-53, wherein the HB ILFM is configured to generate the one or more HB LO signals having the HB LO frequency that is an integer multiple of the first frequency associated with the first reference signal.

Example 55. The LO signal generator of any combination of Examples 49-54, further comprising: another DTC configured to generate, from the first reference signal, a fractionally-multiplied first reference signal having a frequency that is a fractional multiple of the first frequency, and wherein the HB ILFM is configured to generate the one or more HB LO signals having the HB LO frequency that is an integer multiple of the fractional multiple of the first frequency associated with the fractionally-multiplied first reference signal.

Example 56. The LO signal generator of any combination of Examples 49-55, further comprising: frequency divider circuitry configured to perform frequency division on the first reference signal to generate a frequency-divided reference signal, and wherein the DTC is further configured to perform a fractional multiplication of the frequency-divided reference signal to generate the second reference signal.

Example 57. The LO signal generator of any combination of Examples 49-56, wherein the DTC is configured to receive digital phase ramp data that is varied to adjust the fractional multiple of the first frequency and thereby adjust the second frequency associated with the second reference signal.

Example 58. A local oscillator (LO) signal generator, comprising: a frequency synthesizer configured to generate a first reference signal having a first frequency; a first digital to time converter (DTC) configured to generate a second reference signal based upon the first reference signal, the second reference signal having a second frequency that is a fractional multiple of the first frequency; an intermediate frequency (IF) mixing stage configured to generate (i) a first up-converted analog IF signal based upon the first reference signal, and (ii) a second up-converted analog IF signal based upon the first reference signal; and a transmission mixing stage including: a first high band (HB) injection locked frequency multiplier (ILFM) configured to generate one or more HB TX local oscillator (LO) signals, and to up-convert the first up-converted analog IF signal to a first transmission frequency, the HB TX LO signals having a HB TX LO frequency that is based upon the second frequency of the second reference signal; and a first low band (LB) ILFM configured to generate one or more LB TX local oscillator (LO) signals, and to up-convert the second up-converted analog IF signal to a second transmission frequency, the LB TX LO signals having a LB TX LO frequency that is based upon the second frequency of the second reference signal.

Example 59. The LO signal generator of Example 58, wherein: the HB TX LO frequency is based upon a first integer multiple of the first reference signal, the LB TX LO frequency is based upon a second integer multiple of the second reference signal, and the first integer multiple is different than the second integer multiple.

Example 60. The LO signal generator of any combination of Examples 58-59, further comprising: a second DTC coupled to the first HB ILFM, the second DTC configured to further fractionally-multiply the second frequency associated with the second reference signal, wherein the first HB ILFM is configured to generate the one or more HB TX LO signals having the HB LO TX frequency that is a first integer multiple of the further fractional multiple of the second frequency of the second reference signal generated via the second DTC.

Example 61. The LO signal generator of any combination of Examples 58-60, further comprising: a third DTC coupled to the first LB ILFM, the third DTC configured to further fractionally-multiply the second frequency associated with the second reference signal, wherein the first LB ILFM is configured to generate the one or more LB TX LO signals having the LB TX LO frequency that is a second integer multiple of the further fractional multiple of the second frequency of the second reference signal generated via the third DTC.

Example 62. The LO signal generator of any combination of Examples 58-61, further comprising: frequency divider circuitry configured to perform frequency division of the first reference signal to generate a frequency-divided reference signal, and wherein the first DTC is further configured to perform fractional multiplication of the frequency-divided reference signal to generate the second reference signal.

Example 63. The LO signal generator of any combination of Examples 58-62, further comprising: a second HB ILFM configured to frequency multiply the first reference signal to generate one or more HB IF LO signals for up-conversion of a first baseband signal to the first up-converted analog IF signal via the IF mixing stage; and a second LB ILFM configured to frequency multiply the first reference signal to generate one or more LB IF LO signals for up-conversion of a second baseband signal to the second up-converted analog IF signal via the IF mixing stage.

Example 64. The LO signal generator of any combination of Examples 58-63, wherein the second HB ILCM is configured to generate a set of quadrature LO signals as the one or more HB IF LO signals, and wherein the second LB ILCM is configured to generate a set of quadrature LO signals as the one or more LB IF LO signals.

Example 65. The LO signal generator of any combination of Examples 58-64, wherein the first transmission frequency and the second transmission frequency are within a range of mm-Wave frequencies.

Example 66. A wireless device, comprising: a plurality of transceiver chains; processing circuitry; and a memory configured to store executable instructions that, when executed by the processing circuitry, causes each transceiver chain from the plurality of transceiver chains to: generate a first reference signal having a first frequency; generate, via a digital to time converter (DTC), a second reference signal based upon the first reference signal, the second reference signal having a second frequency that is a fractional multiple of the first frequency; generate, via a high-band (HB) injection locked frequency multiplier (ILFM), one or more HB local oscillator (LO) signals having a HB LO frequency that is based upon the first frequency associated with the first reference signal; and generate, via a low-band (LB) ILFM, one or more LB local oscillator (LO) signals having a LB LO frequency that is based upon the second frequency associated with the second reference signal.

Example 67. The wireless device of Example 66, wherein the HB ILCM is configured to generate a set of quadrature LO signals as the one or more HB LO signals, and wherein the LB ILCM is configured to generate a set of quadrature LO signals as the one or more LB LO signals.

Example 68. The wireless device of any combination of Examples 66-67, wherein the memory is further configured to store executable instructions that, when executed by the processing circuitry, causes each transceiver chain from the plurality of transceiver chains to: generate, via another DTC from the first reference signal, a fractionally-multiplied first reference signal having a frequency that is a fractional multiple of the first frequency, and generate, via the HB ILFM, the one or more HB LO signals having the HB LO frequency that is an integer multiple of the fractional multiple of the first frequency associated with the fractionally-multiplied first reference signal.

Example 69. A local oscillator (LO) signal generator means, comprising: a frequency synthesizer means for generating a first reference signal having a first frequency; a digital to time converter (DTC) means for generating a second reference signal based upon the first reference signal, the second reference signal having a second frequency that is a fractional multiple of the first frequency; a high-band (HB) path including a HB injection locked frequency multiplier (ILFM) means, the HB ILCM means generating one or more HB local oscillator (LO) signals having a HB LO frequency that is based upon the first frequency associated with the first reference signal; and a low-band (LB) frequency path including a LB ILFM means, the LB ILCM means generating one or more LB local oscillator (LO) signals having a LB LO frequency that is based upon the second frequency associated with the second reference signal.

Example 70. The LO signal generator means of Example 69, wherein the HB ILCM means is from among a plurality of HB ILCM means within the HB path, each one of the plurality of HB ILCM means being associated with a respective transceiver chain means, and wherein the LB ILCM means is from among a plurality of LB ILCM means within the LB path, each one of the plurality of LB ILCM means being associated with a respective transceiver chain means.

Example 71. The LO signal generator means of any combination of Examples 69-70, wherein the HB ILCM means generates a set of quadrature LO signals as the one or more HB LO signals, and wherein the LB ILCM means generates a set of quadrature LO signals as the one or more LB LO signals.

Example 72. The LO signal generator means of any combination of Examples 69-71, wherein the HB ILCM means is coupled to one or more mixers configured to perform direct downconversion of received signals to baseband using the one or more HB LO signals, and wherein the LB ILCM means is coupled to one or more mixers configured to perform direct downconversion of received signals to baseband using the one or more LB LO signals.

Example 73. The LO signal generator means any combination of Examples 69-72, wherein the received signals that are directly downconverted to baseband via the one or more mixers in the HB path and the received signals that are directly downconverted to baseband via the one or more mixers in the LB path are within a range of mm-wave frequencies.

Example 74. The LO signal generator of any combination of Examples 69-73, wherein the HB ILFM means generates the one or more HB LO signals having the HB LO frequency that is an integer multiple of the first frequency associated with the first reference signal.

Example 75. The LO signal generator means of any combination of Examples 69-74, further comprising: another DTC means for generating, from the first reference signal, a fractionally-multiplied first reference signal having a frequency that is a fractional multiple of the first frequency, and wherein the HB ILFM means generates the one or more HB LO signals having the HB LO frequency that is an integer multiple of the fractional multiple of the first frequency associated with the fractionally-multiplied first reference signal.

Example 76. The LO signal generator means of any combination of Examples 69-75, further comprising: frequency divider means for performing frequency division on the first reference signal to generate a frequency-divided reference signal, and wherein the DTC means further performs a fractional multiplication of the frequency-divided reference signal to generate the second reference signal.

Example 77. The LO signal generator means of any combination of Examples 69-76, wherein the DTC means receives digital phase ramp data that is varied to adjust the fractional multiple of the first frequency and thereby adjusts the second frequency associated with the second reference signal.

Example 78. A local oscillator (LO) signal generator means, comprising: a frequency synthesizer means for generating a first reference signal having a first frequency; a first digital to time converter (DTC) means for generating a second reference signal based upon the first reference signal, the second reference signal having a second frequency that is a fractional multiple of the first frequency; an intermediate frequency (IF) mixing means for generating (i) a first up-converted analog IF signal based upon the first reference signal, and (ii) a second up-converted analog IF signal based upon the first reference signal; and a transmission mixing means including: a first high band (HB) injection locked frequency multiplier (ILFM) means for generating one or more HB TX local oscillator (LO) signals, and for up-converting the first up-converted analog IF signal to a first transmission frequency, the HB TX LO signals having a HB TX LO frequency that is based upon the second frequency of the second reference signal; and a first low band (LB) ILFM means for generating one or more LB TX local oscillator (LO) signals, and for up-converting the second up-converted analog IF signal to a second transmission frequency, the LB TX LO signals having a LB TX LO frequency that is based upon the second frequency of the second reference signal.

Example 79. The LO signal generator means of Example 78, wherein: the HB TX LO frequency is based upon a first integer multiple of the first reference signal, the LB TX LO frequency is based upon a second integer multiple of the second reference signal, and the first integer multiple is different than the second integer multiple.

Example 80. The LO signal generator means of any combination of Examples 78-79, further comprising: a second DTC means coupled to the first HB ILFM, the second DTC means further fractionally-multiplying the second frequency associated with the second reference signal, wherein the first HB ILFM means generates the one or more HB TX LO signals having the HB LO TX frequency that is a first integer multiple of the further fractional multiple of the second frequency of the second reference signal generated via the second DTC means.

Example 81. The LO signal generator means of any combination of Examples 78-80, further comprising: a third DTC means coupled to the first LB ILFM means, the third DTC configured to further fractionally-multiply the second frequency associated with the second reference signal, wherein the first LB ILFM means generates the one or more LB TX LO signals having the LB TX LO frequency that is a second integer multiple of the further fractional multiple of the second frequency of the second reference signal generated via the third DTC means.

Example 82. The LO signal generator means of any combination of Examples 78-81, further comprising: frequency divider means for performing frequency division of the first reference signal to generate a frequency-divided reference signal, and wherein the first DTC means further performs fractional multiplication of the frequency-divided reference signal to generate the second reference signal.

Example 83. The LO signal generator of any combination of Examples 78-82, further comprising: a second HB ILFM means for frequency multiplying the first reference signal to generate one or more HB IF LO signals for up-conversion of a first baseband signal to the first up-converted analog IF signal via the IF mixing means; and a second LB ILFM means for frequency multiplying the first reference signal to generate one or more LB IF LO signals for up-conversion of a second baseband signal to the second up-converted analog IF signal via the IF mixing means.

Example 84. The LO signal generator means of any combination of Examples 78-83, wherein the second HB ILCM means generates a set of quadrature LO signals as the one or more HB IF LO signals, and wherein the second LB ILCM means generates a set of quadrature LO signals as the one or more LB IF LO signals.

Example 85. The LO signal generator means of any combination of Examples 78-84, wherein the first transmission frequency and the second transmission frequency are within a range of mm-Wave frequencies.

Example 86. A wireless device means, comprising: a plurality of transceiver chain means; processing circuitry; and a memory configured to store executable instructions that, when executed by the processing circuitry, causes each transceiver chain means from the plurality of transceiver chain means to: generate a first reference signal having a first frequency; generate, via a digital to time converter (DTC) means, a second reference signal based upon the first reference signal, the second reference signal having a second frequency that is a fractional multiple of the first frequency; generate, via a high-band (HB) injection locked frequency multiplier (ILFM) means, one or more HB local oscillator (LO) signals having a HB LO frequency that is based upon the first frequency associated with the first reference signal; and generate, via a low-band (LB) ILFM means, one or more LB local oscillator (LO) signals having a LB LO frequency that is based upon the second frequency associated with the second reference signal.

Example 87. The wireless device means of Example 86, wherein the HB ILCM means generates a set of quadrature LO signals as the one or more HB LO signals, and wherein the LB ILCM means generates a set of quadrature LO signals as the one or more LB LO signals.

Example 88. The wireless device means of any combination of Examples 86-87, wherein the memory is further configured to store executable instructions that, when executed by the processing circuitry, causes each transceiver chain means from the plurality of transceiver chain means to: generate, via another DTC means from the first reference signal, a fractionally-multiplied first reference signal having a frequency that is a fractional multiple of the first frequency, and generate, via the HB ILFM means, the one or more HB LO signals having the HB LO frequency that is an integer multiple of the fractional multiple of the first frequency associated with the fractionally-multiplied first reference signal.

An apparatus as shown and described.
A method as shown and described.

EXAMPLES—III

The following examples pertain to further aspects.
Example 89. A transceiver, comprising: a plurality of digital transceiver portions, each digital transceiver portion from among the plurality of digital transceiver portions comprising: transmit path circuitry coupled to an antenna, the transmit path circuitry configured to convert digital transmit data to an analog transmit signal that is transmitted via the antenna; a DC-DC converter corresponding to each digital transceiver portion, the DC-DC converter configured to provide a supply voltage; and one or more feedback components configured to provide feedback measurements with regards to operation of the each respective digital transceiver portion; and processor circuitry configured to adjust the supply voltage of the DC-DC converter based upon the feedback measurements.

Example 90. The transceiver of Example 89, wherein the processor circuitry is configured to adjust the supply voltage of the DC-DC converter to change an amplifier bias setting of an amplifier associated with the transmit path circuitry.

Example 91. The transceiver of any combination of Examples 89-90, wherein the processor circuitry is configured to adjust the supply voltage of the DC-DC converter to change the amplifier bias setting of the amplifier to track a modulation envelope of the analog transmit signal that is transmitted via the antenna.

Example 92. The transceiver of any combination of Examples 89-91, wherein the one or more feedback components are configured to measure a forward and reverse power within the transmit path circuitry associated with the analog transmit signal that is transmitted via the antenna, and wherein the processor circuitry is configured to (i) track a voltage standing wave ratio (VSWR) between the transmit path circuitry and the antenna using the measured forward and reverse power, and (ii) change an amplifier bias setting of an amplifier associated with the transmit path circuitry based upon the tracked VSWR.

Example 93. The transceiver of any combination of Examples 89-92, wherein each digital transceiver portion from among the plurality of digital transceiver portions further comprises: a digital front end (DFE) corresponding to each digital transceiver portion within the transmit path circuitry, the digital DFE configured to apply digital pre-distortion (DPD) parameters to the digital transmit data, wherein the processor circuitry is configured to adjust the DPD parameters based upon the feedback measurements.

Example 94. The transceiver of any combination of Examples 89-93, wherein each digital transceiver portion from among the plurality of digital transceiver portions further comprises: a digital front end (DFE) corresponding to each digital transceiver portion within the transmit path circuitry, the digital DFE configured to apply digital pre-distortion (DPD) parameters to the digital transmit data, and wherein the processor circuitry is configured to adjust the DPD parameters based upon the tracked VSWR.

Example 95. The transceiver of any combination of Examples 89-94, wherein the one or more feedback components are configured to measure a junction temperature of an amplifier associated with the transmit path circuitry, and wherein the processor circuitry is configured to adjust the supply voltage of the DC-DC converter to change an amplifier bias setting of the amplifier based upon the measured junction temperature.

Example 96. The transceiver of any combination of Examples 89-95, wherein the processor circuitry is configured to adjust the supply voltage of the DC-DC converter to change the amplifier bias setting to cause the analog transmit signal that is transmitted via the antenna to have a magnitude in accordance with a stored codebook value.

Example 97. The transceiver of any combination of Examples 89-96, wherein the DC-DC converter included in each digital transceiver portion from among the plurality of digital transceiver portions provides a separate supply voltage that is independently adjustable via the processor circuitry with respect to the other digital transceiver portions.

Example 98. The transceiver of any combination of Examples 89-97, further comprising: receive path circuitry coupled to the antenna, and wherein the processor circuitry is configured to adjust the supply voltage of the DC-DC converter to change an amplifier bias setting of an amplifier associated with the receive path circuitry.

Example 99. A computer-implemented method in a transceiver that includes a plurality of digital transceiver portions, comprising: applying, via a DC-DC converter associated with one of the plurality of digital transceiver portions, initial transceiver parameters that are associated with settings of one or more transceiver components included in the one of the plurality of digital transceiver portions, the one or more transceiver components being supplied power via the DC-DC converter; tracking, via processing circuitry, a voltage standing wave ratio (VSWR) between an amplifier and an antenna associated with the one of the plurality of digital transceiver portions; and adjusting, via the processing circuitry, settings of the DC-DC converter to modify the initial transceiver parameters based upon the tracked VSWR.

Example 100. The computer-implemented method of Example 99, further comprising: applying, via a common digital front end (DFE) shared among the plurality of digital transceiver portions, initial digital pre-distortion (DPD) parameters to digital data representative of a signal to be transmitted; and updating, via a DFE associated with the one of the plurality of digital transceiver portions, the DPD parameters based upon the tracked VSWR.

Example 101. The computer-implemented method of any combination of Examples 99-100, wherein the acts of (i) adjusting the settings of the DC-DC converter, and (ii) adjusting the DPD parameters based upon the tracked VSWR occur concurrently.

Example 102. The computer-implemented method of any combination of Examples 99-101, further comprising: repeating the acts of (i) adjusting the settings of the DC-DC converter, and (ii) updating the DPD parameters during operation of the transceiver over time as the tracked VSWR changes.

Example 103. The computer-implemented method of any combination of Examples 99-102, wherein each of the plurality of transceiver portions includes a DC-DC converter.

Example 104. A wireless device, comprising: a plurality of digital transceiver portions, each digital transceiver portion from among the plurality of digital transceiver portions configured to provide a supply voltage via a respective DC-DC converter, and to provide feedback measurements with regards to an operation of each respective digital transceiver portion; and processor circuitry configured to adjust the supply voltage of the each DC-DC converter of each respective digital transceiver portion based upon the feedback measurements from each respective digital transceiver portion.

Example 105. The wireless device of Example 104, wherein the processor circuitry is configured to adjust the supply voltage of each DC-DC converter of each respective digital transceiver portion to change an amplifier bias setting of an amplifier associated with transmit path circuitry included in each respective digital transceiver portion.

Example 106. The wireless device of any combination of Examples 104-105, wherein the processor circuitry is configured to adjust the supply voltage of each DC-DC converter of each respective digital transceiver portion to change an amplifier bias setting of an amplifier associated with receive path circuitry included in each respective digital transceiver portion.

Example 107. The wireless device of any combination of Examples 104-106, wherein the processor circuitry is configured to change the amplifier bias setting of the amplifier associated with transmit path circuitry included in each respective digital transceiver portion to track a modulation envelope of a transmitted signal that is associated with each respective digital transceiver portion.

Example 108. The wireless device of any combination of Examples 104-107, wherein the one or more feedback components included in each respective digital transceiver portion are configured to measure a forward and reverse power within transmit path circuitry associated with each respective digital transceiver portion, and wherein the processor circuitry is configured to (i) track a voltage standing wave ratio (VSWR) using the measured forward and reverse power, and (ii) change an amplifier bias setting of an amplifier associated with the transmit path circuitry included in each respective digital transceiver portion based upon the tracked VSWR.

Example 109. The wireless device of any combination of Examples 104-108, wherein each digital transceiver portion from among the plurality of digital transceiver portions further comprises: a digital front end (DFE) within transmit path circuitry included in each respective digital transceiver portion, the digital DFE configured to apply digital pre-distortion (DPD) parameters to digital transmit data, and wherein the processor circuitry is configured to adjust the DPD parameters based upon the feedback measurements.

Example 110. The wireless device of any combination of Examples 104-109, wherein each digital transceiver portion from among the plurality of digital transceiver portions further comprises: a digital front end (DFE) within transmit path circuitry included in each respective digital transceiver portion, the digital DFE configured to apply digital pre-distortion (DPD) parameters to digital transmit data, and wherein the processor circuitry is configured to adjust the DPD parameters based upon the tracked VSWR.

Example 111. The wireless device of any combination of Examples 104-110, wherein the one or more feedback components included in each respective digital transceiver portion are configured to measure a junction temperature of an amplifier associated with transmit path circuitry included in each respective digital transceiver portion, and wherein the processor circuitry is configured to adjust the supply voltage of the DC-DC converter to change an amplifier bias setting of the amplifier based upon the measured junction temperature.

Example 112. The wireless device of any combination of Examples 104-111, wherein the processor circuitry is configured to adjust the supply voltage of each DC-DC converter included in each respective digital transceiver portion to change an amplifier bias setting of an amplifier associated with transmit path circuitry included in each respective digital transceiver portion to cause a transmit signal to have a magnitude in accordance with a stored codebook magnitude value.

Example 113. A transceiver means, comprising: a plurality of digital transceiver portions, each digital transceiver portion from among the plurality of digital transceiver portions comprising: transmit path means coupled to an antenna, the transmit path means converting digital transmit data to an analog transmit signal that is transmitted via the antenna; a DC-DC converter means corresponding to each digital transceiver portion, the DC-DC converter means providing a supply voltage; and one or more feedback means providing feedback measurements with regards to operation of the each respective digital transceiver portion; and processor circuitry configured to adjust the supply voltage of the DC-DC converter based upon the feedback measurements.

Example 114. The transceiver means of Example 113, wherein the processor circuitry is configured to adjust the supply voltage of the DC-DC converter means to change an amplifier bias setting of an amplifier associated with the transmit path means.

Example 115. The transceiver means of any combination of Examples 113-114, wherein the processor circuitry is configured to adjust the supply voltage of the DC-DC converter means to change the amplifier bias setting of the amplifier to track a modulation envelope of the analog transmit signal that is transmitted via the antenna.

Example 116. The transceiver means of any combination of Examples 113-115, wherein the one or more feedback means are configured to measure a forward and reverse power within the transmit path means associated with the analog transmit signal that is transmitted via the antenna, and wherein the processor circuitry is configured to (i) track a voltage standing wave ratio (VSWR) between the transmit path means and the antenna using the measured forward and reverse power, and (ii) change an amplifier bias setting of an amplifier associated with the transmit path means based upon the tracked VSWR.

Example 117. The transceiver means of any combination of Examples 113-116, wherein each digital transceiver portion from among the plurality of digital transceiver portions further comprises: a digital front end (DFE) means corresponding to each digital transceiver portion within the transmit path means, the digital DFE means applying digital pre-distortion (DPD) parameters to the digital transmit data, wherein the processor circuitry is configured to adjust the DPD parameters based upon the feedback measurements.

Example 118. The transceiver means of any combination of Examples 113-117, wherein each digital transceiver portion from among the plurality of digital transceiver portions further comprises: a digital front end (DFE) means corresponding to each digital transceiver portion within the transmit path circuitry, the digital DFE means applying digital pre-distortion (DPD) parameters to the digital transmit data, and wherein the processor circuitry is configured to adjust the DPD parameters based upon the tracked VSWR.

Example 119. The transceiver means of any combination of Examples 113-118, wherein the one or more feedback means are configured to measure a junction temperature of an amplifier associated with the transmit path means, and wherein the processor circuitry is configured to adjust the supply voltage of the DC-DC converter means to change an amplifier bias setting of the amplifier based upon the measured junction temperature.

Example 120. The transceiver means of any combination of Examples 113-119, wherein the processor circuitry is configured to adjust the supply voltage of the DC-DC converter means to change the amplifier bias setting to cause the analog transmit signal that is transmitted via the antenna to have a magnitude in accordance with a stored codebook value.

Example 121. The transceiver means of any combination of Examples 113-120, wherein the DC-DC converter means included in each digital transceiver portion from among the plurality of digital transceiver portions provides a separate supply voltage that is independently adjustable via the processor circuitry with respect to the other digital transceiver portions.

Example 122. The transceiver means of any combination of Examples 113-121, further comprising: receive path means coupled to the antenna, and wherein the processor circuitry is configured to adjust the supply voltage of the DC-DC converter means to change an amplifier bias setting of an amplifier associated with the receive path means.

Example 123. A computer-implemented method in a transceiver means that includes a plurality of digital transceiver portions, comprising: applying, via a DC-DC converter means associated with one of the plurality of digital transceiver portions, initial transceiver parameters that are associated with settings of one or more transceiver means included in the one of the plurality of digital transceiver portions, the one or more transceiver means being supplied power via the DC-DC converter means; tracking, via processing circuitry, a voltage standing wave ratio (VSWR) between an amplifier means and an antenna associated with the one of the plurality of digital transceiver portions; and adjusting, via the processing circuitry, settings of the DC-DC converter means to modify the initial transceiver parameters based upon the tracked VSWR.

Example 124. The computer-implemented method of Example 123, further comprising: applying, via a common digital front end (DFE) means shared among the plurality of digital transceiver portions, initial digital pre-distortion (DPD) parameters to digital data representative of a signal to be transmitted; and updating, via a DFE means associated with the one of the plurality of digital transceiver portions, the DPD parameters based upon the tracked VSWR.

Example 125. The computer-implemented method of any combination of Examples 123-124, wherein the acts of (i) adjusting the settings of the DC-DC converter, and (ii) adjusting the DPD parameters based upon the tracked VSWR occur concurrently.

Example 126. The computer-implemented method of any combination of Examples 123-125, further comprising: repeating the acts of (i) adjusting the settings of the DC-DC converter means, and (ii) updating the DPD parameters during operation of the transceiver means over time as the tracked VSWR changes.

Example 127. The computer-implemented method of any combination of Examples 123-126, wherein each of the plurality of transceiver portions includes a DC-DC converter means.

Example 128. A wireless device means, comprising: a plurality of digital transceiver portions, each digital transceiver portion from among the plurality of digital transceiver portions configured to provide a supply voltage via a respective DC-DC converter means, and to provide feedback measurements with regards to an operation of each respective digital transceiver portion; and processor circuitry configured to adjust the supply voltage of the each DC-DC converter means of each respective digital transceiver portion based upon the feedback measurements from each respective digital transceiver portion.

Example 129. The wireless device of Example 128, wherein the processor circuitry is configured to adjust the supply voltage of each DC-DC converter means of each respective digital transceiver portion to change an amplifier bias setting of an amplifier associated with transmit path means included in each respective digital transceiver portion.

Example 130. The wireless device of any combination of Examples 128-129, wherein the processor circuitry is configured to adjust the supply voltage of each DC-DC converter means of each respective digital transceiver portion to change an amplifier bias setting of an amplifier associated with receive path means included in each respective digital transceiver portion.

Example 131. The wireless device of any combination of Examples 128-130, wherein the processor circuitry is configured to change the amplifier bias setting of the amplifier associated with transmit path means included in each respective digital transceiver portion to track a modulation envelope of a transmitted signal that is associated with each respective digital transceiver portion.

Example 132. The wireless device of any combination of Examples 128-131, wherein the one or more feedback means included in each respective digital transceiver portion are configured to measure a forward and reverse power within transmit path means associated with each respective digital transceiver portion, and wherein the processor circuitry is configured to (i) track a voltage standing wave ratio (VSWR) using the measured forward and reverse power, and (ii) change an amplifier bias setting of an amplifier associated with the transmit path means included in each respective digital transceiver portion based upon the tracked VSWR.

Example 133. The wireless device of any combination of Examples 128-132, wherein each digital transceiver portion from among the plurality of digital transceiver portions further comprises: a digital front end (DFE) means within the transmit path means included in each respective digital transceiver portion, the digital DFE means applying digital pre-distortion (DPD) parameters to digital transmit data, and wherein the processor circuitry is configured to adjust the DPD parameters based upon the feedback measurements.

Example 134. The wireless device of any combination of Examples 128-133, wherein each digital transceiver portion from among the plurality of digital transceiver portions further comprises: a digital front end (DFE) means within transmit path means included in each respective digital transceiver portion, the digital DFE means applying digital pre-distortion (DPD) parameters to digital transmit data, and wherein the processor circuitry is configured to adjust the DPD parameters based upon the tracked VSWR.

Example 135. The wireless device of any combination of Examples 128-134, wherein the one or more feedback means included in each respective digital transceiver portion are configured to measure a junction temperature of an amplifier associated with transmit path means included in each respective digital transceiver portion, and wherein the processor circuitry is configured to adjust the supply voltage of the DC-DC converter to change an amplifier bias setting of the amplifier based upon the measured junction temperature.

Example 136. The wireless device of any combination of Examples 128-135, wherein the processor circuitry is configured to adjust the supply voltage of each DC-DC converter means included in each respective digital transceiver portion to change an amplifier bias setting of an amplifier associated with transmit path means included in each respective digital transceiver portion to cause a transmit signal to have a magnitude in accordance with a stored codebook magnitude value.

An apparatus as shown and described.

A method as shown and described.

EXAMPLES—IV

The following examples pertain to further aspects.

Example 137. A receiver, comprising: a digital front end (DFE); and a plurality of receive chains, each receive chain from among the plurality of receive chains being configured to receive a signal and to downconvert the signal to a baseband signal, wherein each receive chain from among the plurality of receive chains includes at least one analog-to-digital converter (ADC) configured to output a digitized version of the downconverted baseband signal to the DFE, and wherein the DFE is further configured to process the digitized version of the downconverted baseband signal received from each of the plurality of receive chains in parallel with one another to estimate a time delay associated with the signal received via each of the plurality of receive chains.

Example 138. The receiver of Example 137, wherein the DFE is configured to process the digitized version of the downconverted baseband signal received from each of the plurality of receive chains in parallel with one another by utilizing a correlation of the signals received at each of the plurality of receive chains.

Example 139. The receiver of any combination of Examples 137-138, wherein the DFE is configured to process the digitized version of the downconverted baseband signal received from each of the plurality of receive chains in parallel with one another to further estimate the signal received via each of the plurality of receive chains jointly with the estimation of the time delay associated with the signal received via each of the plurality of receive chains.

Example 140. The receiver of any combination of Examples 137-139, wherein a correlation of the signals received via each of the plurality of receive chains and the estimate of the time delay associated with the signals received via each of the plurality of receive chains is used to suppress quantization noise associated with one or more analog-to-digital converters (ADCs) associated with one or more of the plurality of receive chains.

Example 141. The receiver of any combination of Examples 137-140, wherein the received signal has a frequency that is within a range of mm-Wave frequencies.

Example 142. The receiver of any combination of Examples 137-141, wherein the at least one ADC included in each receive chain from among the plurality of receive chains includes a successive approximation (SAR) ADC.

Example 143. A receiver, comprising: a digital front end (DFE); and a plurality of receive chains, each receive chain from among the plurality of receive chains being configured to receive a signal and to downconvert the signal to a baseband signal, wherein each receive chain from among the plurality of receive chains includes at least one analog-to-digital converter (ADC) configured to output a digitized version of the downconverted baseband signal to the DFE, and wherein the DFE is further configured to perform a sectorized scan to detect a received blocker signal in a direction different from that of a main beam direction associated with the signal by analyzing signal energy represented by the digitized version of the downconverted baseband signal from each of the plurality of receive chains in parallel with one another and determining whether the analyzed signal energy exceeds a threshold energy level.

Example 144. The receiver of Example 143, wherein the DFE is further configured to perform the sectorized scan over each one of an octant of space.

Example 145. The receiver of any combination of Examples 143-144, wherein the DFE is further configured to, upon detecting the received blocker signal, to calculate a digital estimated blocker signal using one or more most significant bits (MSBs) of the digitized version of the downconverted baseband signal output from the at least one ADC associated with each of the plurality of receive chains during the sectorized scan.

Example 146. The receiver of any combination of Examples 143-145, wherein the DFE is configured to calculate the digital estimated blocker signal during a same sampling window for which the at least one ADC associated with each of the plurality of receive chains output the one or more MSBs of the digitized version of the downconverted baseband signal.

Example 147. The receiver of any combination of Examples 143-146, further comprising: a feedback path coupled to the DFE and to the at least one ADC associated with each respective one of the plurality of receive chains, wherein the DFE is configured to provide the digital estimated blocker signal to the at least one ADC associated with each respective one of the plurality of receive chains via the feedback path to at least partially attenuate the blocker signal.

Example 148. The receiver of any combination of Examples 143-147, wherein the at least one ADC associated with each respective one of the plurality of receive chains is a successive approximation (SAR) ADC including a quantizer path.

Example 149. The receiver of any combination of Examples 143-148, wherein the ADC includes a quantizer feedback path, and wherein the digital estimated blocker signal is coupled to the quantizer feedback path to suppress the blocker signal at the ADC.

Example 150. The receiver of any combination of Examples 143-149, wherein the received signal has a frequency that is within a range of mm-Wave frequencies.

Example 151. A receiver, comprising: a digital front end (DFE); and a plurality of receive chains, each receive chain from among the plurality of receive chains being configured to receive a signal and to downconvert the signal to a baseband signal, wherein each receive chain from among the plurality of receive chains includes a plurality of tuning circuitry blocks, one or more of the tuning circuitry blocks being coupled to at least one adjacent one of the plurality of receive chains, wherein the DFE is configured to cause one or more of the plurality of tuning circuitry blocks to apply an adjustable gain weighting to the baseband signal received at each receive chain from among the plurality of receive chains such that at least one analog-to-digital converter (ADC) within each of the plurality of receive chains receives a combination of weighted baseband signals, with at least one weighted baseband signal from among the combination of weighted baseband signals being output from at least one adjacent one of the plurality of receive chains, and wherein the DFE is further configured to perform a sectorized scan to detect a received blocker signal in a direction different from a main beam direction associated with the signal, and to utilize a digitized combination of weighted baseband signals output by the at least one ADC within each of the plurality of receive chains to tune a spatial notch filter.

Example 152. The receiver of Example 151, wherein the one or more of the tuning circuitry blocks is coupled to at least one adjacent one of the plurality of receive chains in a feedforward manner.

Example 153. The receiver of any combination of Examples 151-152, wherein each one of the plurality of receive chains is coupled to a respective antenna, and wherein the at least one adjacent one of the plurality of receive chains is coupled to an antenna that is physically adjacent to another one of the plurality of receive chains.

Example 154. The receiver of any combination of Examples 151-153, wherein the DFE is configured to tune the spatial notch filter with a null or attenuation in a direction associated with the received blocker signal to at least partially attenuate the received blocker signal.

Example 155. The receiver of any combination of Examples 151-154, wherein each receive chain from among the plurality of receive chains includes the one or more tuning circuitry blocks connected in parallel with one another.

Example 156. The receiver of any combination of Examples 151-155, wherein each one of the plurality of receive chains is coupled to a respective antenna, and wherein at least one analog-to-digital converter (ADC) within each of the plurality of receive chains receives a combination of weighted baseband signals associated with (i) a signal received from a respectively coupled antenna, (ii) a signal received from a first antenna that is physically adjacent to the respectively coupled antenna that is associated with one of the plurality of receive chains, and (iii) a signal received from a second antenna that is physically adjacent to the respectively coupled antenna that is associated with another one of the plurality of receive chains.

Example 157. The receiver of any combination of Examples 151-156, wherein the respectively coupled antenna, the first physically adjacent antenna, and the second physically adjacent antenna form part of a two-dimensional (2-D) antenna array.

Example 158. A receiver, comprising: a digital front end (DFE) including sectorized scanning circuitry; and a plurality of receive chains, each receive chain from among the plurality of receive chains including: a mixer configured to downconvert a received signal to a baseband signal; and at least one analog-to-digital converter (ADC) configured to convert the baseband signal to a digitized baseband signal, wherein the sectorized scanning circuitry is configured to apply a digital rotation of scanning angle data included in the digitized baseband signal received via each of the plurality of receive chains in parallel with one another to identify a blocker signal in a direction different from that of a main beam direction associated with the received signal when a signal energy resulting from at least one digital rotation of the scanning angle data received via each of the plurality of receive chains exceeds a threshold energy level.

Example 159. The receiver of Example 158, wherein the DFE further comprises: a blocker extraction circuitry configured to calculate a digital estimate of the identified blocker signal, and wherein the at least one ADC includes a quantizer feedback path, the digital estimate of the blocker signal being coupled to the quantizer feedback path to suppress the blocker signal at the at least one ADC.

Example 160. The receiver of any combination of Examples 158-159, wherein the at least one ADC associated with each respective one of the plurality of receive chains is a successive approximation (SAR) ADC.

Example 161. A receiver means, comprising: a digital front end (DFE) means; and a plurality of receive chain means, each receive chain means from among the plurality of receive chain means receiving a signal and downconverting the signal to a baseband signal, wherein each receive chain means from among the plurality of receive chain means includes at least one analog-to-digital converter (ADC) means for outputting a digitized version of the downconverted baseband signal to the DFE means, and wherein the DFE means processes the digitized version of the downconverted baseband signal received from each of the plurality of receive chain means in parallel with one another to estimate a time delay associated with the signal received via each of the plurality of receive chain means.

Example 162. The receiver means of Example 161, wherein the DFE means processes the digitized version of the downconverted baseband signal received from each of the plurality of receive chain means in parallel with one another by utilizing a correlation of the signals received at each of the plurality of receive chain means.

Example 163. The receiver means of any combination of Examples 161-162, wherein the DFE means processes the digitized version of the downconverted baseband signal received from each of the plurality of receive chain means in parallel with one another to further estimate the signal received via each of the plurality of receive chain means jointly with the estimation of the time delay associated with the signal received via each of the plurality of receive chain means.

Example 164. The receiver means of any combination of Examples 161-163, wherein a correlation of the signals received via each of the plurality of receive chain means and the estimate of the time delay associated with the signals received via each of the plurality of receive chain means is used to suppress quantization noise associated with one or more analog-to-digital converters (ADCs) means associated with one or more of the plurality of receive chain means.

Example 165. The receiver means of any combination of Examples 161-164, wherein the received signal has a frequency that is within a range of mm-Wave frequencies.

Example 166. The receiver means of any combination of Examples 161-165, wherein the at least one ADC means included in each receive chain means from among the plurality of receive chain means includes a successive approximation (SAR) ADC.

Example 167. A receiver means, comprising: a digital front end (DFE) means; and a plurality of receive chain means, each receive chain means from among the plurality of receive chain means receiving a signal and downconverting the signal to a baseband signal, wherein each receive chain means from among the plurality of receive chain means includes at least one analog-to-digital converter (ADC) means for outputting a digitized version of the downconverted baseband signal to the DFE means, and wherein the DFE means performs a sectorized scan to detect a received blocker signal in a direction different from that of a main beam direction associated with the signal by analyzing signal energy represented by the digitized version of the downconverted baseband signal from each of the plurality of receive chain means in parallel with one another and determining whether the analyzed signal energy exceeds a threshold energy level.

Example 168. The receiver means of Example 167, wherein the DFE means performs the sectorized scan over each one of an octant of space.

Example 169. The receiver means of any combination of Examples 167-168, wherein the DFE means further, upon detecting the received blocker signal, calculates a digital estimated blocker signal using one or more most significant bits (MSBs) of the digitized version of the downconverted baseband signal output from the at least one ADC associated with each of the plurality of receive chain means during the sectorized scan.

Example 170. The receiver means of any combination of Examples 167-169, wherein the DFE means calculates the digital estimated blocker signal during a same sampling window for which the at least one ADC means associated with each of the plurality of receive chain means output the one or more MSBs of the digitized version of the downconverted baseband signal.

Example 171. The receiver means of any combination of Examples 167-170, further comprising: a feedback path coupled to the DFE means and to the at least one ADC means associated with each respective one of the plurality of receive chain means, wherein the DFE means provides the digital estimated blocker signal to the at least one ADC means associated with each respective one of the plurality of receive chain means via the feedback path to at least partially attenuate the blocker signal.

Example 172. The receiver means of any combination of Examples 167-171, wherein the at least one ADC means associated with each respective one of the plurality of receive chain means is a successive approximation (SAR) ADC including a quantizer path.

Example 173. The receiver means of any combination of Examples 167-172, wherein the ADC means includes a quantizer feedback path, and wherein the digital estimated blocker signal is coupled to the quantizer feedback path to suppress the blocker signal at the ADC means.

Example 174. The receiver means of any combination of Examples 167-173, wherein the received signal has a frequency that is within a range of mm-Wave frequencies.

Example 175. A receiver means, comprising: a digital front end (DFE) means; and a plurality of receive chain means, each receive chain means from among the plurality of receive chain means receiving a signal and downconverting the signal to a baseband signal, wherein each receive chain means from among the plurality of receive chain means includes a plurality of tuning means, one or more of the tuning means being coupled to at least one adjacent one of the plurality of receive chain means, wherein the DFE means causes one or more of the plurality of tuning means to apply an adjustable gain weighting to the baseband signal received at each receive chain means from among the plurality of receive chain means such that at least one analog-to-digital converter (ADC) means within each of the plurality of receive chain means receives a combination of weighted baseband signals, with at least one weighted baseband signal from among the combination of weighted baseband signals being output from at least one adjacent one of the plurality of receive chain means, and wherein the DFE means is further configured to perform a sectorized scan to detect a received blocker signal in a direction different from a main beam direction associated with the signal, and to utilize a digitized combination of weighted baseband signals output by the at least one ADC means within each of the plurality of receive chain means to tune a spatial notch filter.

Example 176. The receiver means of Example 175, wherein the one or more of the tuning means is coupled to at least one adjacent one of the plurality of receive chain means in a feedforward manner.

Example 177. The receiver means of any combination of Examples 175-176, wherein each one of the plurality of receive chain means is coupled to a respective antenna, and wherein the at least one adjacent one of the plurality of receive chain means is coupled to an antenna that is physically adjacent to another one of the plurality of receive chain means.

Example 178. The receiver means of any combination of Examples 175-177, wherein the DFE means tunes the spatial notch filter with a null or attenuation in a direction associated with the received blocker signal to at least partially attenuate the received blocker signal.

Example 179. The receiver means of any combination of Examples 175-178, wherein each receive chain means from among the plurality of receive chain means includes the one or more tuning means connected in parallel with one another.

Example 180. The receiver means of any combination of Examples 175-179, wherein each one of the plurality of receive chain means is coupled to a respective antenna, and wherein at least one analog-to-digital converter (ADC) means within each of the plurality of receive chain means receives a combination of weighted baseband signals associated with (i) a signal received from a respectively coupled antenna, (ii) a signal received from a first antenna that is physically adjacent to the respectively coupled antenna that is associated with one of the plurality of receive chain means, and (iii) a signal received from a second antenna that is physically adjacent to the respectively coupled antenna that is associated with another one of the plurality of receive chain means.

Example 181. The receiver means of any combination of Examples 175-180, wherein the respectively coupled antenna, the first physically adjacent antenna, and the second physically adjacent antenna form part of a two-dimensional (2-D) antenna array.

Example 182. A receiver means, comprising: a digital front end (DFE) means including sectorized scanning means; and a plurality of receive chain means, each receive chain means from among the plurality of receive chain means including: a mixer means for downconverting a received signal to a baseband signal; and at least one analog-to-digital converter (ADC) means for converting the baseband signal to a digitized baseband signal, wherein the sectorized scanning means applies a digital rotation of scanning angle data included in the digitized baseband signal received via each of the plurality of receive chain means in parallel with one another to identify a blocker signal in a direction different from that of a main beam direction associated with the received signal when a signal energy resulting from at least one digital rotation of the scanning angle data received via each of the plurality of receive chain means exceeds a threshold energy level.

Example 183. The receiver means of Example 182, wherein the DFE means further comprises: a blocker extraction means for calculating a digital estimate of the identified blocker signal, and wherein the at least one ADC means includes a quantizer feedback path, the digital estimate of the blocker signal being coupled to the quantizer feedback path to suppress the blocker signal at the at least one ADC means.

Example 184. The receiver means of any combination of Examples 182-183, wherein the at least one ADC means associated with each respective one of the plurality of receive chain means is a successive approximation (SAR) ADC.

An apparatus as shown and described.
A method as shown and described.

CONCLUSION

Throughout the disclosure numeric variables may be provided to indicate any suitable number of certain components, such as M, N, K, etc. In some of the examples provided, the numeric variables may be repeated for ease of explanation. However, the aspects described herein are not limited to these examples, and components being referenced by the same numeric variable suffix need not be equal to each other.

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A local oscillator (LO) signal generator, comprising:
a frequency synthesizer configured to generate a first reference signal having a first frequency;
a digital to time converter (DTC) configured to generate a second reference signal based upon the first reference signal, the second reference signal having a second frequency that is a fractional multiple of the first frequency;
a high-band (HB) path including a HB injection locked frequency multiplier (ILFM), the HB ILFM configured to generate one or more HB local oscillator (LO) signals having a HB LO frequency that is based upon the first frequency associated with the first reference signal; and
a low-band (LB) frequency path including a LB ILFM, the LB ILFM configured to generate one or more LB local oscillator (LO) signals having a LB LO frequency that is based upon the second frequency associated with the second reference signal.

2. The LO signal generator of claim 1, wherein the HB ILFM is from among a plurality of HB ILFMs within the HB path, each one of the plurality of HB ILFMs being associated with a respective transceiver chain, and
wherein the LB ILFM is from among a plurality of LB ILFMs within the LB path, each one of the plurality of LB ILFMs being associated with a respective transceiver chain.

3. The LO signal generator of claim 1, wherein the HB ILFM is configured to generate a set of quadrature LO signals as the one or more HB LO signals, and
wherein the LB ILFM is configured to generate a set of quadrature LO signals as the one or more LB LO signals.

4. The LO signal generator of claim 1, wherein the HB ILFM is coupled to one or more mixers configured to perform direct downconversion of received signals to baseband using the one or more HB LO signals, and
wherein the LB ILFM is coupled to one or more mixers configured to perform direct downconversion of received signals to baseband using the one or more LB LO signals.

5. The LO signal generator of claim 4, wherein the received signals that are directly downconverted to baseband via the one or more mixers in the HB path and the received signals that are directly downconverted to baseband via the one or more mixers in the LB path are within a range of mm-wave frequencies.

6. The LO signal generator of claim 1, wherein the HB ILFM is configured to generate the one or more HB LO signals having the HB LO frequency that is an integer multiple of the first frequency associated with the first reference signal.

7. The LO signal generator of claim 1, further comprising:
a further DTC configured to generate, from the first reference signal, a fractionally-multiplied first reference signal having a frequency that is a fractional multiple of the first frequency,
wherein the HB ILFM is configured to generate the one or more HB LO signals having the HB LO frequency that is an integer multiple of the fractional multiple of the first frequency associated with the fractionally-multiplied first reference signal.

8. The LO signal generator of claim 1, further comprising:
frequency divider circuitry configured to perform frequency division on the first reference signal to generate a frequency-divided reference signal, and
wherein the DTC is further configured to perform a fractional multiplication of the frequency-divided reference signal to generate the second reference signal.

9. The LO signal generator of claim 1, wherein the DTC is configured to receive digital phase ramp data that is varied to adjust the fractional multiple of the first frequency to thereby adjust the second frequency associated with the second reference signal.

10. A wireless device, comprising:
a plurality of transceiver chains;
processing circuitry; and
a memory configured to store executable instructions that, when executed by the processing circuitry, causes each transceiver chain from the plurality of transceiver chains to:
generate a first reference signal having a first frequency;
generate, via a digital to time converter (DTC), a second reference signal based upon the first reference signal, the second reference signal having a second frequency that is a fractional multiple of the first frequency;
generate, via a high-band (HB) injection locked frequency multiplier (ILFM), one or more HB local oscillator (LO) signals having a HB LO frequency that is based upon the first frequency associated with the first reference signal; and
generate, via a low-band (LB) ILFM, one or more LB local oscillator (LO) signals having a LB LO frequency that is based upon the second frequency associated with the second reference signal.

11. The wireless device of claim 10, wherein the HB ILFM is configured to generate a set of quadrature LO signals as the one or more HB LO signals, and
wherein the LB ILFM is configured to generate a set of quadrature LO signals as the one or more LB LO signals.

12. The wireless device of claim 10, wherein the memory is further configured to store executable instructions that, when executed by the processing circuitry, causes each transceiver chain from the plurality of transceiver chains to:
generate, via another DTC from the first reference signal, a fractionally-multiplied first reference signal having a frequency that is a fractional multiple of the first frequency, and
generate, via the HB ILFM, the one or more HB LO signals having the HB LO frequency that is an integer multiple of the fractional multiple of the first frequency associated with the fractionally-multiplied first reference signal.

* * * * *